US012676180B2

(12) United States Patent
Park et al.

(10) Patent No.: US 12,676,180 B2
(45) Date of Patent: Jul. 7, 2026

(54) MEMORY CORE CIRCUIT HAVING CELL ON PERIPHERY (COP) STRUCTURE AND MEMORY DEVICE INCLUDING THE SAME

(71) Applicant: Samsung Electronics Co., Ltd., Suwon-si (KR)

(72) Inventors: Youngseok Park, Suwon-si (KR);
Hyunchul Yoon, Suwon-si (KR);
Jeongdon Ihm, Suwon-si (KR);
Yeongwoo Kang, Suwon-si (KR);
Yongjun Kim, Suwon-si (KR);
Keonwoo Park, Suwon-si (KR);
Chulkwon Park, Suwon-si (KR);
Changyoung Lee, Suwon-si (KR);
Sanghoon Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 18/743,925

(22) Filed: Jun. 14, 2024

(65) Prior Publication Data

US 2025/0218497 A1 Jul. 3, 2025

(30) Foreign Application Priority Data

Dec. 29, 2023 (KR) ........................ 10-2023-0196331

(51) Int. Cl.
*G11C 11/4097* (2006.01)
*G11C 11/408* (2006.01)
(Continued)

(52) U.S. Cl.
CPC ...... *G11C 11/4091* (2013.01); *G11C 11/4085* (2013.01); *G11C 11/4097* (2013.01);
(Continued)

(58) Field of Classification Search
CPC .................................................. G11C 11/4097
(Continued)

(56) References Cited

U.S. PATENT DOCUMENTS 7,359,273 B2    4/2008 Cho et al.
8,243,493 B2    8/2012 Toda
(Continued)

FOREIGN PATENT DOCUMENTS

KR         10-0666181 B1    1/2007
KR    10-2021-0007739 A    1/2021

*Primary Examiner* — Anthan Tran
(74) *Attorney, Agent, or Firm* — Fish & Richardson P.C.

(57)    ABSTRACT

A memory core circuit includes a memory cell array including sub cell arrays and a core control circuit including sub peripheral circuits respectively disposed under the sub cell arrays. Each sub cell array includes memory cells respectively connected to wordlines and bitlines. The wordlines extend in a row direction and are arranged in a column direction. The bitlines extend in the column direction and are arranged in the row direction. Each sub peripheral circuit is divided into first and second column edge regions and a central region. The central region is between the first column edge region and the second column edge region. A sense amplifier region including a plurality of bitline sense amplifiers are in at least one of the first column edge region and the second column edge region. A wordline driver region including a plurality of sub wordline drivers is disposed in the central region.

19 Claims, 43 Drawing Sheets

(51) Int. Cl.
*G11C 11/4091* (2006.01)
*H10B 12/00* (2023.01)

(52) U.S. Cl.
CPC ......... *H10B 12/315* (2023.02); *H10B 12/482* (2023.02); *H10B 12/488* (2023.02); *H10B 12/50* (2023.02)

(58) Field of Classification Search
USPC ........................................................ 365/149
See application file for complete search history.

(56) References Cited

U.S. PATENT DOCUMENTS

| | | | |
|---|---|---|---|
| 10,339,994 B2 | 7/2019 | Ito et al. | |
| 10,672,456 B2 | 6/2020 | Fishburn et al. | |
| 10,957,681 B1 | 3/2021 | Fujisawa et al. | |
| 11,031,405 B2 | 6/2021 | Fardad et al. | |
| 11,211,370 B2 | 12/2021 | Kim et al. | |
| 11,301,321 B2 | 4/2022 | Sharon et al. | |
| 11,355,177 B2 | 6/2022 | Kim et al. | |
| 11,706,923 B2 | 7/2023 | Lim | |
| 11,721,370 B2 * | 8/2023 | Onuki | G11C 14/0009 |
| | | | 365/207 |
| 2022/0246180 A1 * | 8/2022 | Lee | H10D 99/00 |
| 2022/0246619 A1 | 8/2022 | Kim | |
| 2022/0262425 A1 | 8/2022 | Kim et al. | |
| 2022/0285302 A1 | 9/2022 | Choi et al. | |
| 2023/0080259 A1 * | 3/2023 | Sanuki | H10B 41/40 |
| | | | 257/48 |
| 2023/0410887 A1 * | 12/2023 | Lee | G11C 11/4091 |
| 2024/0079047 A1 * | 3/2024 | Choi | H10B 12/50 |

* cited by examiner

MEMORY CORE CIRCUIT HAVING CELL ON PERIPHERY (COP) STRUCTURE AND MEMORY DEVICE INCLUDING THE SAME

CROSS-REFERENCE TO RELATED APPLICATION

This U.S. non-provisional application claims priority under 35 USC § 119 to Korean Patent Application No. 10-2023-0196331, filed on Dec. 29, 2023, in the Korean Intellectual Property Office (KIPO), the disclosure of which is incorporated by reference herein in its entirety.

BACKGROUND

Various example embodiments relate generally to semiconductor integrated circuits, and more particularly to a memory core circuit having cell on periphery (CoP) structure and/or a memory device including the memory core circuit.

As high-performance electronic products are desired to be miniaturized or reduced in size, and to multifunctional, a high degree of integration may be implemented to provide a high-capacity integrated circuit device. As the feature size of a memory device such as a DRAM (Dynamic Random Access Memory) device decreases, efficient arrangement of circuits for driving the memory device may be used.

A conventional DRAM device may have an open bitline structure, in which two bitlines forming a complementary pair exist on different cell blocks, and two bitlines are spread on both (two) sides of the bitline sense amplifier. According to the limitations of characteristic implementation of the cell transistor of the conventional DRAM device and the increase in implementation difficulty, research is currently being conducted to implement the cell transistor with a vertical channel transistor (VCT), so as to reduce the size of the DRAM device. Even if a vertical structure is employed to reduce the size of the memory device, the size reduction of the memory device may be limited due to circuits for driving the memory cell array.

SUMMARY

Some example embodiments may provide a memory core circuit and/or a memory device including the memory core circuit, capable of more efficiently disposing a core control circuit configured to drive a memory cell array.

According to some example embodiments, a memory core circuit includes a memory cell array including a plurality of sub cell arrays arranged in a matrix, the matrix including a plurality of array rows and a plurality of array columns, and a core control circuit including a plurality of sub peripheral circuits arranged in a matrix, the matrix including the plurality of array rows and the plurality of array columns. Each sub peripheral circuit is respectively under each sub cell array. Each sub cell array includes a plurality of memory cells respectively connected to a plurality of wordlines and a plurality of bitlines. The plurality of wordlines extend in a row direction and are arranged in a column direction. The plurality of bitlines extend in the column direction and are arranged in the row direction. Each sub peripheral circuit is divided into a first column edge region, a second column edge region and a central region, the first column edge region and the second column edge region corresponding to first and second end portions of each sub peripheral circuit in the column direction, and the central region is between the first column edge region and the second column edge region. A sense amplifier region including a plurality of bitline sense amplifiers that respectively are configured to sense voltages of the plurality of bitlines is in at least one of the first column edge region and the second column edge region. A wordline driver region including a plurality of sub wordline drivers that respectively are configured to drive the plurality of wordlines is disposed in the central region.

Alternatively or additionally according to some example embodiments, a memory core circuit includes a memory cell array including a plurality of sub cell arrays arranged in a matrix including a plurality of array rows and a plurality of array columns, and a core control circuit including a plurality of sub peripheral circuits arranged in a matrix including the plurality of array rows and the plurality of array columns, wherein each sub peripheral circuit is disposed under each sub cell array, each sub cell array includes a plurality of dynamic random access memory (DRAM) cells respectively connected to a plurality of wordlines and a plurality of bitlines, wherein the plurality of wordlines extend in a row direction and are arranged in a column direction, wherein the plurality of bitlines extend in the column direction and are arranged in the row direction. Each sub peripheral circuit is divided into a first column edge region, a second column edge region and a central region, the first column edge region and the second column edge region corresponding to first and second end portions of each sub peripheral circuit in the column direction, the central region is between the first column edge region and the second column edge region, and the central region is divided into a first sub central region and a second sub central region in the row direction. A sense amplifier region including a plurality of bitline sense amplifiers that respectively are configured to sense voltages of the plurality of bitlines is distributed and arranged in the first column edge region and the second column edge region. A wordline driver region including a plurality of sub wordline drivers that respectively are configured to drive the plurality of wordlines is arranged in one of the first sub central region and the second sub central region.

Alternatively or additionally, a memory device includes a memory core circuit, and device peripheral circuits configured to control the memory core circuit. The memory core circuit includes a memory cell array including a plurality of sub cell arrays arranged in a matrix, the matrix including a plurality of array rows and a plurality of array columns, and a core control circuit including a plurality of sub peripheral circuits arranged in the matrix including the plurality of array rows and the plurality of array columns, wherein each sub peripheral circuit is under each sub cell array. Each sub cell array includes a plurality of memory cells respectively connected to a plurality of wordlines and to a plurality of bitlines, wherein the plurality of wordlines extend in a row direction and are arranged in a column direction, wherein the plurality of bitlines extend in the column direction and are arranged in the row direction. Each sub peripheral circuit is divided into a first column edge region, a second column edge region and a central region, the first column edge region and the second column edge region corresponding to first and second end portions of each sub peripheral circuit in the column direction, and the central region is between the first column edge region and the second column edge region. A sense amplifier region including a plurality of bitline sense amplifiers that respectively are configured to sense voltages of the plurality of bitlines is arranged in at least one of the first column edge region and the second column edge region. A wordline driver region including a plurality of sub wordline drivers that respectively are configured to drive the plurality of wordlines is arranged in the central region.

The memory core circuit and the memory device according to some example embodiments may reduce the size of the memory core circuit through the CoP structure in which the core control circuit is arranged more efficiently, and/or may enhance the design margin of the memory core circuit by relieving the length limit of the bitline sense amplifiers. Alternatively or additionally, the operation characteristics and the performance of the memory core circuit and the memory device may be enhanced through the efficient arrangement of the bitline sense amplifier and the sub wordline drivers.

BRIEF DESCRIPTION OF THE DRAWINGS

Various example embodiments will be more clearly understood from the following detailed description taken in conjunction with the accompanying drawings.

FIG. 3 is a block diagram illustrating a memory device according to some example embodiments.

DETAILED DESCRIPTION OF VARIOUS EXAMPLE EMBODIMENTS

Figure 1:
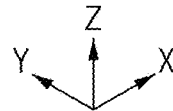
FIG. 1 is a perspective view of a memory core circuit according to some example embodiments.

Various example embodiments will be described more fully hereinafter with reference to the accompanying drawings, in which some example embodiments are shown. In the drawings, like numerals refer to like elements throughout. The repeated descriptions may be omitted.

Left-right or top-bottom symmetry structures may be understood as the same as structures described in this disclosure. Additionally, for convenience of description, "odd-numbered" components (e.g., bitlines or wordlines) and "even-numbered" components are referred, but structures in which the components are reversed may be understood as the same as the disclosed structures. Additionally, various example embodiments are not limited to the specific number of and/or shape or position of illustrated components. For example, the description will focus on a structure in which eight bitlines are included in one array column, but the number of eight bitlines in one array column may be determined in various ways.

Figure 2:
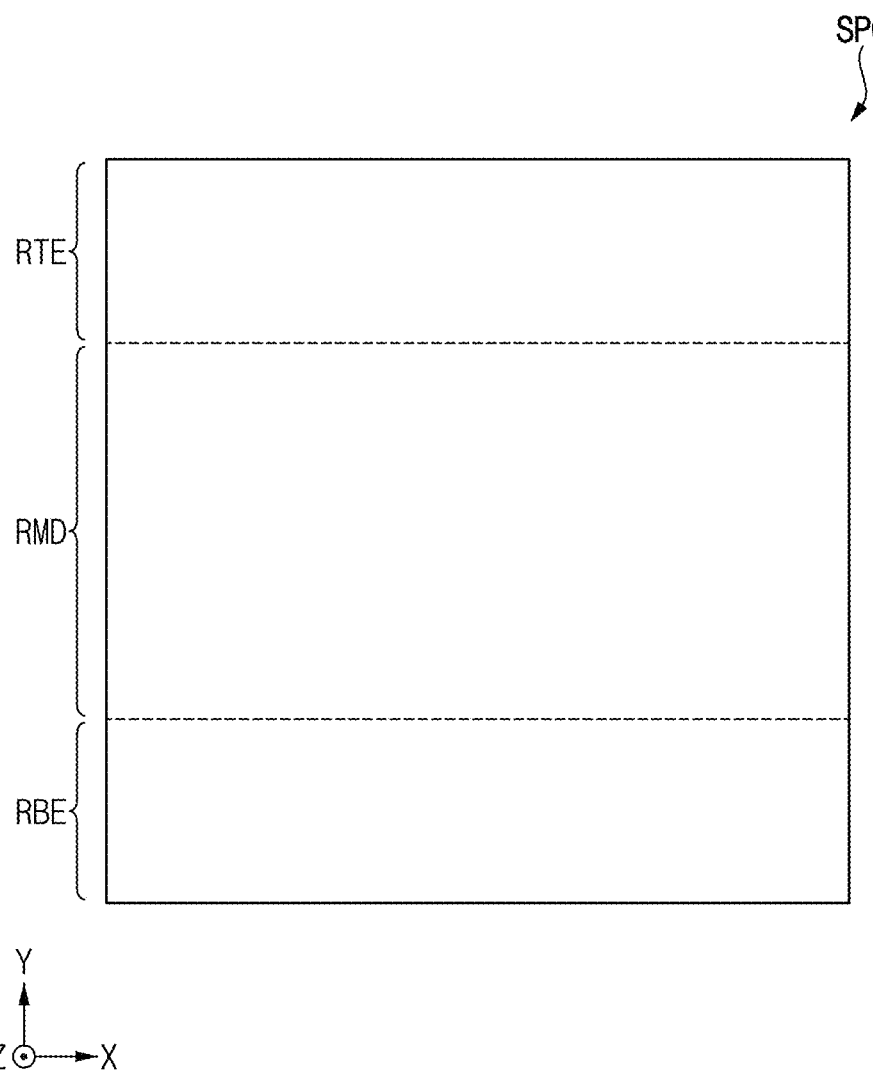
FIG. 2 is a diagram illustrating various example embodiments of a layout of a sub peripheral circuit included in a memory core circuit according to some example embodiments.

FIG. 1 is a perspective view of a memory core circuit according to some example embodiments, and FIG. 2 is a diagram illustrating various example embodiments of a layout of a sub peripheral circuit included in a memory core circuit according to some example embodiments.

Hereinafter, a vertical direction Z indicates a direction substantially perpendicular to an upper surface of a semiconductor substrate, and a row direction X and a column direction Y indicate two directions parallel to the upper surface of the semiconductor substrate. For example, the row direction X and the column direction Y may be substantially perpendicular to each other. The row direction X may be referred to as a first direction or a first horizontal direction, the column direction Y may be referred to as a second direction or a second horizontal direction, and the vertical direction Z may be referred to as a third direction; example embodiments are not limited thereto. The direction indicated by an arrow in figures and the opposite direction may be considered as the same direction.

Referring to FIG. 1, a memory core circuit MCC includes a memory cell array MCA and a core control circuit CCC. The memory core circuit MCC may have a cell on periphery (or cell over periphery) (CoP) structure such that the core control circuit CCC is disposed under the memory cell array MCA. In some cases the core control circuit CCC may be directly under the memory cell array MCA; example embodiments are not limited thereto.

The memory cell array MCA may include a plurality of sub cell arrays SCA that are arranged in a matrix of a plurality of array rows AR1~AR4 and a plurality of array columns AC1~AC8. The core control circuit CCC may include a plurality of sub peripheral circuits SPC that are arranged in a matrix of the plurality of array rows AR1~AR4 and the plurality of array columns AC1~AC8 such that each sub peripheral circuit SPC is disposed under (e.g., directly under) each sub cell array SCA.

Each sub cell array SCA may include a plurality of memory cells respectively connected to a plurality of wordlines and a plurality of bitlines. The plurality of wordlines extend in a row direction X and are arranged in a column direction Y, and the plurality of bitlines extend in the column direction Y and are arranged in the row direction X. Each memory cell may include a vertical channel transistor and a memory unit such as a cell capacitor disposed above the vertical channel transistor. In some cases, each memory cell may be a 1 (vertical) transistor-1 capacitor (1T1C) memory cell; however, example embodiments are not limited thereto. The CoP structure using the vertical channel transistors will be described below with reference to FIGS. 30, 31 and 32.

Each sub peripheral circuit SPC may include, as will be described below, a sense amplifier region including a plurality of bitline sense amplifiers configured to sense and voltages and amplify voltage differences from among the plurality of bitlines, a sub wordline driver region including a plurality of sub wordline drivers that drive a wordline to a voltage, e.g., greater than, a threshold voltage of a vertical transistor, and a rest circuit region including circuits other than the plurality of bitline sense amplifiers and the plurality of sub wordline drivers.

FIG. 1 illustrates the thirty two sub cell arrays SCA and the thirty two sub peripheral circuits SPC arranged in the four array rows AR1~AR4 and the eight array columns AC1~AC8 for convenience of illustration, and example embodiments are not limited to a specific number of the sub cell arrays SCA and/or a specific number of the sub peripheral circuits SPC.

FIG. 2 illustrates a layout of one sub peripheral circuit SPC, and the respective sub peripheral circuits SPC included in the memory core circuit MCC of FIG. 1 may have the same (or substantially the same or similar) layout as illustrated in FIG. 2.

Referring to FIG. 2, each sub peripheral circuit SPC may be divided into (partitioned into) a first column edge region RTE and a second column edge region RBE corresponding to two end portions on either side of the column direction Y of the sub peripheral circuit SPC, and a center region RMD between the first column edge region RTE and the second column edge region RBE.

As will be described later, a sense amplifier region including a plurality of bitline sense amplifiers may be disposed in at least one of the first column edge region RTE and the second column edge region RBE. A wordline driver region including a plurality of sub wordline drivers may be disposed in the center region RMD.

In some example embodiments, at least some of the sub peripheral circuits SPCs may not include at least one of the sense amplifier region and the wordline driver region.

The rest regions may include circuits other than the plurality of bitline sense amplifiers and the plurality of sub wordline drivers. For example, the rest region may include row decoder circuits controlling the plurality of sub wordline drivers to select at least one of the plurality of wordlines, power circuits to supply power to each sub peripheral circuit SPC, and control circuits to control the operation of each sub peripheral circuit SPC. According to some example embodiments, at least a portion of the device peripheral circuits, such as a column decoder that has been disposed outside of the memory core circuit MCC to control the memory core circuit MCC, may be disposed in the rest regions.

As shown in FIG. 2, the lengths in the row direction X of the first column edge region RTE, the second column edge region RBE, and the center region RMD of each sub peripheral circuit SPC may all be equal to the length in the row direction X of the sub peripheral circuit SPC. The sum of the lengths in the column direction Y of the first column edge region RTE, the second column edge region RBE, and the center region RMD corresponds to the length in the column direction Y of the sub peripheral circuit SPC. In some example embodiments, each length in the columnar direction Y of the first column edge region RTE and the second column edge region RBE may correspond to about ¼ of the length in the columnar direction Y of the sub peripheral circuit SPC, and the length in the columnar direction Y of the center region RMD may correspond to about ½ of the length in the columnar direction Y of the sub peripheral circuit SPC.

Figure 3:
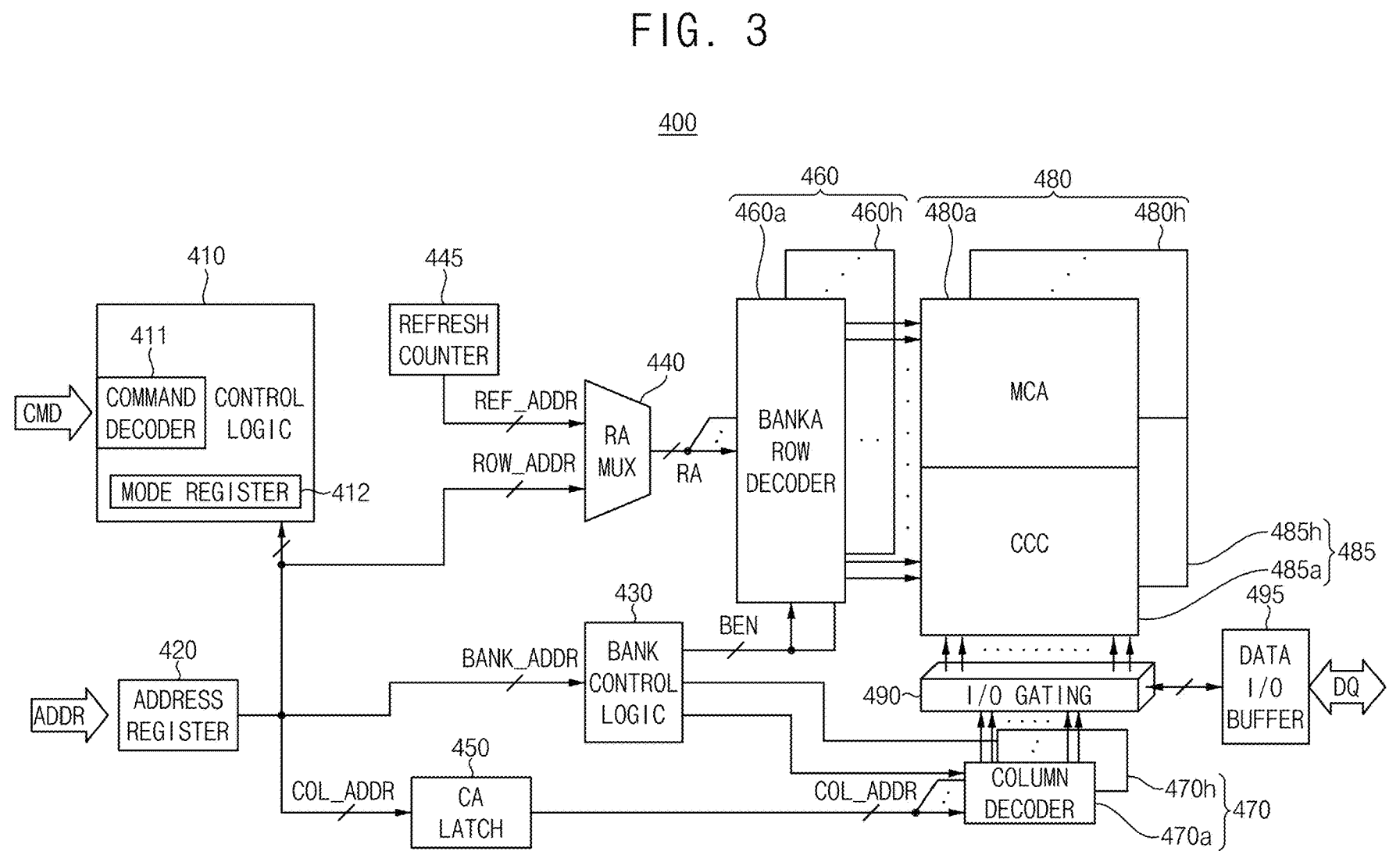

FIG. 3 is a block diagram illustrating a memory device according to some example embodiments.

Referring to FIG. 3, a memory device 400 may include a control logic 410, an address register 420, a bank control logic 430, a row address multiplexer 440, a column address latch 450, a row decoder 460, a column decoder 470, a memory cell array MCA 480, a core control circuit CCC 485, an input-output (I/O) gating circuit 490, a data input-output (I/O) buffer 495, and a refresh counter 445. The components other than the memory cell array 480 and the core control circuit 485 may be referred to as "device peripheral circuits".

The memory cell array 480 may include a plurality of bank arrays 480a~480h. The row decoder 460 may include a plurality of bank row decoders 460a~460h respectively coupled to the bank arrays 480a~480h. The column decoder 470 may include a plurality of bank column decoders 470a~470h respectively coupled to the bank arrays 480a~480h, and the core control circuit 485 may include a plurality of bank core control circuits 485a~485h respectively coupled to the bank arrays 480a~480h. The plurality of bank arrays 480a~480h and the plurality of bank core control circuits 485a~485h may be stacked in a vertical direction to form a CoP structure. In some example embodiments, there may be a redundancy circuit (not shown) and/or a redundancy array (not shown); example embodiments are not limited thereto.

The address register 420 may receive an address ADDR including a bank address BANK_ADDR, a row address ROW_ADDR and a column address COL_ADDR from a memory controller. The address register 420 may provide the received bank address BANK_ADDR to the bank control logic 430, and may provide the received row address ROW_ADDR to the row address multiplexer 440. In addition, the address register 420 may provide the received column address COL_ADDR to the column address latch 450.

The bank control logic 430 may generate bank control signals in response to the bank address BANK_ADDR. The bank control signals may include bank enable signals BEN to activate a selection memory bank corresponding to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some example embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input-output I/O gating circuit 490 to output data corresponding to the column address COL_ADDR.

The I/O gating circuit 490 may include a circuit for gating input/output data. The I/O gating circuit 490 may further include read data latches and write drivers. The read data latches are for storing data that is output from the bank arrays 480a~480h, and the write drivers are for writing data to the bank arrays 480a~480h.

Data to be read from one bank array of the bank arrays 480a~480h may be sensed by the sense amplifier unit 485 that is coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 to perform a write operation or a read operation. The control logic 410 may include a command decoder 411 and a mode register set 412. The command decoder decodes a command CMD received from the memory controller, and the mode register set 412 sets an operation mode of the memory device 400.

For example, the command decoder 411 may generate the control signals corresponding to the command CMD by decoding a write enable signal, a row address strobe signal, a column address strobe signal, a chip selection signal, etc.

Figure 4:
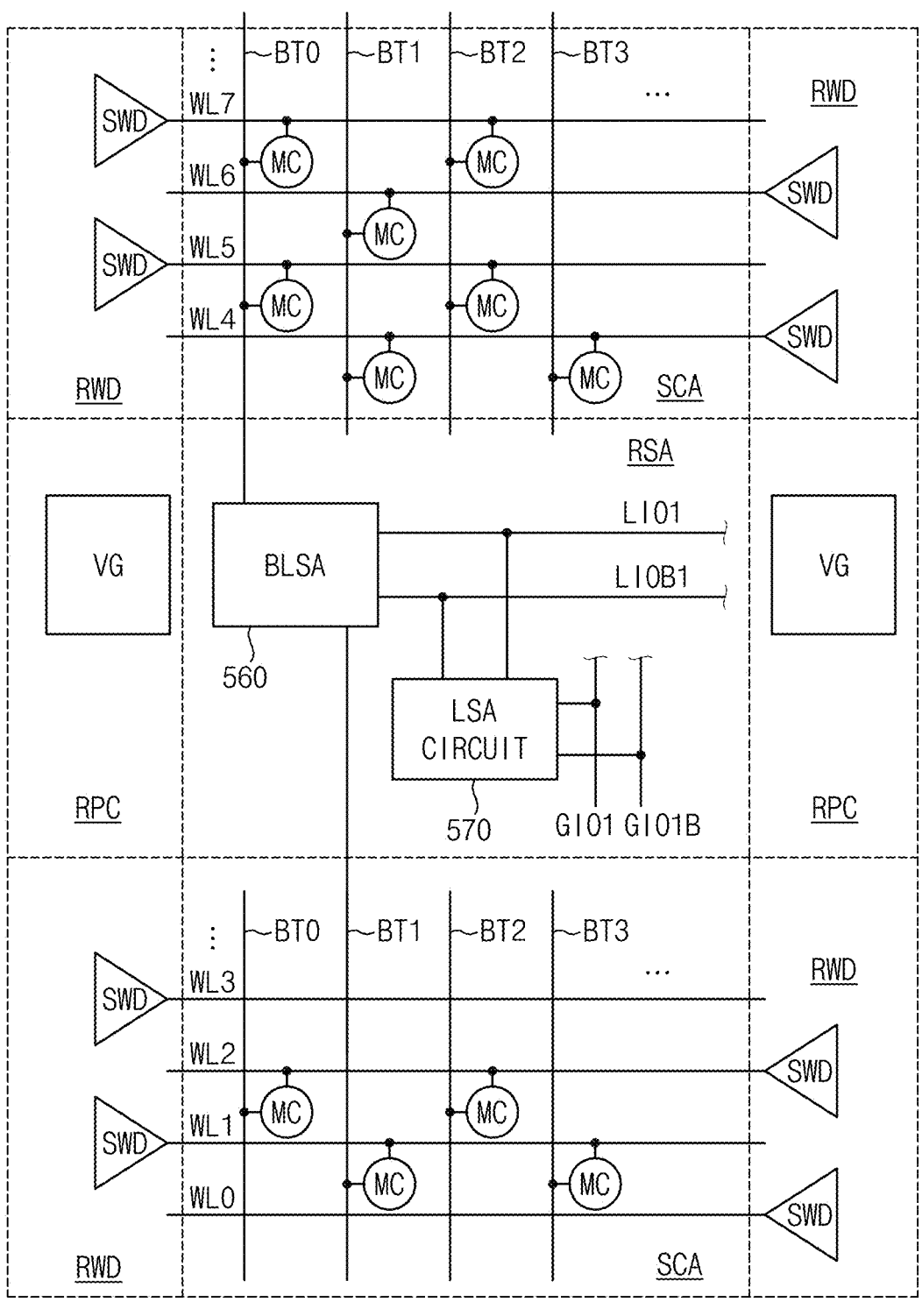
FIG. 4 is a diagram illustrating a schematic configuration of a memory core circuit according to some example embodiments.

FIG. 4 is a diagram illustrating a schematic configuration of a memory core circuit according to some example embodiments.

Referring to FIG. 4, the sub cell arrays SCA, the sense amplifier regions RSA, the wordline driver regions RWD and the power and control regions RPC may be disposed in the memory core circuit. The power and control regions RPC correspond to a portion of the above-described rest region, and FIG. 4 illustrates various example embodiments in which the local sense amplifier (LSA) circuits 570 are disposed in the sense amplifier regions RSA, but example embodiments are not limited thereto.

The sub cell arrays SCA may include a plurality of wordlines WL0~WL7 extending in the row direction, a plurality of bitlines BTL0~BTL3 extending in the column direction, and the memory cells MC disposed at the intersections of the wordlines WL0~WL3 and the bitlines BTL0~BTL3. There may or may not be dummy cells and/or dummy wordlines and/or dummy bit lines included in the sub c cell arrays SCA; additionally or alternatively there may or may not be redundancy cells and/or redundant wordlines and/or redundant bitlines The wordline driver regions RWD may include a plurality of sub wordline drivers SWD that may respectively drive the wordlines WL0~WL3.

The sense amplifier regions RSA may include bitline sense amplifiers BLSA, which are connected to the bitlines BTL0~BTL3 with the open bitline structure in, and a local sense amplifier (LSA) circuit 570. The bitline sense amplifier BLSA may sense and amplify a voltage difference between the bitlines BTL0~BTL3 to provide the amplified voltage difference to a local I/O line pair LIO1 and LIOB1.

Figure 18:
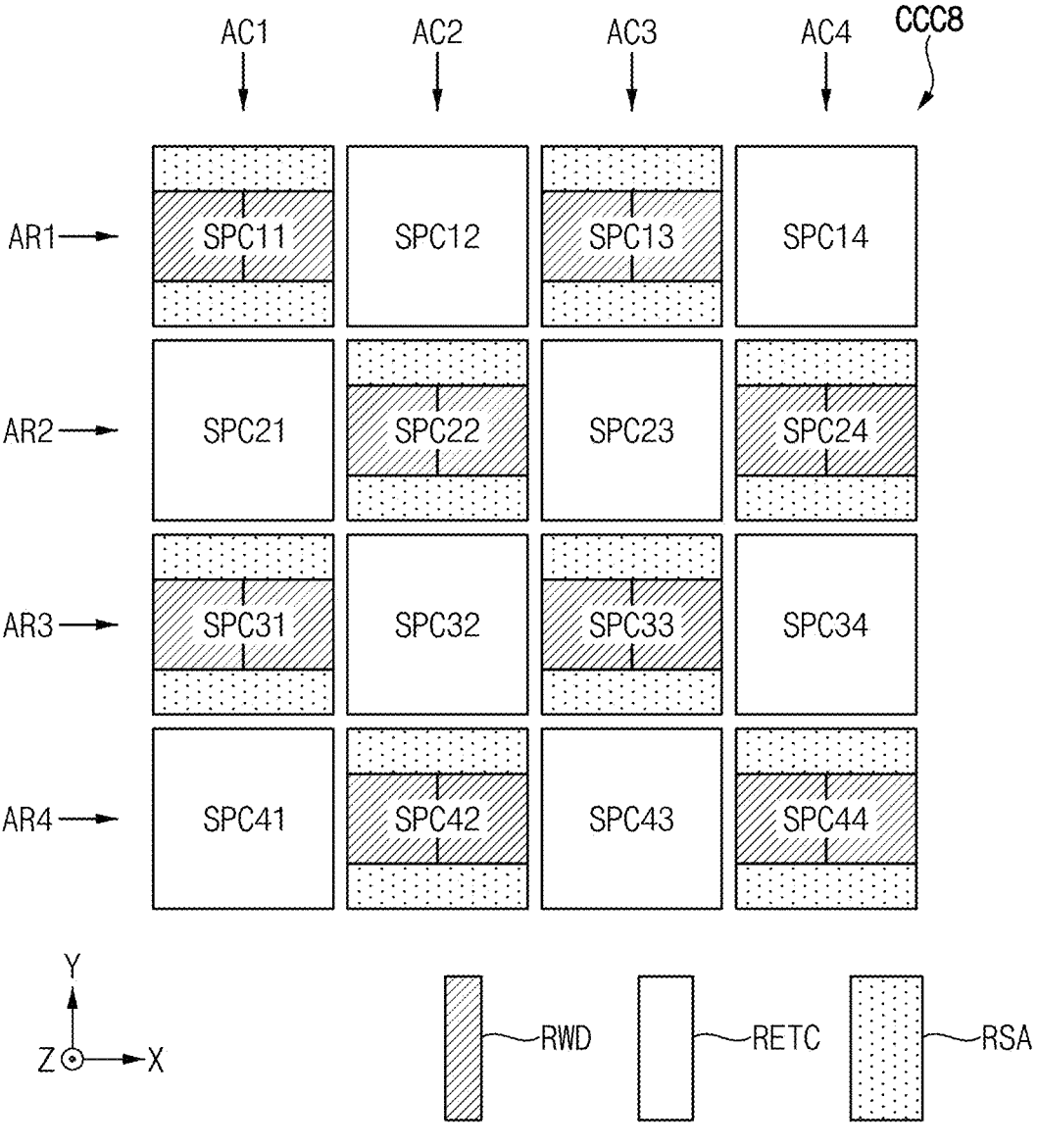

The power circuit to supply power to each sub peripheral circuit and the control circuit to control the operation of each sub peripheral circuit may be disposed in the power and control region RPC. FIG. 18 illustrates voltage drivers VG disposed in the power and control region RPC, but example embodiments are not limited thereto.

Figure 5:
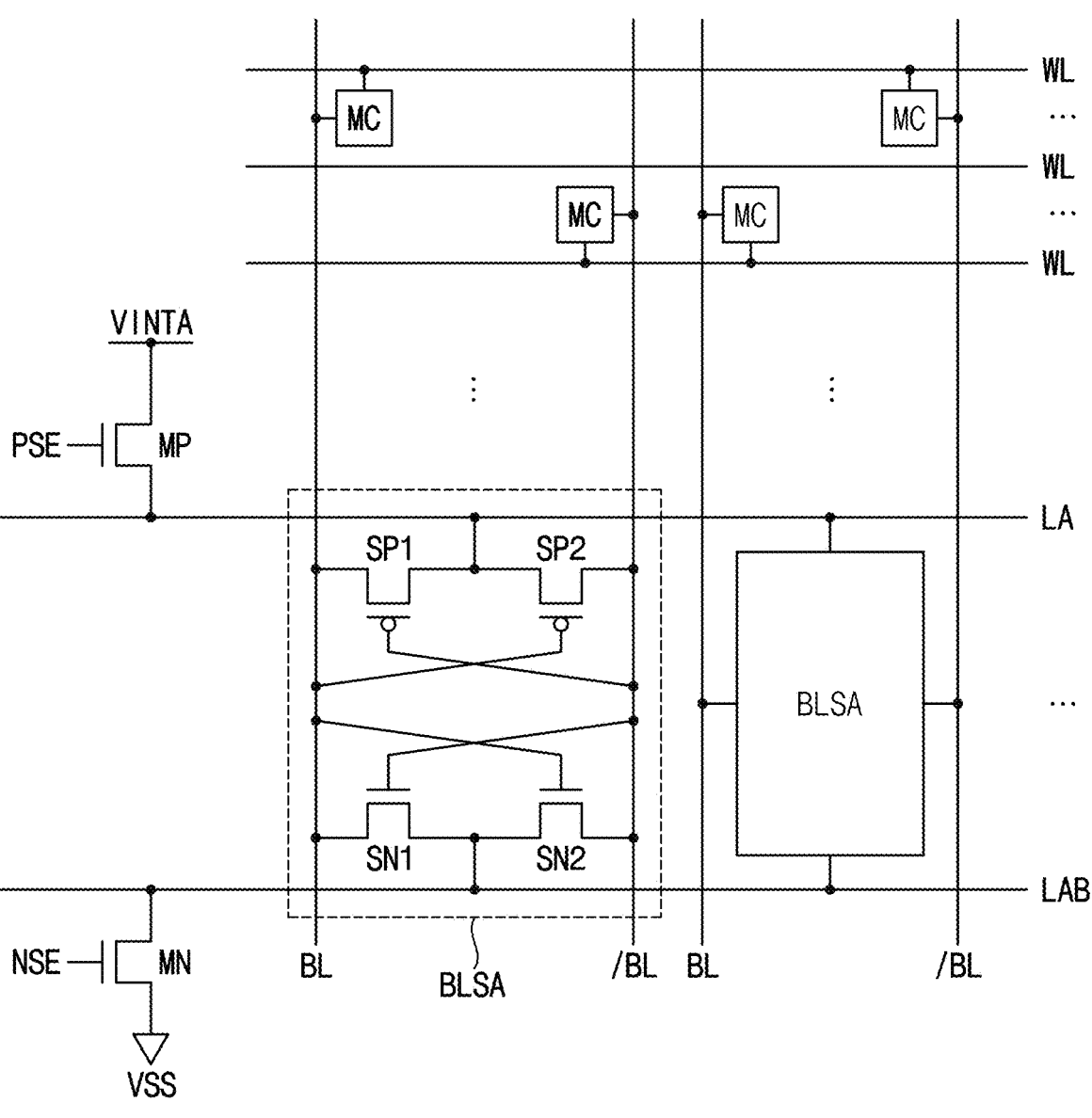
FIG. 5 is a diagram illustrating various example embodiments of a bitline sense amplifier included in the memory core circuit of FIG. 4.

FIG. 5 is a diagram illustrating various example embodiments of a bitline sense amplifier included in the memory core circuit of FIG. 4.

When a wordline WL selected by a row address is activated in the semiconductor memory device, e.g., is turned on to a voltage greater than a threshold voltage of respective transistors, data from a plurality of memory cells MC connected with the wordline WL is transferred to a pair of bitlines BL and/BL (or, bitline true and bitline complementary). Voltage switches MP and MN are turned on in response to a P sensing signal PSE and an N sensing signal NSE, respectively, to respectively supply an external amplifier voltage VINTA and a ground voltage VSSA to a sense amplifier power supply line LA and a sense amplifier ground line LAB, respectively. The bitline sense amplifiers BLSA are activated and operate in relation to a voltage difference between the pair of bitlines BL and/BL. For example, the bitline sense amplifiers BLSA may correspond to cross-coupled inverters. As typically implemented, a large number of the bitline sense amplifiers BLSA operate simultaneously. Thus, it may be difficult to amplify data from a large number of cells during a short period of time when the external amplifier voltage VINTA is applied as a conventional internal array power supply voltage having a relatively low level. For example, the bitline sensing speed of the semiconductor memory device decreases in relation to the quantity of data being processed, and the semiconductor memory device cannot operate at a sufficiently high speed. Accordingly, it is desirable to reduce loading of the paths or the wirings connecting the bitlines and the bitline sense amplifiers.

Figure 6:
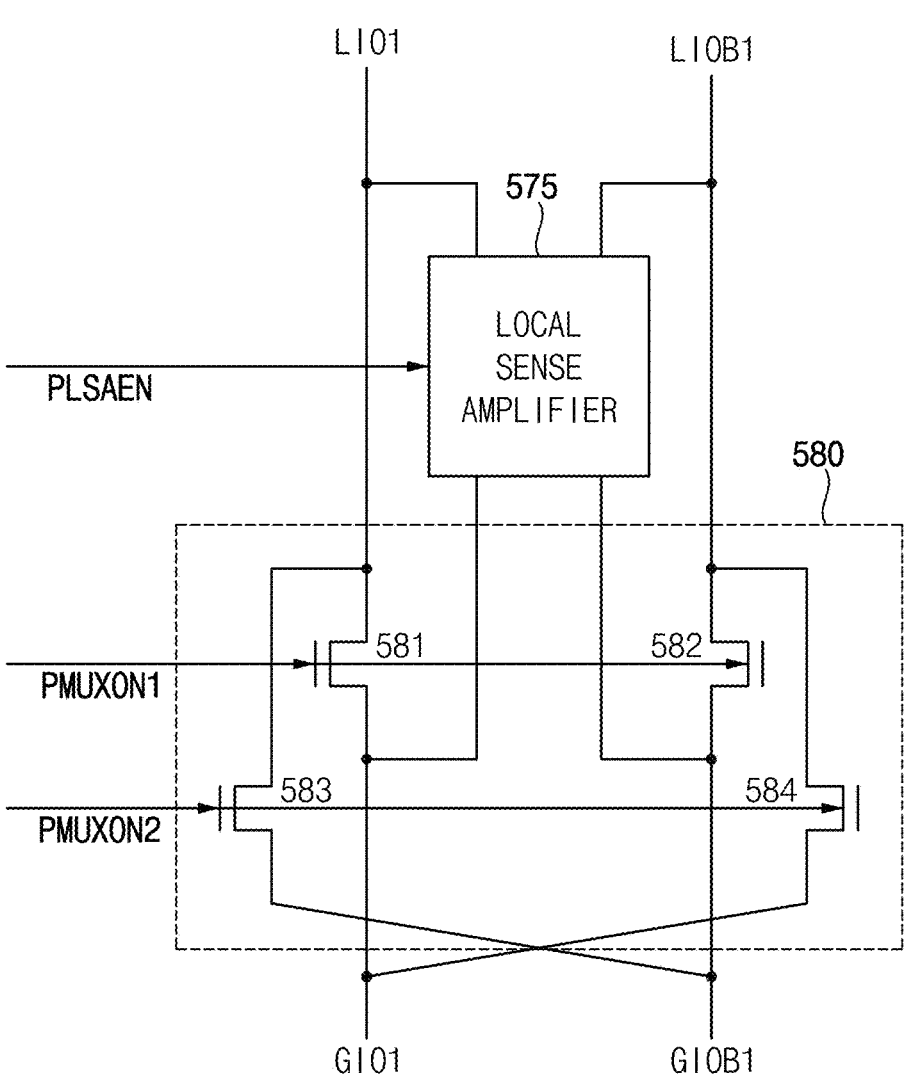
FIG. 6 is a diagram illustrating various example embodiments of a local sense amplifier included in the memory core circuit of FIG. 4.

FIG. 6 is a diagram illustrating various example embodiments of a local sense amplifier included in the memory core circuit of FIG. 4.

Referring to FIG. 6, a local sense amplifier circuit 570 may include a local sense amplifier 575 and a local I/O line controller 580.

The local sense amplifier 575 may amplify a voltage difference between the local I/O line pair LIO1 and LIOB1 in response to a local sense enable signal PLSAEN, and may provide the amplified voltage difference to a global I/O line pair GIO1 and GIOB1. The local I/O line controller 580 may include first through fourth NMOS transistors 581, 582, 583, and 584, and may provide electrical connections between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, the first connection control signal PMUXON1, and the second connection control signal PMUXON2 are a low level, the local sense amplifier 575 may be deactivated and the local I/O line controller 580 may cut off a connection between the local I/O line pair LIO1 and LIOB1 and the global I/O line pair GIO1 and GIOB1.

For example, when each of the first local sense enable signal PLSAEN, the first connection control signal PMUXON1, and the second connection control signal PMUXON2 are a high level, the local sense amplifier 575 may be activated and the local I/O line controller 580 may provide a connection between the local I/O line pair LIO1 and LIOB1 and the global I/O line pair GIO1 and GIOB1.

Figure 7:
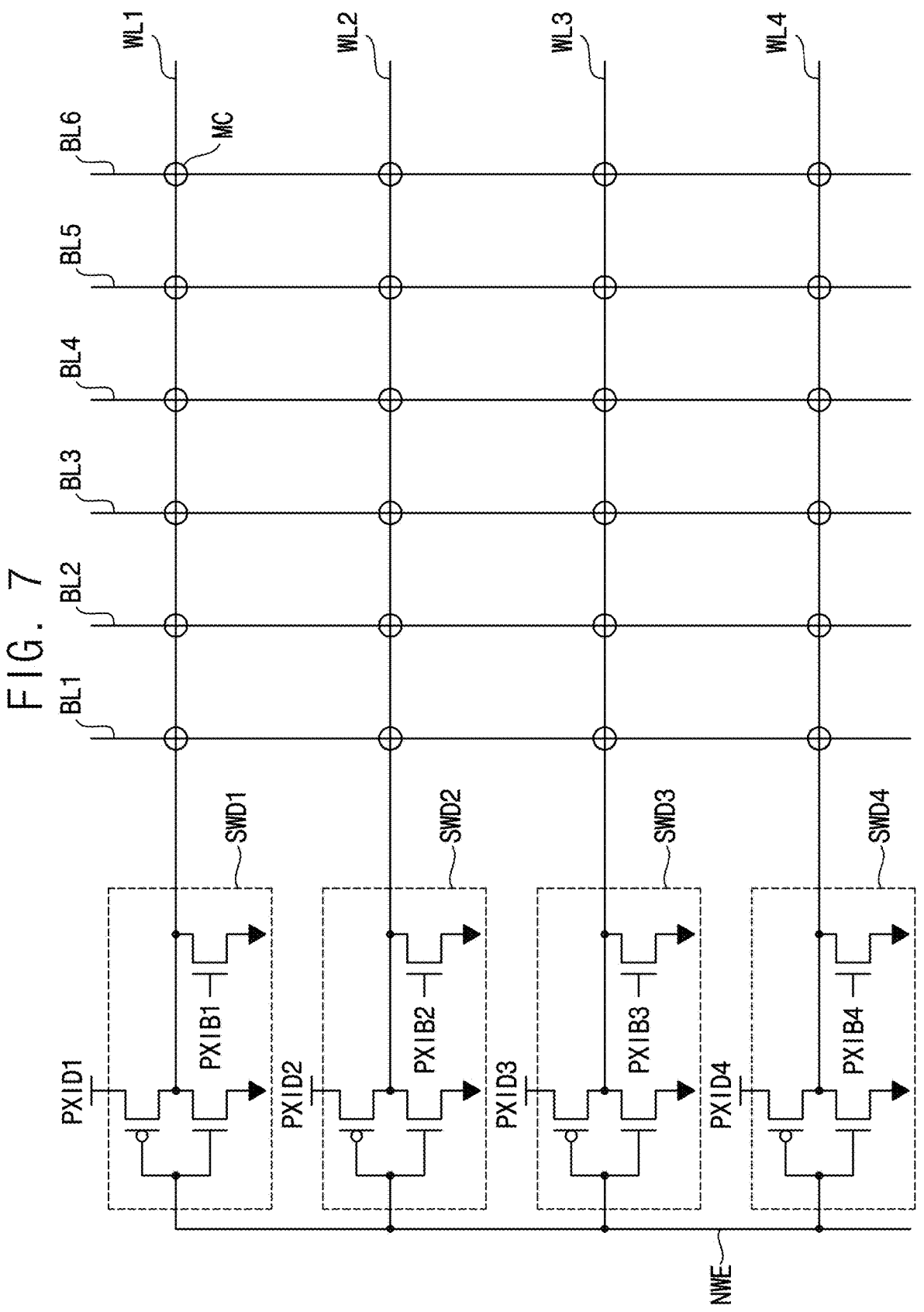
FIG. 7 is a diagram illustrating various example embodiments of a sub wordline driver included in the memory core circuit of FIG. 4.

FIG. 7 is a diagram illustrating various example embodiments of a sub wordline driver included in the memory core circuit of FIG. 4.

FIG. 7 illustrates an example that a plurality of wordlines WL1~WL4 are connected to one main wordline NWE through sub wordline drivers SWD1~SWD4. Signals PXID1~PXID4 and PXIB1~PXIB4 are generated by address decoding. The signals PXID1~PXID4 may be generated by the row decoding circuit included in the above-described decoder region RRD. The row decoding circuit generates the signals PXID1~PXID4 by decoding at least a portion of the row address.

Figure 8A:
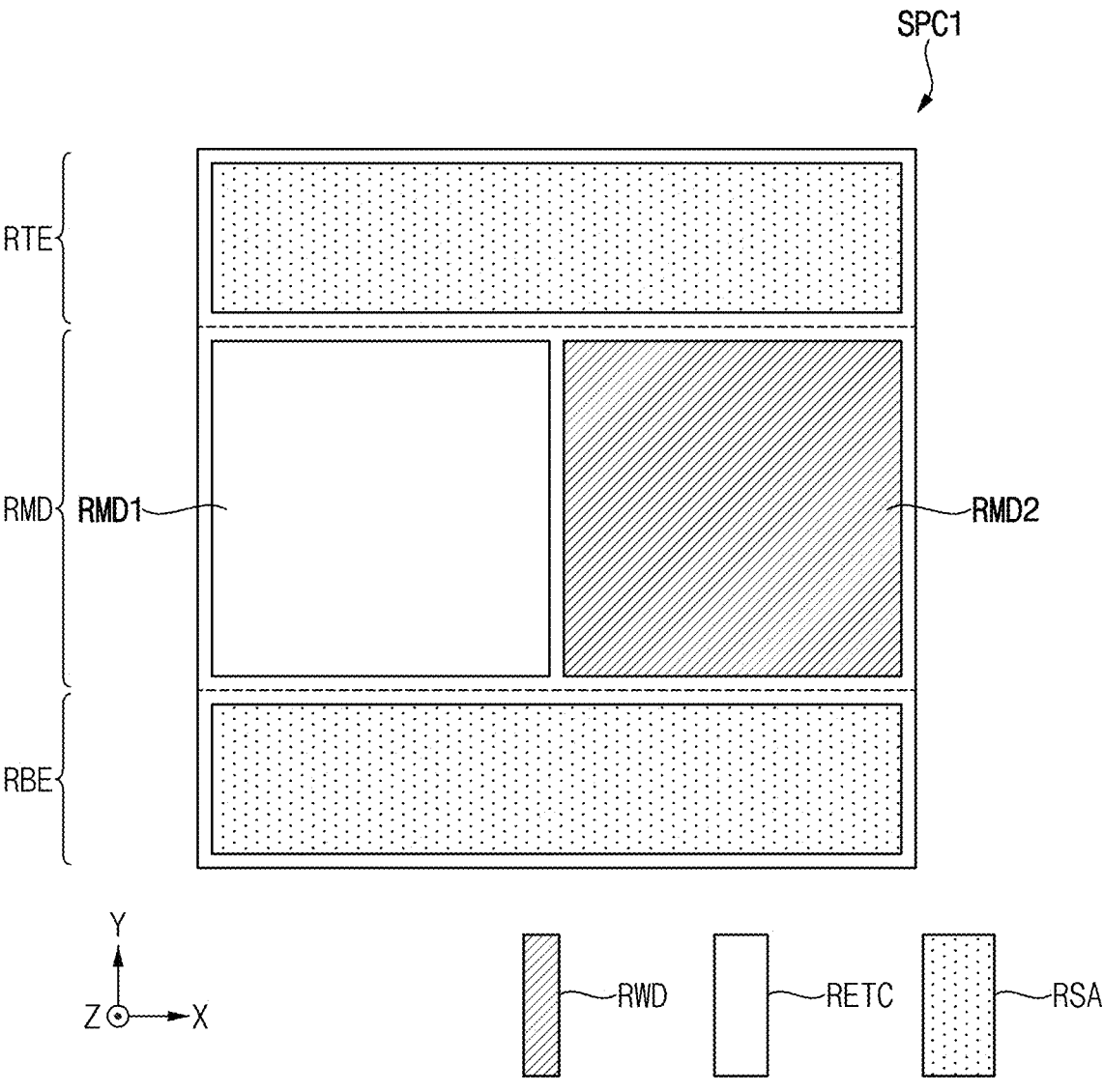
FIGS. 8A, 8B and 9 are diagrams illustrating example embodiments of a layout of a sub peripheral circuit included in a memory core circuit according to some example embodiments.
Figure 8B:
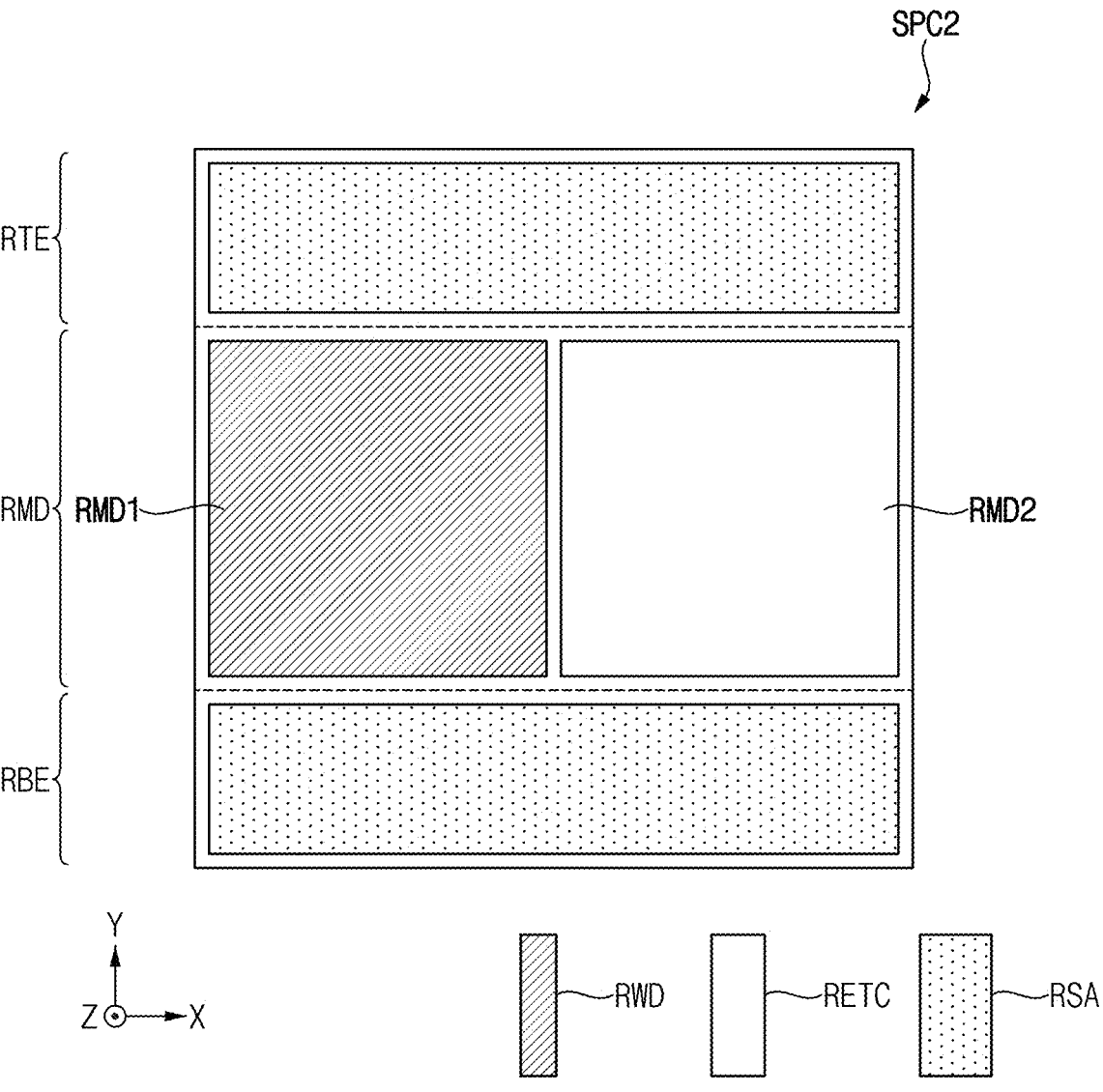
Figure 9:
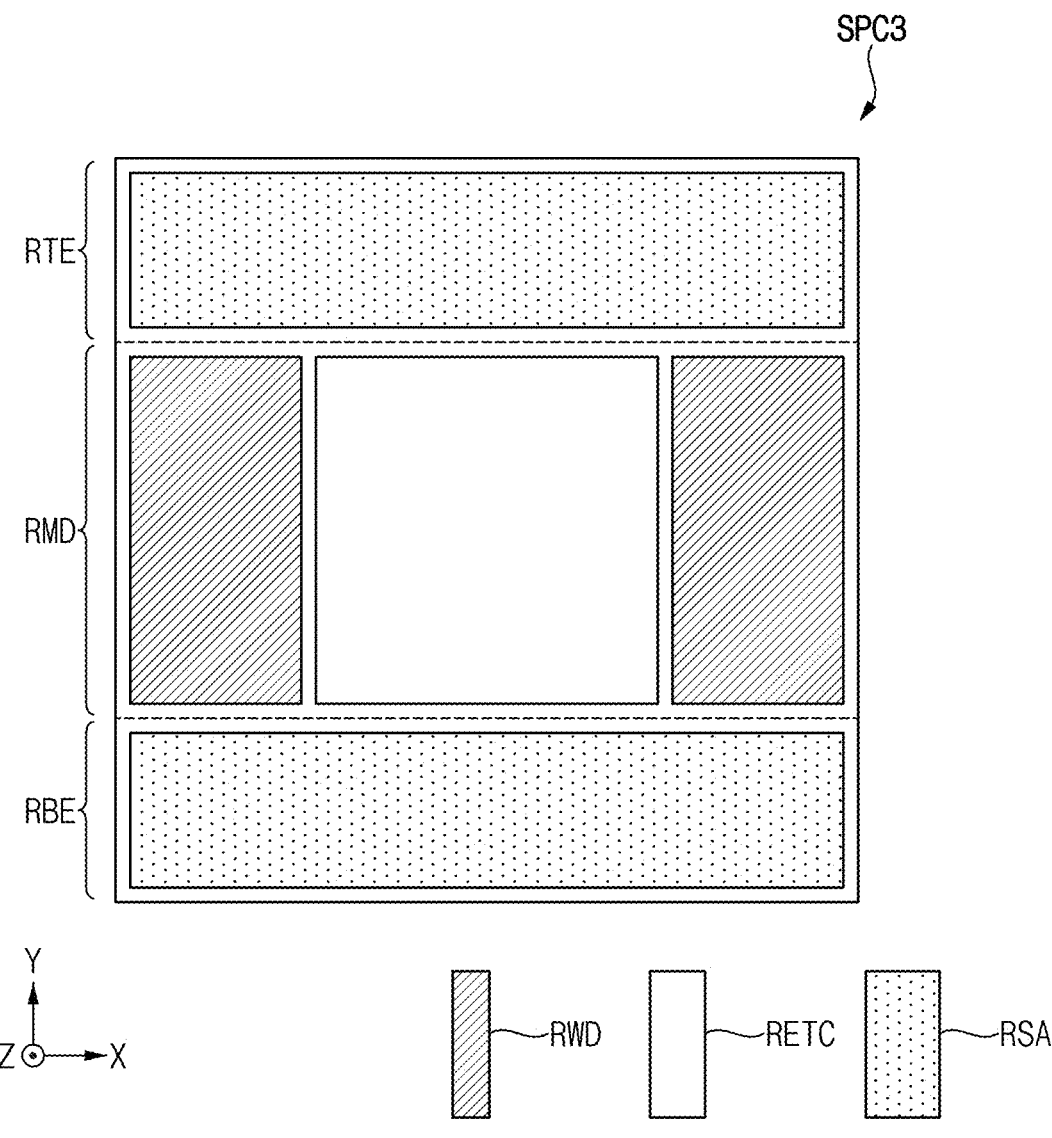

FIGS. 8A, 8B and 9 are diagrams illustrating example embodiments of a layout of a sub peripheral circuit included in a memory core circuit according to some example embodiments.

Referring to FIGS. 8A, 8B and 9, each of the sub peripheral circuits SPC1, SCP2 and SCP3 may include a sense amplifier region RSA disposed in a first column edge region RTE and a second column edge region RBE, respectively. The length in the row direction X of the sense amplifier region RSA may be the same as the length in the row direction X of the sub peripheral circuits SPC1, SPC2 and SCP3. This arrangement may improve the overall performance of the memory core circuit by optimizing or improving upon the connections of the bitlines to the bitline sense amplifiers, which are or may be more performance-sensitive than the connections between the wordlines and the sub wordline drivers.

In some example embodiments, as shown in FIGS. 8A and 8B, one of the first sub central region RMD1 and the second sub central region RMD2 of the central region RMD divided in the row direction X may correspond to a wordline driver region RWD, and another of the first sub central region RMD1 and the second sub central region RMD2 may correspond to a rest region RETC including the remaining circuits other than the plurality of bitline sense amplifiers and the plurality of sub wordline drivers. In some example embodiments, the length in the row direction X of the first sub center region RMD1 and the second sub center region RMD2 may each be ½ the length in the row direction X of the sub peripheral circuit SPC. Hereinafter, for convenience of description, it is assumed that the region to the left of the center region RMD is the first sub center region RMD1 and the region to the right of the center region RMD is the second sub center region RMD2 in the drawings.

In some example embodiments, as shown in FIG. 9, the two end portions in the row direction X of the central region RMD may correspond to a wordline driver region RWD in which the sub wordline drivers are distributed and disposed, and the region between the two end portions in the row direction X in which the wordline driver region RWD is distributed and disposed may correspond to the rest region RETC.

Figure 10A:
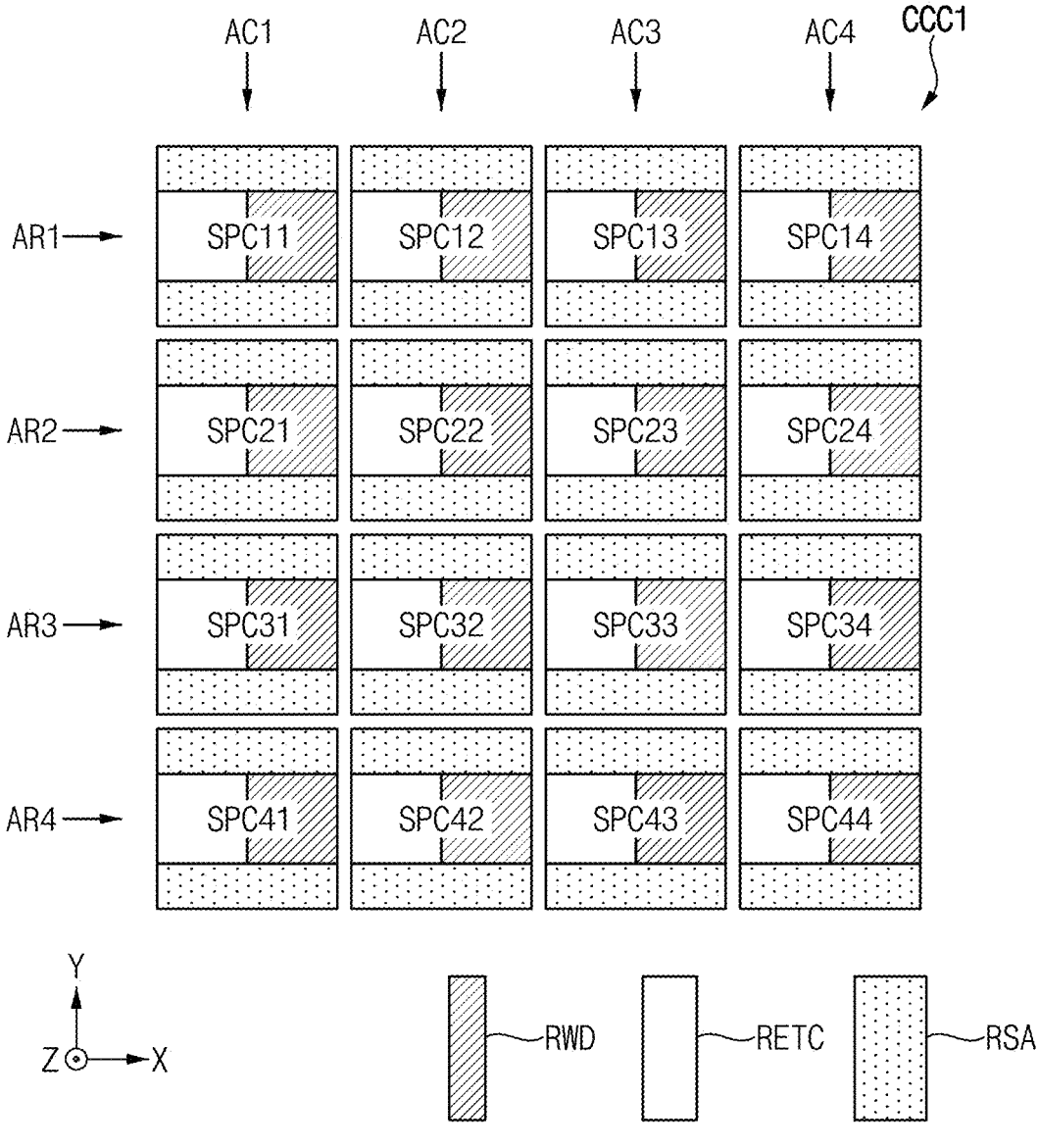
FIGS. 10A, 10B, 10C and 11 are diagrams illustrating example embodiments of a layout of a core control circuit included in a memory core circuit according to some example embodiments.
Figure 10B:
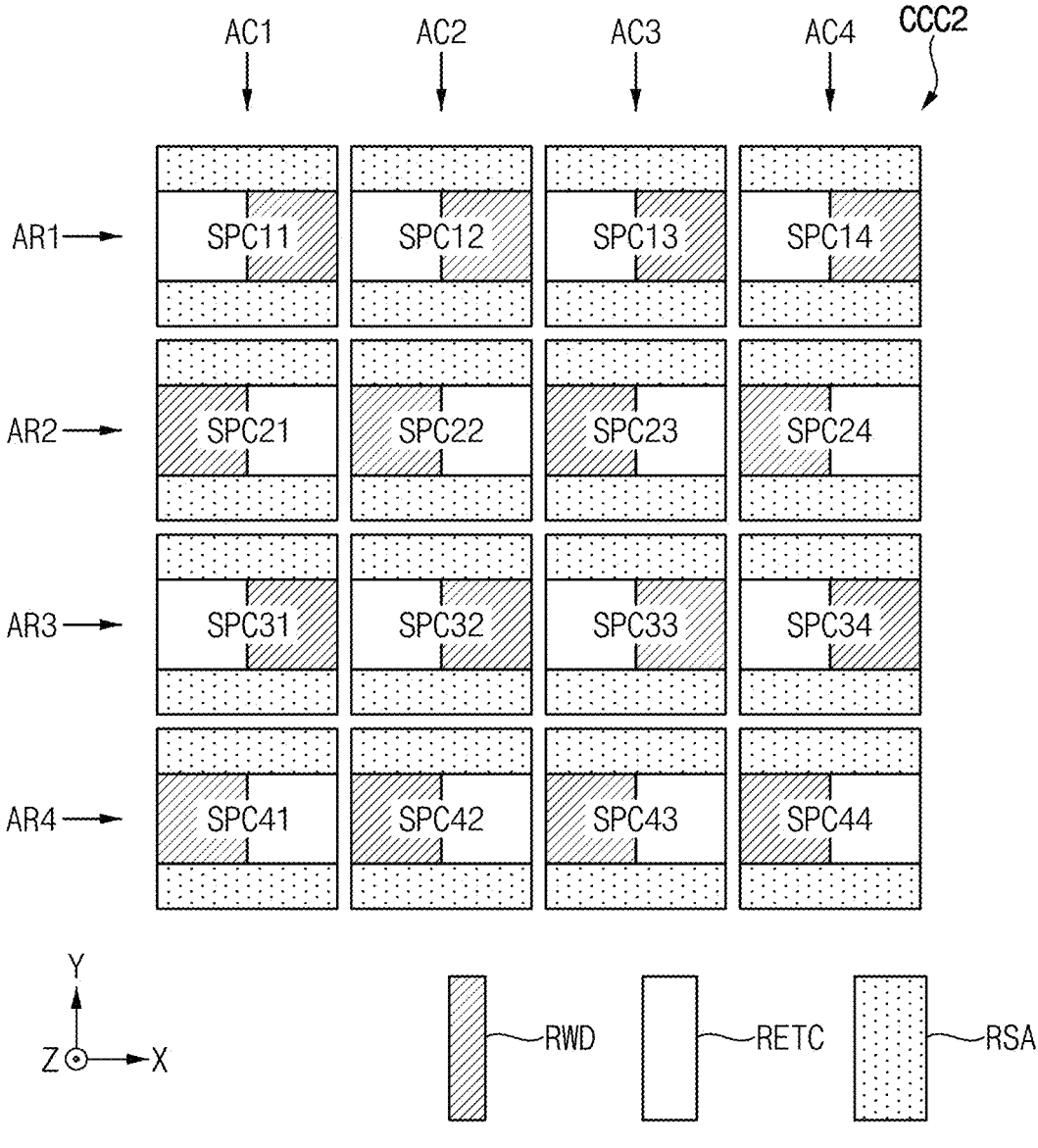
Figure 10C:
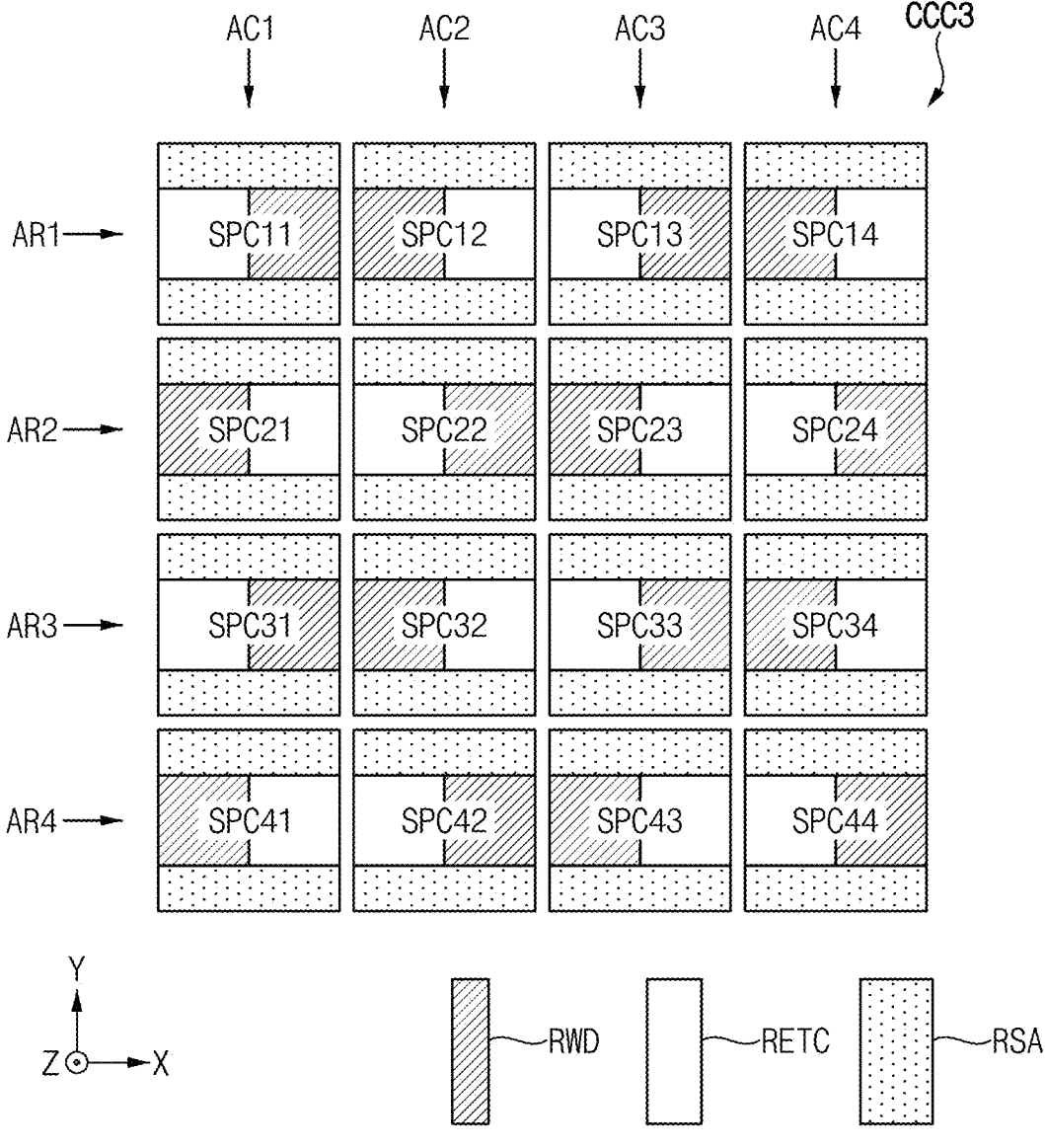

FIGS. 10A, 10B, 10C and 11 are diagrams illustrating example embodiments of a layout of a core control circuit included in a memory core circuit according to some example embodiments. FIGS. 10A, 10B and 10C illustrate layouts utilizing the sub peripheral circuits SPC1, SPC2 and SPC3 of FIGS. 8A, 8B, and 9.

Referring to FIGS. 10A, 10B and 10C, the core control circuits CCC1, CCC2, CCC3 and CCC4 may include a plurality of sub peripheral circuits SPC11 through SPC48 arranged in a matrix of a plurality of array rows AR1 through AR4 and a plurality of array columns AC1 through AC8.

In some example embodiments, the core control circuit CCC1 may correspond to the sub peripheral circuit SPC1 of FIG. 8A, as shown in FIG. 10A, wherein all of the sub peripheral circuits SPC11 through SPC44 may correspond to the sub peripheral circuit SPC1 of FIG. 8A.

In some example embodiments, as shown in FIG. 10B, in the core control circuit CCC2. the sub peripheral circuit SPC1 of FIG. 8A and the sub peripheral circuit SPC2 of FIG. 8B may be alternately disposed in the column direction Y.

As such, the core control circuit CCC1 of FIG. 10A and the core control circuit CCC2 of FIG. 10B may have a shift structure (or windmill structure) such that, with respect to a first sub peripheral circuit and a second sub peripheral circuit that are adjacent to each other in the row direction X, the rest circuit region RETC of the first sub peripheral circuit is neighboring or adjacent in the row direction X to the wordline driver region RWD of the second sub peripheral circuit For example, for two sub peripheral circuits SPC13 and SPC14 adjacent to each other in the first array row AR1, the wordline driver region RWD of the sub peripheral circuit SPC13 and the rest region RETC of the sub peripheral circuit SPC14 may be adjacent to each other in the row direction X. Similarly, for the two sub peripheral circuits SPC23 and SPC24 that are adjacent to each other in the second array row AR2, the rest region RETC of sub peripheral circuit SPC23 and the wordline driver region RWD of sub peripheral circuit SPC24 may be adjacent to each other in the row direction X.

In some example embodiments, as shown in FIG. 10C, in the core control circuit CCC3, the sub peripheral circuit SPC1 of FIG. 8A and the sub peripheral circuit SPC2 of FIG. 8B may be alternately disposed in the row direction X and the column direction Y, respectively.

As such, the core control circuit CCC3 of FIG. 10C may have a mirror structure such that, with respect to a first sub peripheral circuit and a second sub peripheral circuit adjacent in the row direction X, two wordline driver regions RWD included in the first sub peripheral circuit and the second sub peripheral circuit, respectively, are neighboring or adjacent to each other in the row direction X, or two rest regions RETC included in the first sub peripheral circuit and the second sub peripheral circuit, respectively, are adjacent to each other in the row direction X.

For example, for the two sub peripheral circuits SPC13 and SPC14 that are adjacent to each other in the first array row AR1, the wordline driver region RWD of the sub peripheral circuit SPC13 and the wordline driver region RWD of the sub peripheral circuit SPC14 may be adjacent to each other in the row direction X. Similarly, for two sub peripheral circuits SPC23 and SPC24 that are adjacent to each other in the second array row AR2, the rest region RETC of sub peripheral circuit SPC23 and the rest region RETC of sub peripheral circuit SPC24 may be adjacent to each other in the row direction X.

Figure 11:
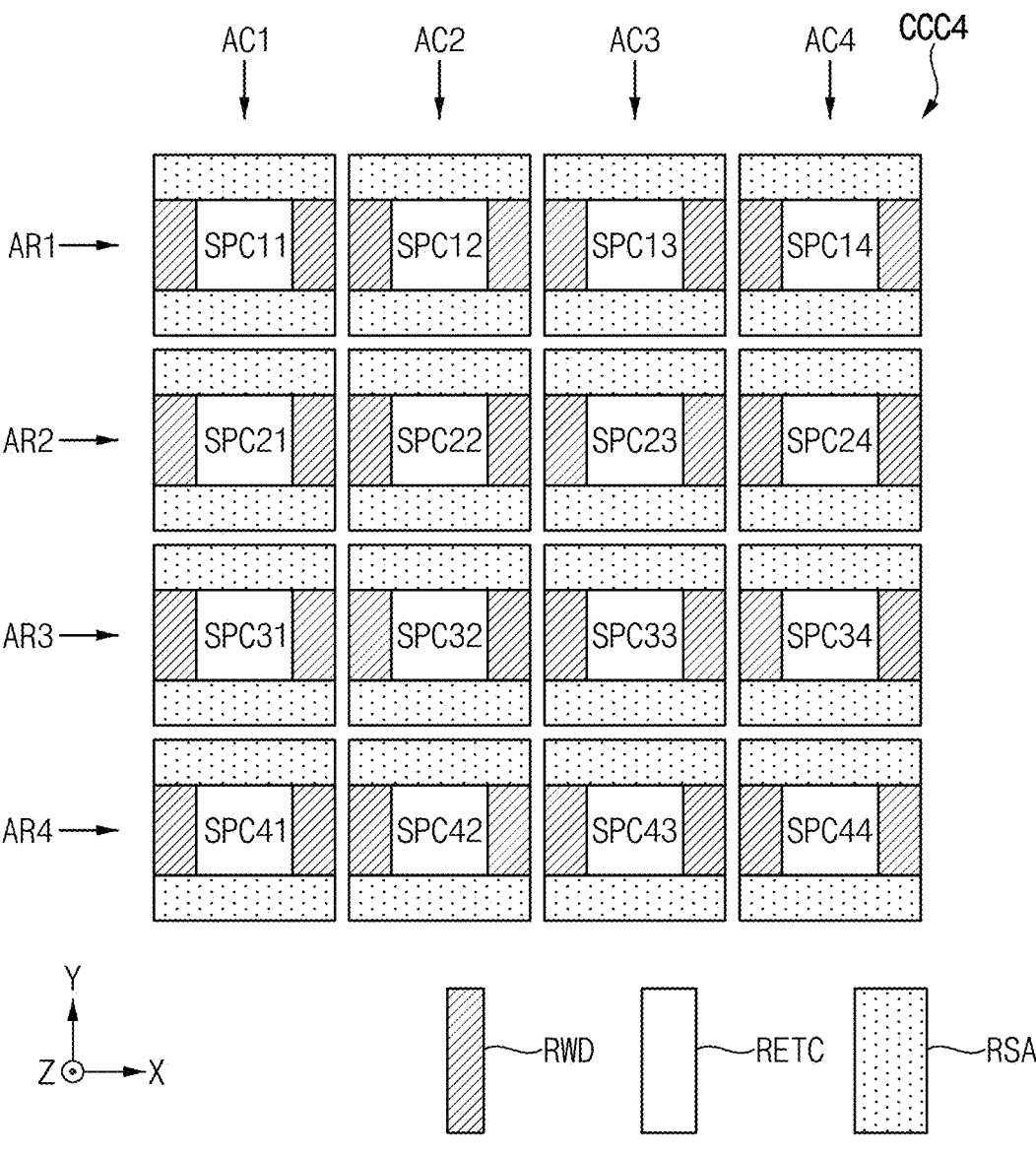

In some example embodiments, as shown in FIG. 11, all sub peripheral circuits SPC11 through SPC44 of the core control circuit CCC4 may correspond to the sub peripheral circuit SPC3 of FIG. 9.

FIGS. 12, 13, 14A, 14B and 15 are diagrams illustrating example embodiments of a layout of a sub peripheral circuit included in a memory core circuit according to some example embodiments.

FIGS. 12, 13, 14A, 14B, and 15 illustrate sub peripheral circuits SPC4, SPC5, SPC6, SPC7 and SPC that may be implemented with varying amounts of area of the rest region RETC.

Figure 12:
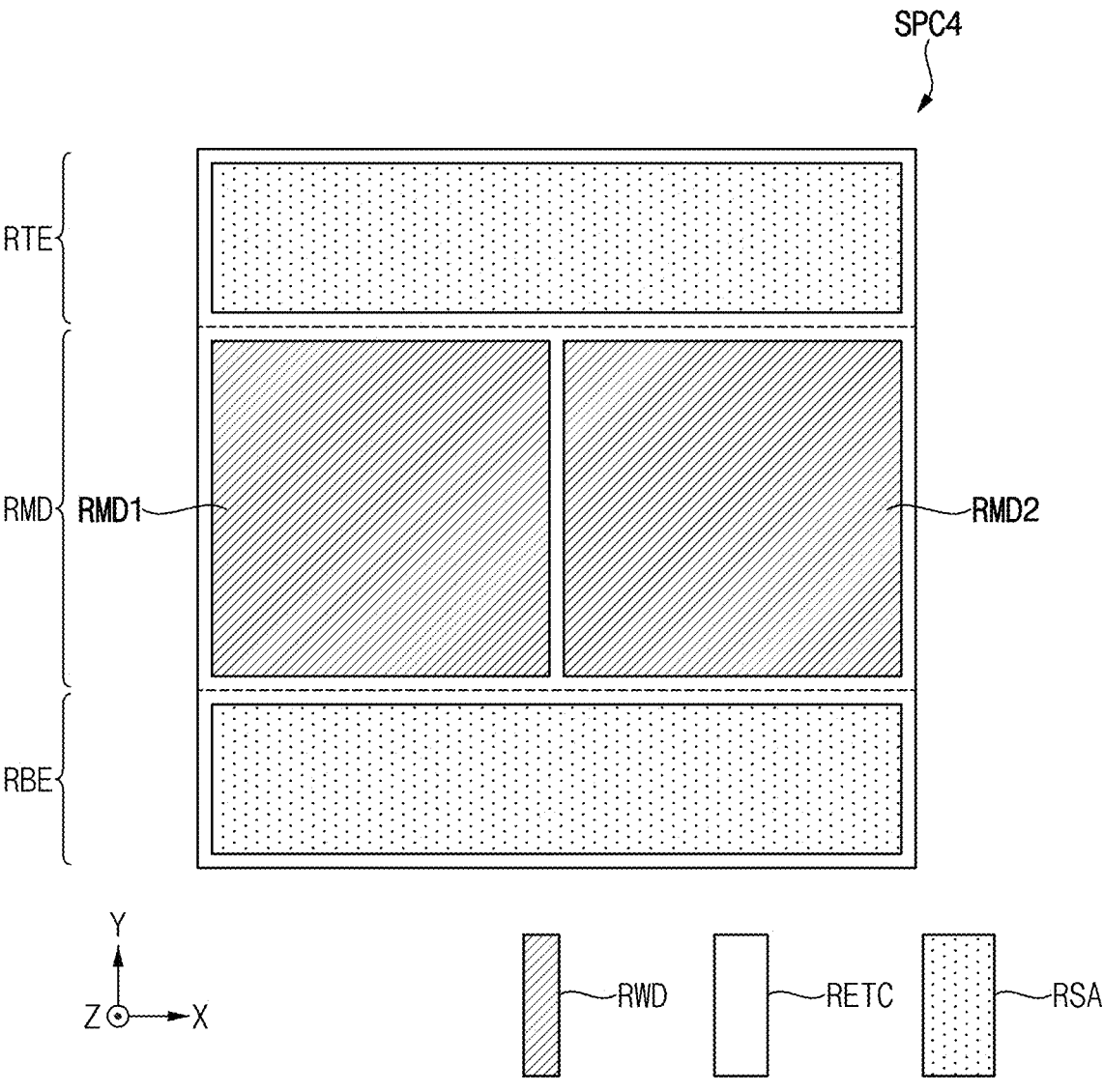
FIGS. 12, 13, 14A, 14B and 15 are diagrams illustrating example embodiments of a layout of a sub peripheral circuit included in a memory core circuit according to some example embodiments.

Referring to FIG. 12, the sub peripheral circuit SPC4 may include two sense amplifier regions RSA disposed in the first column edge region RTE and the second column edge region RBE, respectively, and two wordline driver regions RWD disposed in the first sub center region RMD1 and the second sub center region RMD2 of the center region RMD, respectively.

Figure 13:
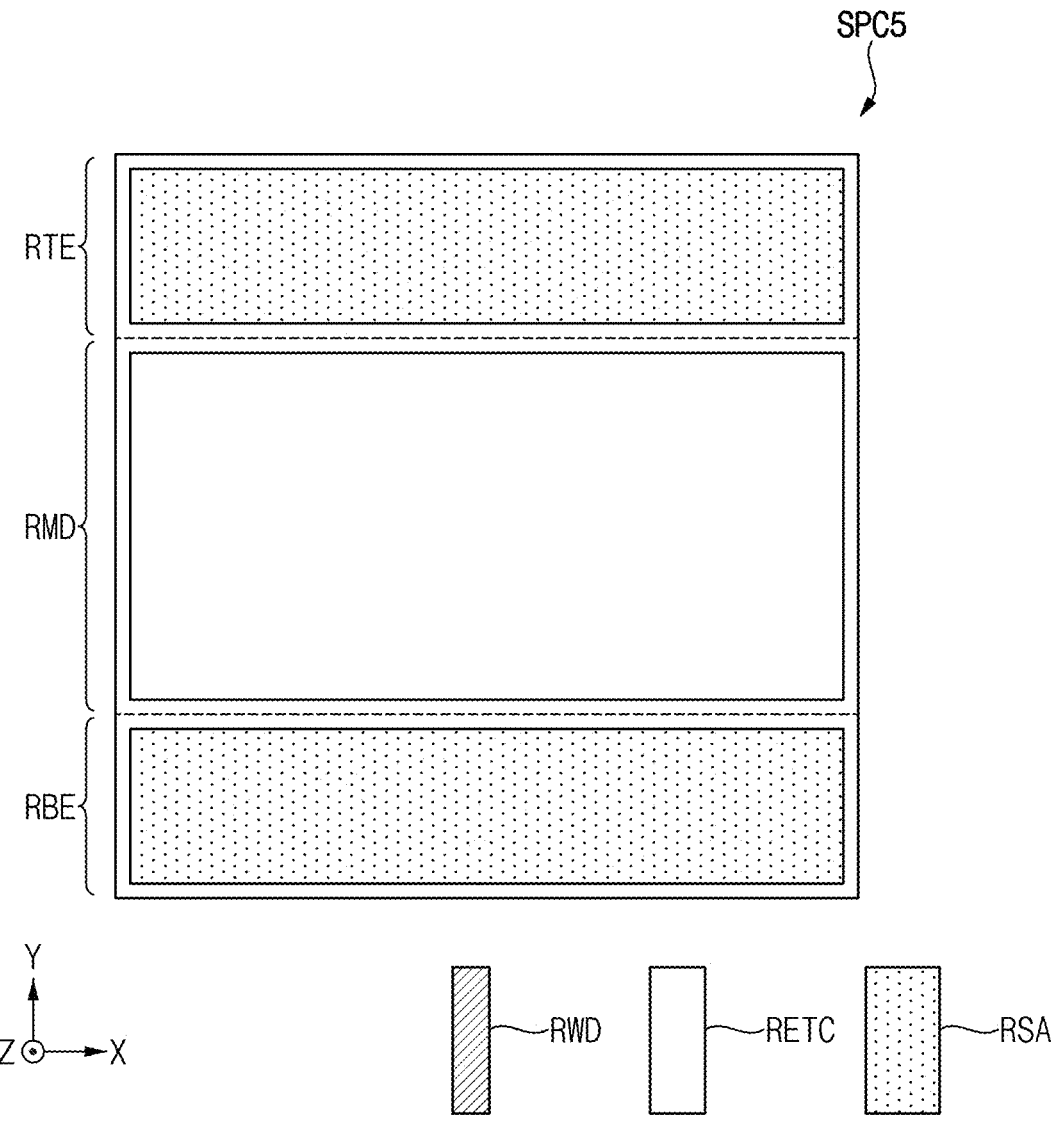

Referring to FIG. 13, the sub peripheral circuit SPC5 may include two sense amplifier regions RSA disposed in the first column edge region RTE and the second column edge region RBE, respectively, and may not include wordline driver region RWD.

Figure 14A:
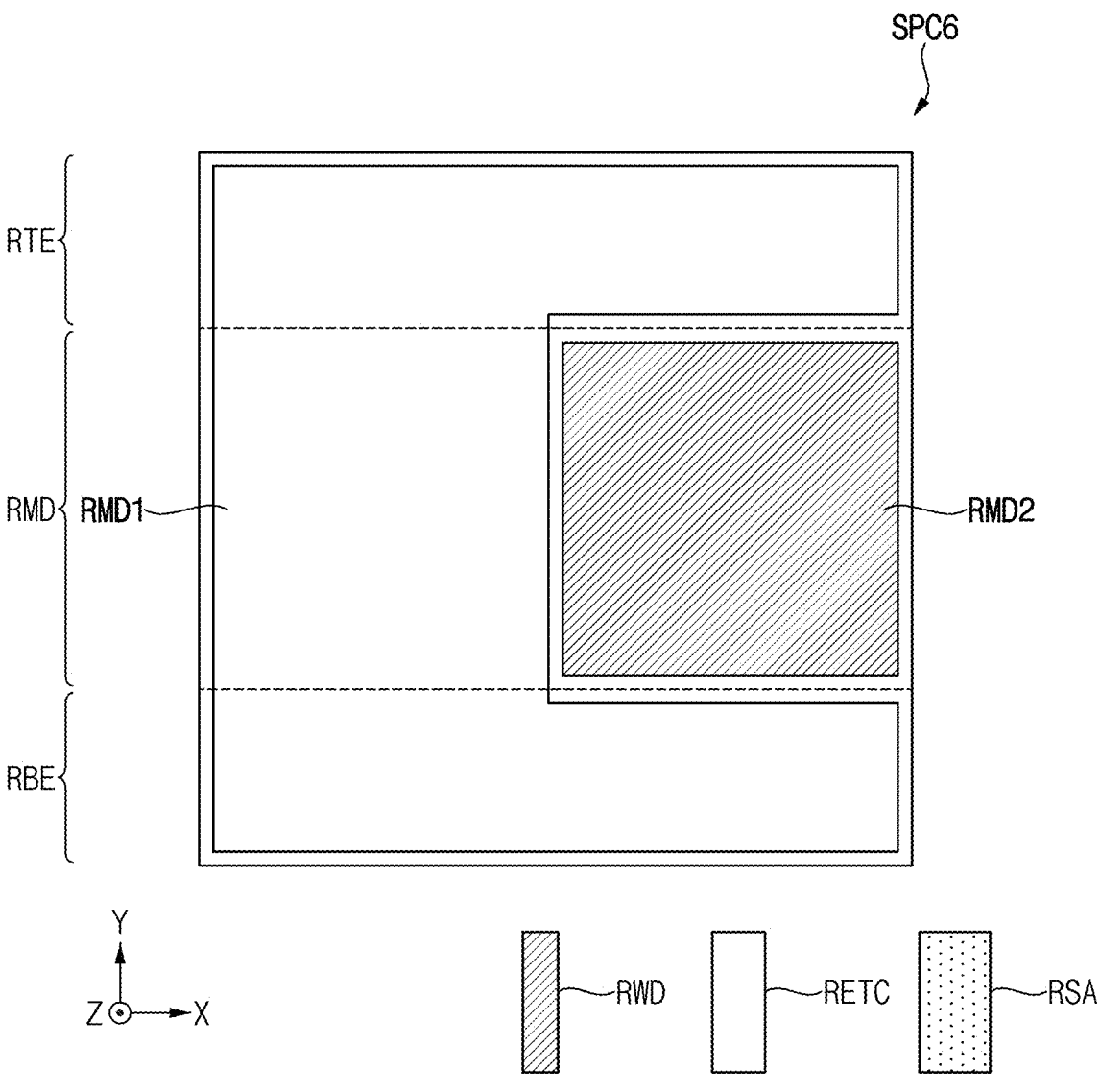
Figure 14B:
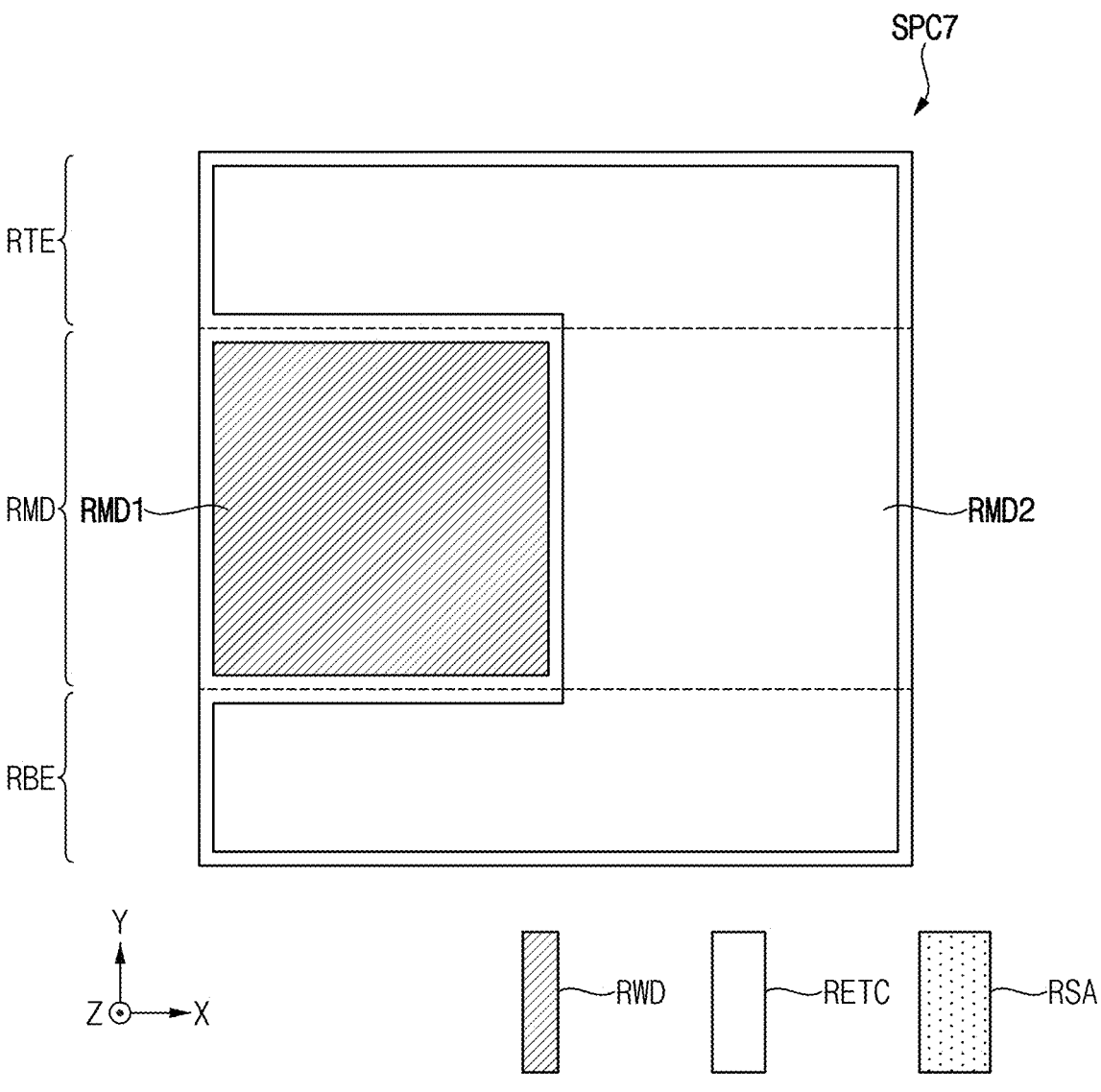

Referring to FIGS. 14A and 14B, the sub peripheral circuits SPC6 and SPC7 may not include sense amplifier regions RSA and may include one wordline driver region RWD disposed in one of the first sub center region RMD1 and the second sub center region RMD2 of the center region RMD.

Figure 15:
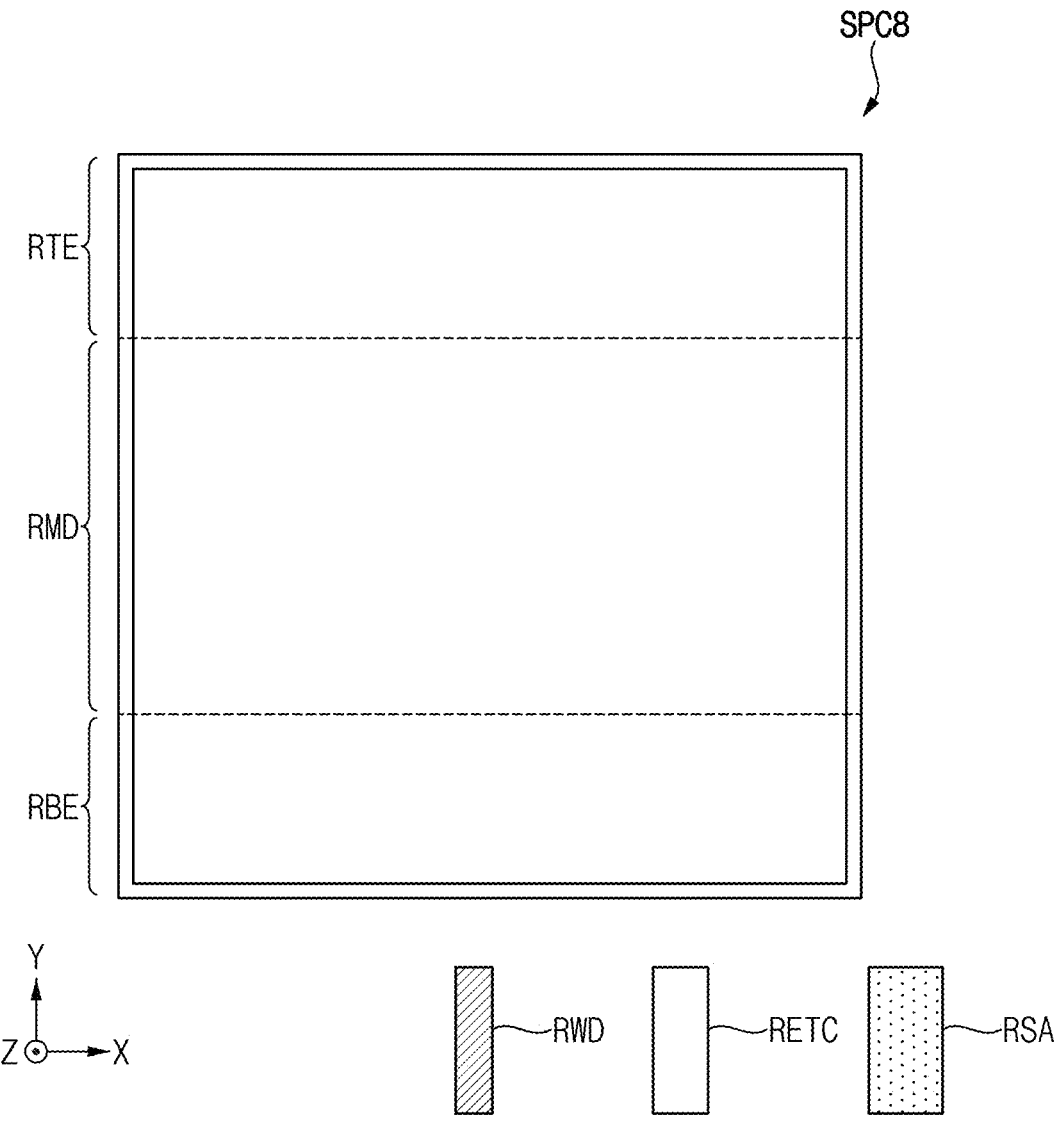

Referring to FIG. 15, the sub peripheral circuit SPC8 may not include either the sense amplifier region RSA and the wordline driver region RWD.

As a result, the area of the rest region RETC of the sub peripheral circuit SPC5 of FIG. 13 may be larger than the area of the rest region RETC of the sub peripheral circuit SPC4 of FIG. 12, and the area of the rest region RETC of the sub peripheral circuits SPC6 and SPC7 of FIG. 13 may be larger than the area of the rest region RETC of the sub peripheral circuit SPC5 of FIG. 14, and the area of the rest region RETC of the sub peripheral circuit SPC8 of FIG. 15 may be larger than the area of the rest region RETC of the sub peripheral circuits SPC6 and SPC7 of FIGS. 14A and 14B.

FIGS. 16A, 16B, 17 and 18 are diagrams illustrating example embodiments of a layout of a core control circuit included in a memory core circuit according to some example embodiments.

Figure 16A:
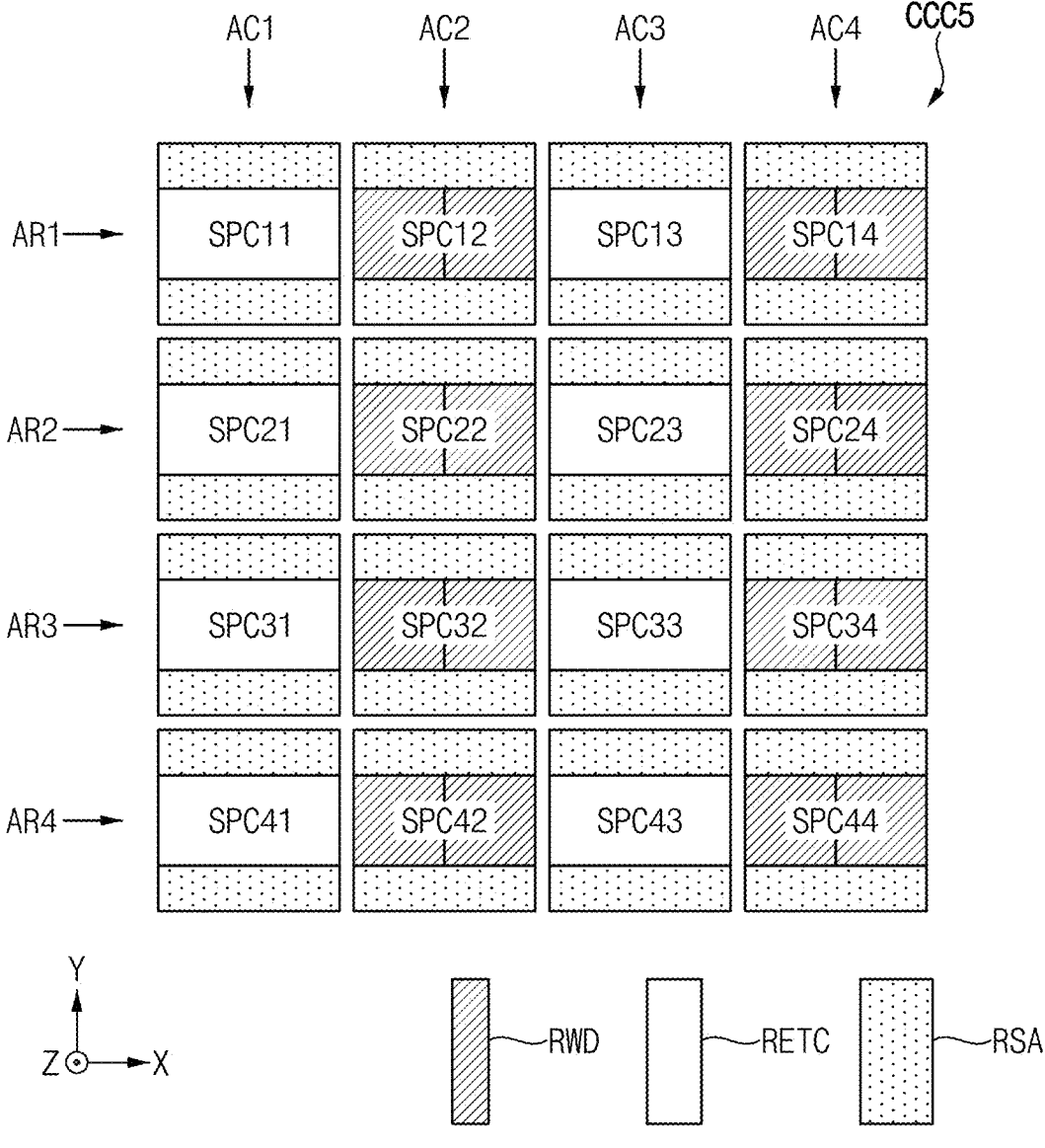
FIGS. 16A, 16B, 17 and 18 are diagrams illustrating example embodiments of a layout of a core control circuit included in a memory core circuit according to some example embodiments.

In some example embodiments, as shown in FIG. 16A, the core control circuit CCC5 may be arranged such that the array rows AC2 and AC4 including only the sub peripheral circuit SPC4 of FIG. 12 and the array rows AC1 and AC3 including only the sub peripheral circuit SPC5 of FIG. 13 are alternately disposed in the row direction X. As a result, for each array row, the sub peripheral circuit SPC4 of FIG. 12 and the sub peripheral circuit SPC5 of FIG. 13 may be alternately disposed.

Figure 16B:
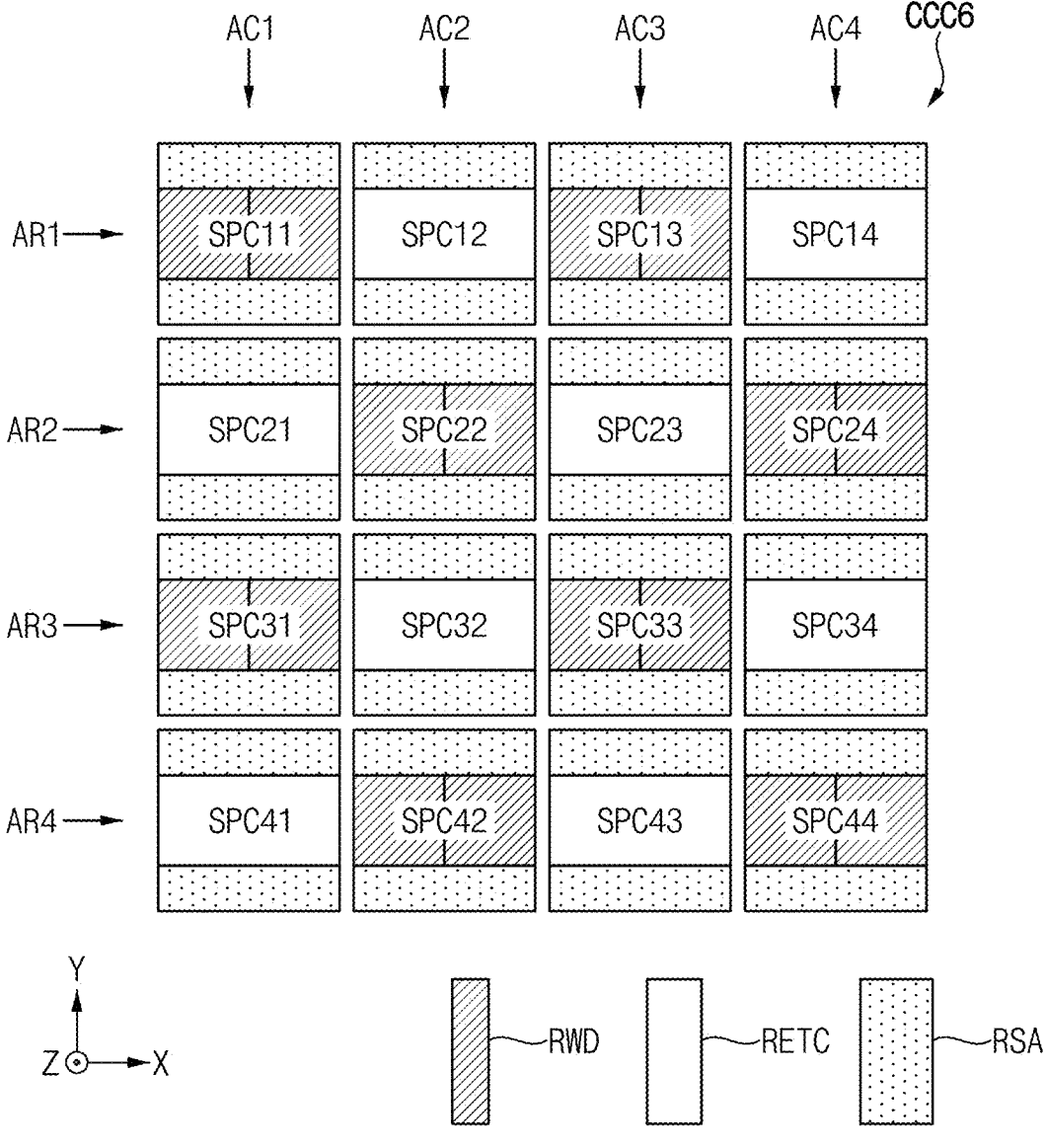

In some example embodiments, as shown in FIG. 16B, the core control circuit CCC6 may be arranged such that the sub peripheral circuit SPC4 of FIG. 12 and the sub peripheral circuit SPC5 of FIG. 13 are alternately disposed in the row direction X and column direction Y, respectively.

Figure 17:
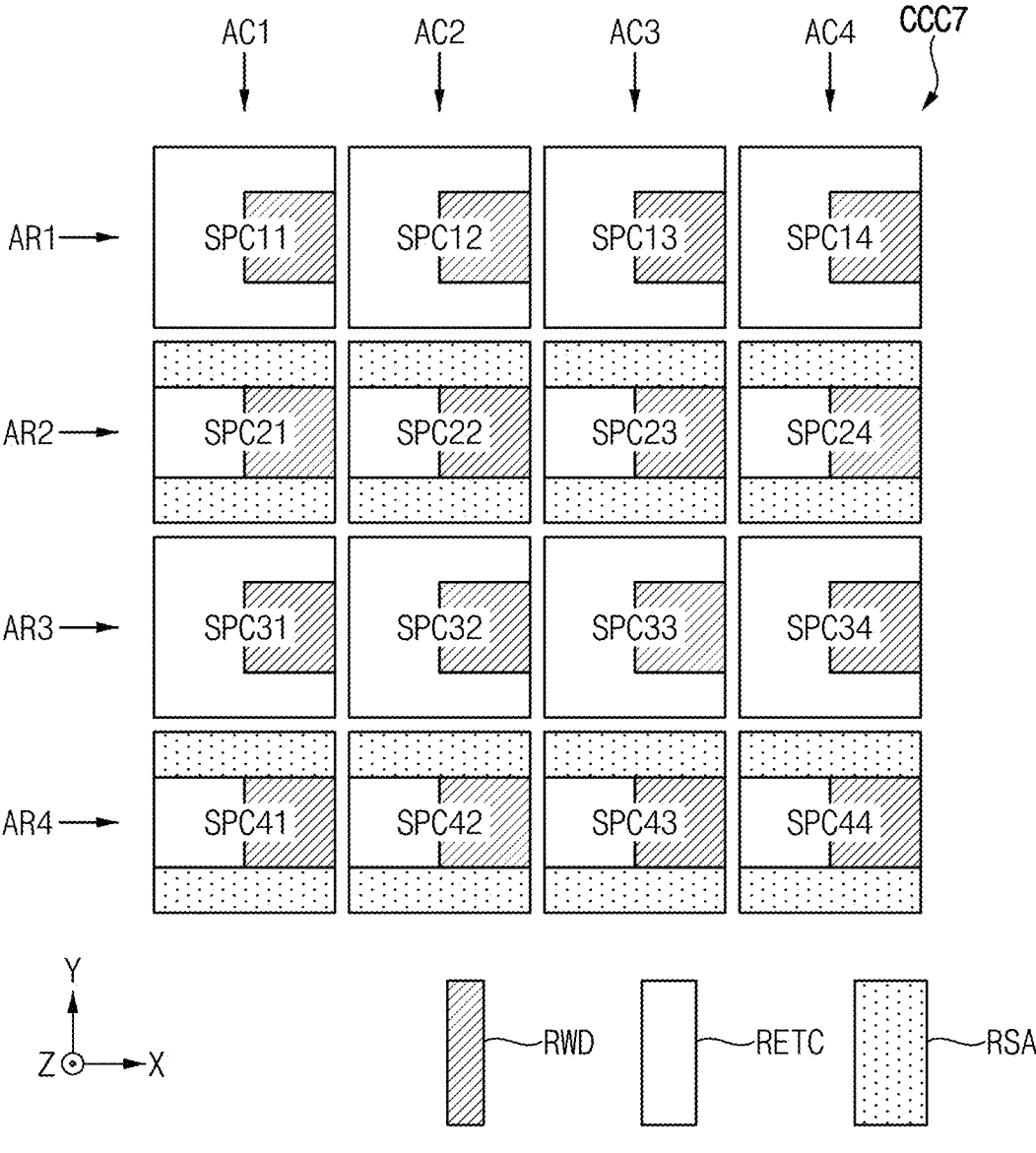

In some example embodiments, as shown in FIG. 17, the core control circuit CCC7 may be arranged such that the array columns AC2 and AC4 including only the sub peripheral circuit SPC1 of FIG. 8A and the array columns AC1 and AC3 including only the sub peripheral circuit SPC6 of FIG. 14A are alternately disposed in the column direction Y. As a result, for each array column, the sub peripheral circuit SPC1 of FIG. 8A and the sub peripheral circuit SPC6 of FIG. 14B may be alternately disposed. The array structure of the core control circuit CCC7 of FIG. 17 is similar to the shift structure of the core control circuit CCC2 of FIG. 10B. According to some example embodiments, the core control circuit CCC7 of FIG. 17 may be modified to have a mirror structure of the core control circuit CCC3 of FIG. 10C.

In various example embodiments, as shown in FIG. 18, the core control circuit CCC8 may be arranged such that the sub peripheral circuit SPC4 of FIG. 12 and the sub peripheral circuit SPC8 of FIG. 15 are alternately disposed in the row direction X and column direction Y, respectively.

As shown in FIGS. 16A, 16B, 17 and 18, the area of the rest region RETC of the sub peripheral circuit adjacent to the one sub peripheral circuit may be increased by concentrating the wordline driver region RWD and/or the sense amplifier region RSA in one sub peripheral circuit instead of distributing them among two adjacent sub peripheral circuits. Although the sum of the areas of the rest regions RETC of the core control circuit CCC as a whole is the same, the design margin of the circuits formed in the rest regions RETC may be improved because the rest regions RETC with relatively large areas may be provided. In particular, device peripheral circuits such as column decoders, error check code (ECC) circuits, and mathematical logic circuits that occupy a relatively large area may be placed in the larger rest region RETC.

FIGS. 19 through 24 are diagrams illustrating example embodiments of a connection of wordlines of a memory core circuit according to some example embodiments.

Figure 19:
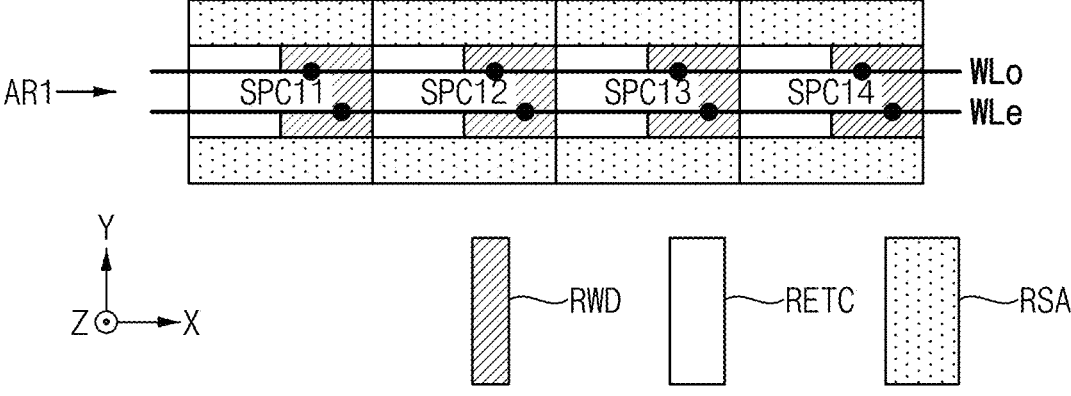
FIGS. 19 through 24 are diagrams illustrating example embodiments of a connection of wordlines of a memory core circuit according to some example embodiments.

For convenience of illustration and description, FIG. 19 shows only two wordlines, e.g., one odd wordline WLo and one even wordline WLe, disposed in one array row AR1 and adjacent in the column direction Y. In each array row, a large number of wordlines may be repeatedly arranged in the column direction Y.

Referring to FIG. 19, all wordline driver regions RWD of sub peripheral circuits SPC11 through SPC14 disposed in array row AR1 may be connected to odd wordlines WLo and even wordlines WLe. In various examples, the wordline driver regions RWD included in each sub peripheral circuit may include both sub wordline drivers driving the odd wordlines WLo and the even wordlines WLe.

Figure 20A:
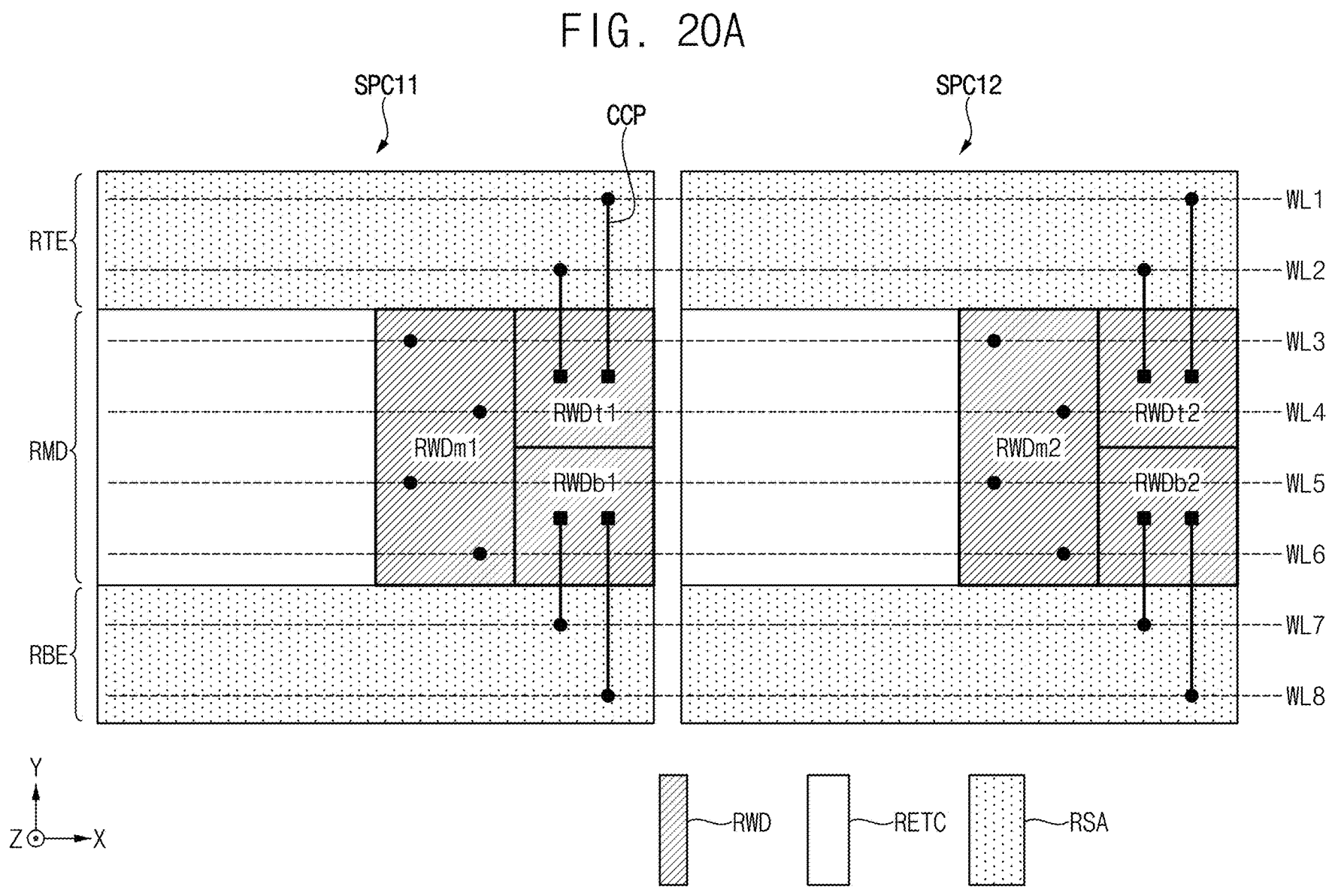
Figure 20B:
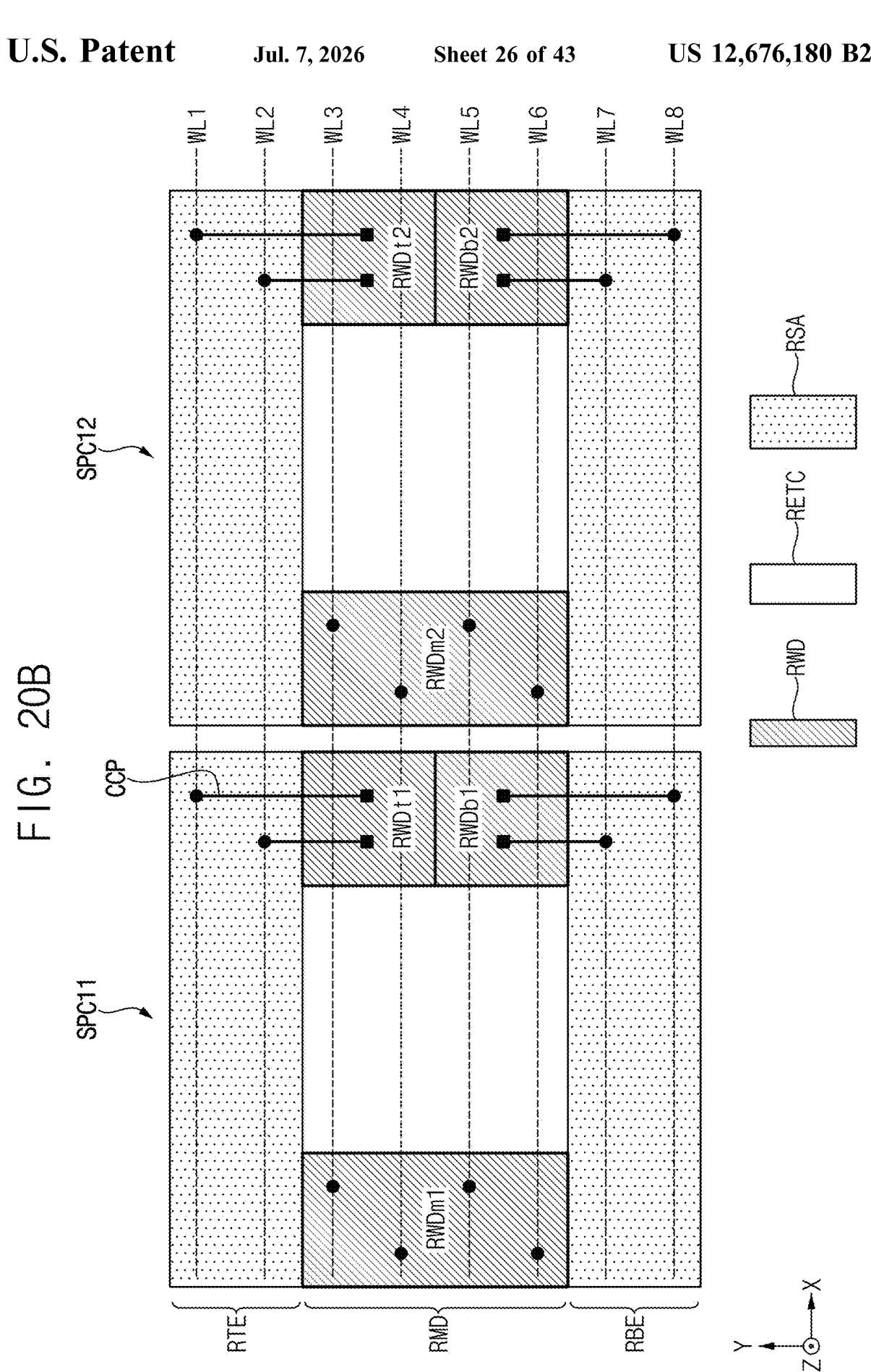

FIGS. 20A and 20B illustrate embodiments of a wordline driver region RWD corresponding to the wordline connection structure of FIG. 19. In FIG. 20A, a first sub peripheral circuit SPC11 and a second sub peripheral circuit SPC12 corresponding to the sub peripheral circuit SPC1 of FIG. 8A and adjacent in the row direction X are shown, and in FIG. 20B, a first sub peripheral circuit SPC1 and a second sub peripheral circuit SPC12 corresponding to the sub peripheral circuit SPC3 of FIG. 9 and adjacent in the row direction X are shown.

As shown in FIGS. 20A and 20B, each of the first sub peripheral circuit SPC11 and the second sub peripheral circuit SPC12 may include a wordline driver region RWD that is connected to all wordlines WL1 through WL8 of the respective array row. In some examples, each wordline driver region RWD of the first sub peripheral circuit SPC11 and the second sub peripheral circuit SPC12 may include a corresponding number of sub wordline drivers for all wordlines WL1 through WL8 of the respective array rows.

The wordline driver region RWD of each of the sub peripheral circuits SPC11 and SPC12 respectively includes first wordline driver regions RMDm1 and RMDm2 connected to wordlines WL3, WL4, WL5 and WL6 disposed above the center region RMD in the vertical direction Z, second wordline driver regions RWDt1 and RWDt2 connected to wordlines WL1 and WL2 disposed above the first column edge region RTE, third wordline driver regions RWDb1 and RWDb2) connected to wordlines WL7 and WL8 disposed above the second column edge region RBE.

The memory core circuit may further include column conduction paths CCP extending in the column direction to connect the wordlines WL1 and WL2 disposed above the first column edge region RTE to the sub wordline drivers of the second wordline driver regions RWDt1 and RWDt2, connect the wordlines WL7 and WL8 above the second column edge region RBE to the sub wordline drivers of the third wordline driver regions RWDb1 and RWDb2.

Figure 21:
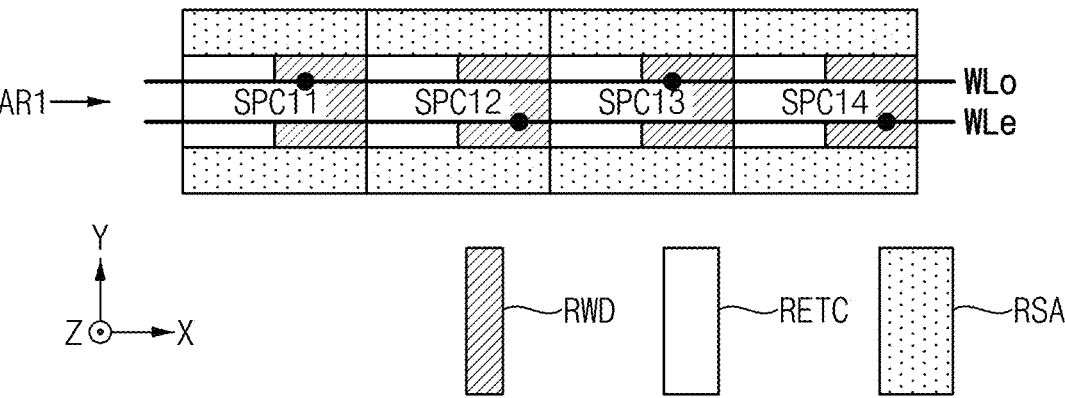

Referring to FIG. 21, with respect to a first sub peripheral circuit (e.g., SPC11) and a second sub peripheral circuit (e.g., SPC12) adjacent in the row direction X, the wordline driver region RWD of the first sub peripheral circuit SPC11 may be connected to odd-numbered wordlines WLo and the wordline driver region RWD of the second sub peripheral circuit SPC12 may be connected to even-numbered wordlines WLe.

Figure 22A:
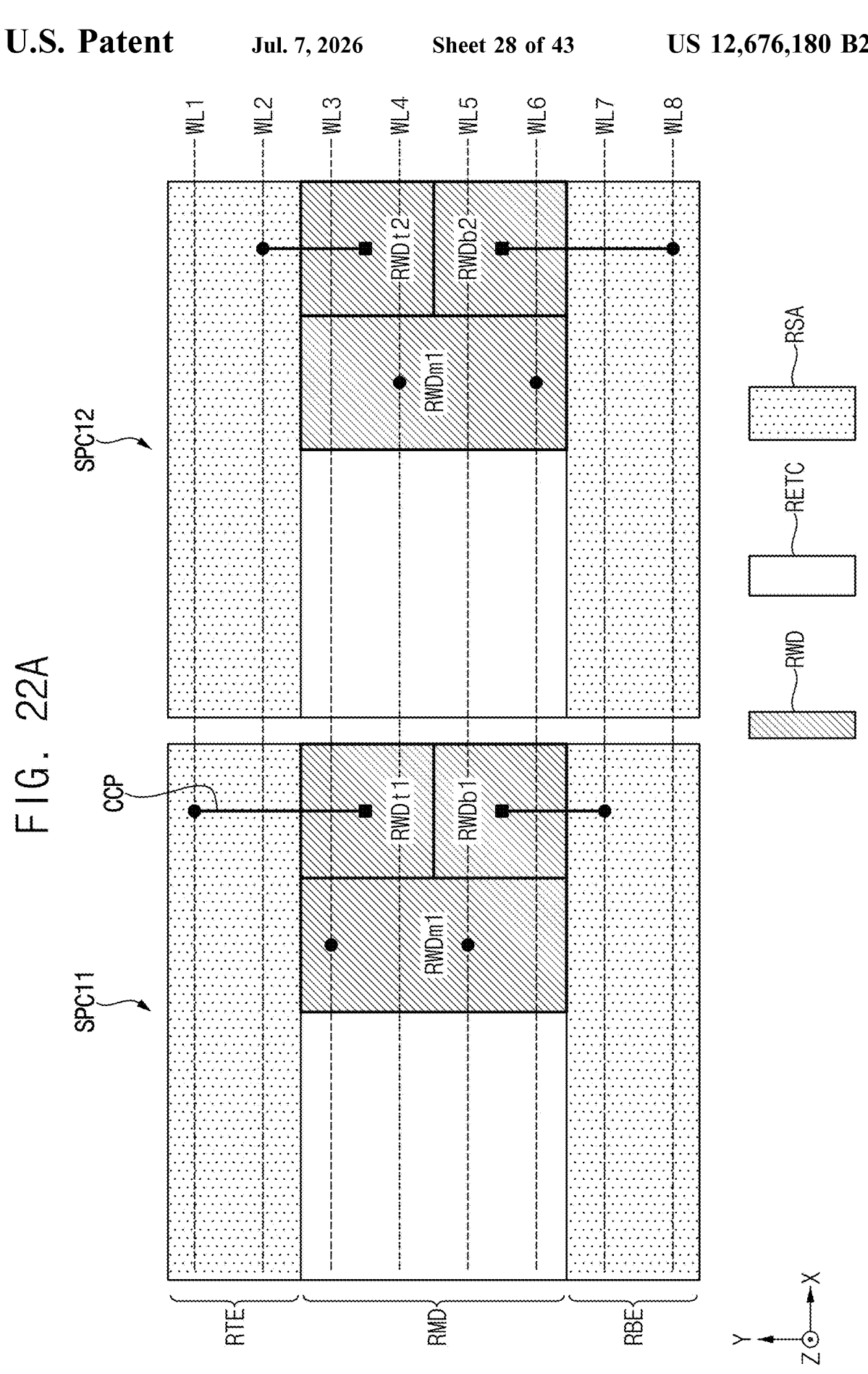
Figure 22B:
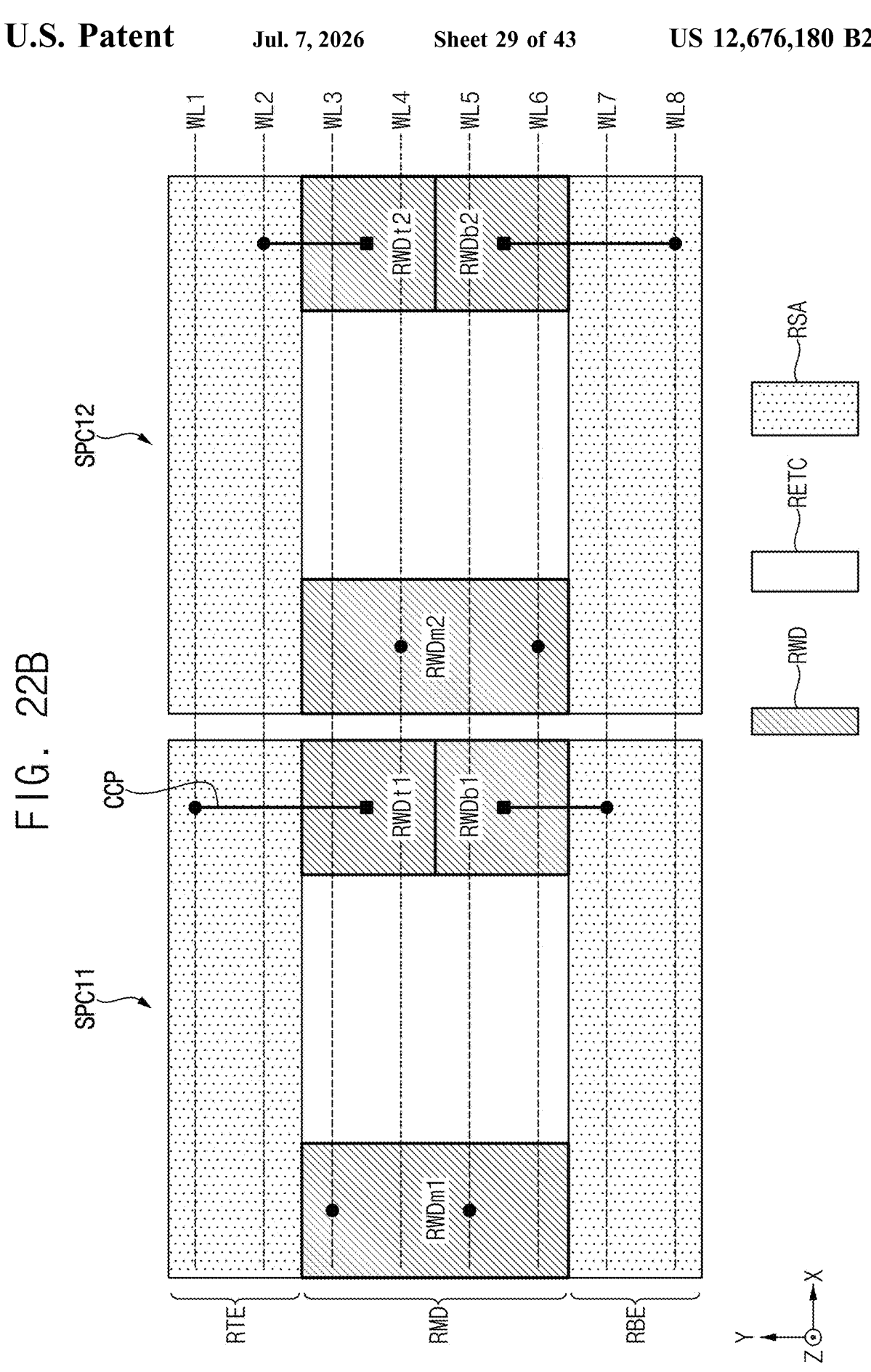
Figure 22C:
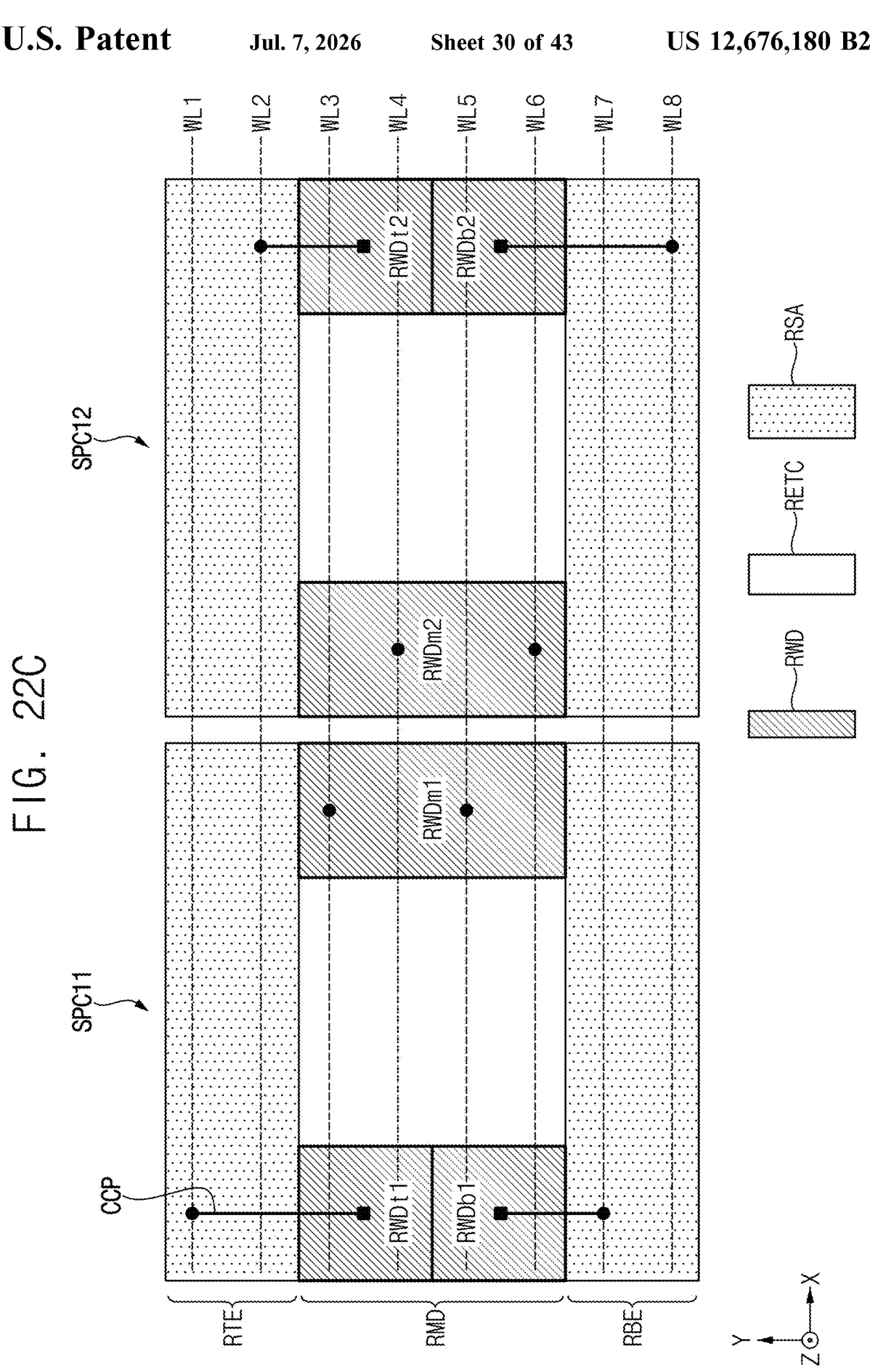

FIGS. 22A, 22B and 22C illustrate example embodiments of the wordline driver region RWD corresponding to the wordline connection structure of FIG. 21. In FIG. 22A, the first sub peripheral circuit SPC11 and the second sub peripheral circuit SPC12 corresponding to the sub peripheral circuit SPC1 of FIG. 8A and adjacent in the row direction X are shown, and in FIGS. 22B and 22C, the first sub peripheral circuit SPC11 and the second sub peripheral circuit SPC12 corresponding to the sub peripheral circuit SPC3 of FIG. 9 and adjacent in the row direction X are shown.

As shown in FIGS. 22A, 22B, and 22C, the first sub peripheral circuit SPC11 may include the wordline driver region RWD connected to the odd-numbered wordlines WL1, WL3, WL5 and WL7, and the second sub peripheral circuit SPC12 may include the wordline driver region RWD connected to the even-numbered wordlines WL2, WL4, WL6 and WL8. In some examples, each wordline driver region RWD of the first sub peripheral circuit SPC11 and the second sub peripheral circuit SPC12 may include a number of sub wordline drivers corresponding to ½ of all wordlines WL1 through WL8 of each array row.

The wordline driver region RWD of each of sub peripheral circuits SPC11 and SPC1 may respectively include the first wordline driver region RMDm1 and RMDm2 connected to the wordlines WL3, WL4, WL5 and WL6 disposed above the center region RMD, the second wordline driver regions RWDt1 and RWDt2 connected to connected to the wordlines WL1 and WL2 disposed above the first column edge regions RTE, and the third wordline driver regions RWDb1 and RWDb2 connected to the wordlines WL7 and WL8 disposed above the second column edge region RBE.

The memory core circuit may further include column conduction paths CCP extending in the column direction Y to connect the wordlines WL1 and WL2 disposed above the first column edge region RTE and the sub wordline drivers of the second wordline driver regions RWDt1 and RWDt2 and connect the wordlines WL7 and WL8 disposed above the second column edge region RBE to the sub wordline drivers of the third wordline driver regions RWDb1 and RWDb2.

Figure 23A:
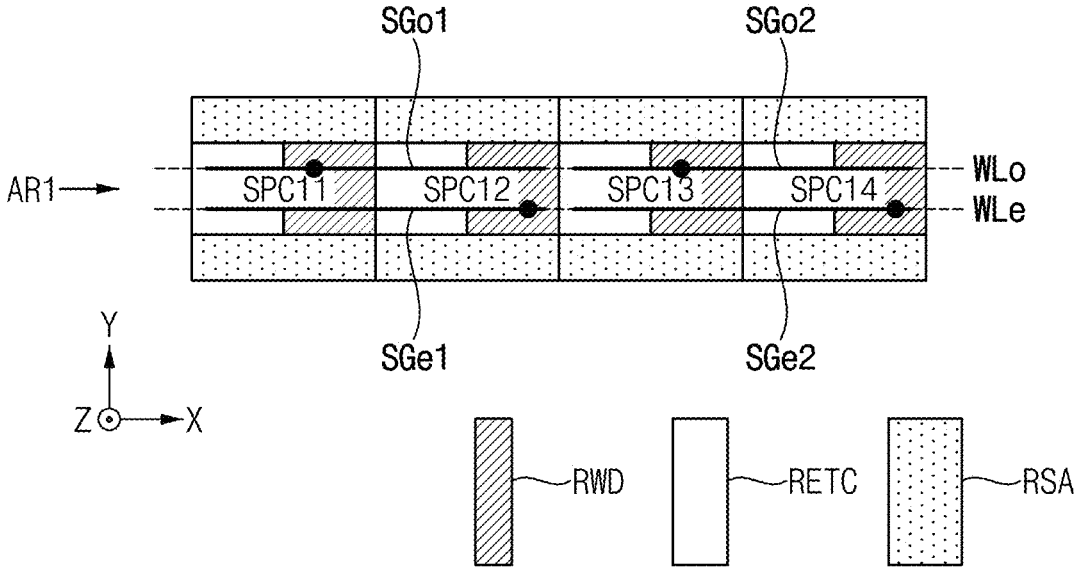
Figure 23B:
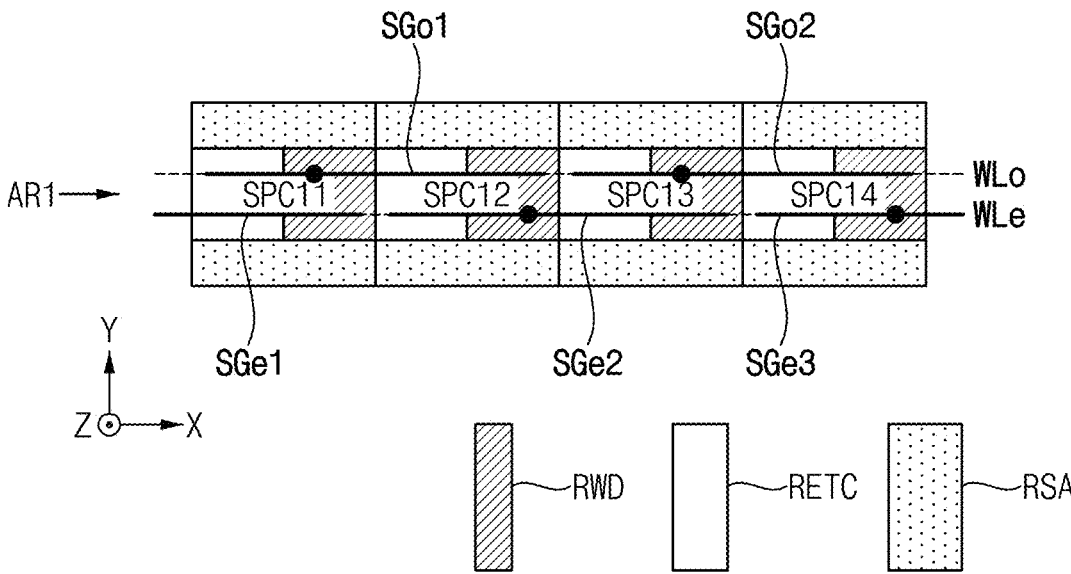

Referring to FIGS. 23A and 23B, the odd-numbered wordlines WLo may be divided into a plurality of segments SGo1 and SGo2 at the boundaries of a certain number of sub peripheral circuits SPC, and the even-numbered wordlines WLe may be divided into a plurality of segments SGe1, SGe2 and SGe3 at the boundaries of a certain number of sub peripheral circuits SPC. According to some example embodiments, the location where the odd-numbered wordlines WLo is cut and the location where the even-numbered wordlines WLe is cut may be the same as shown in FIG. 23A, or may be different as shown in FIG. 23B. Each of the segments SGo1, SGo2, SGe1, SGe2 and SGe3 may be connected to at least one of the wordline driver regions RWD included in the corresponding sub peripheral circuits.

Figure 24:
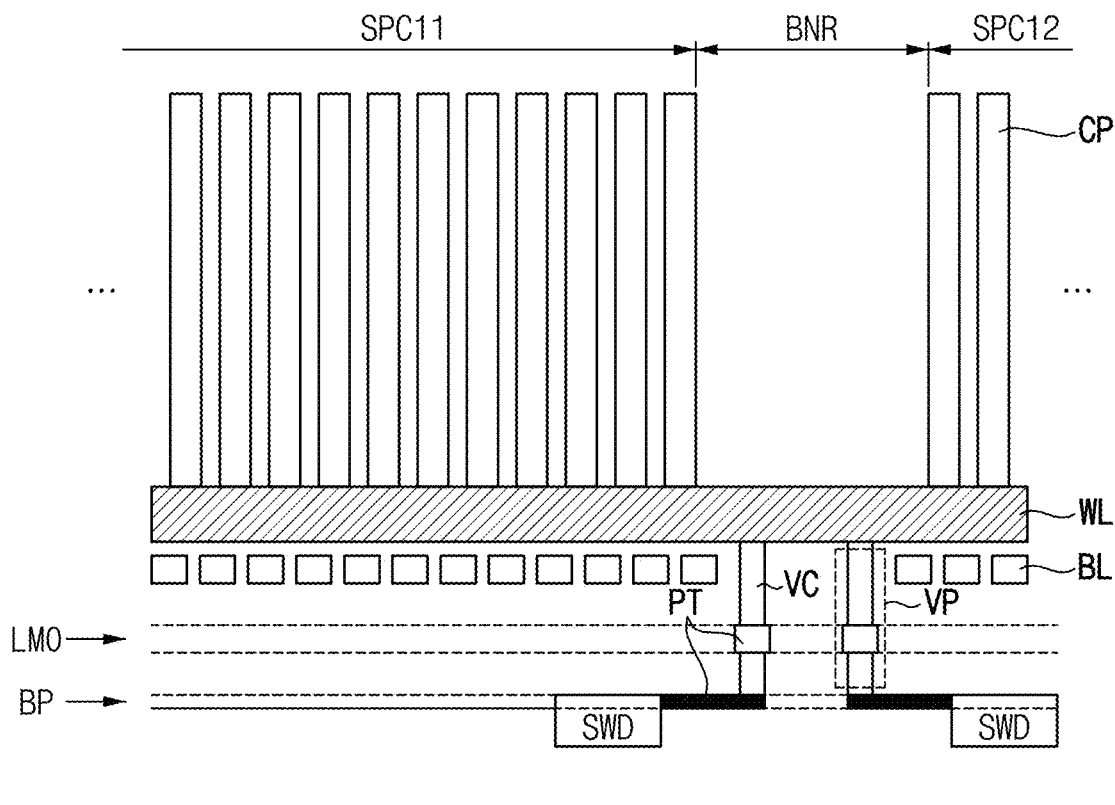
Figure 24:
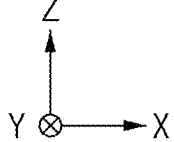

FIG. 24 illustrates a CoP structure as will be described with reference to FIGS. 30, 31 and 32, in which cell capacitors CP, the wordlines WL and the bitlines BL are sequentially disposed in the vertical direction Z. The bitline BL may be connected to the bitline sense amplifier BLSA in the sense amplifier region RSA through conduction patterns PT in the conduction layers BP and LM0 and vertical contacts VC. The wordline WL may be connected to the sub wordline driver SWD in the wordline driver region RWD through conduction patterns PT, which are in the conduction layers BP and LM0, and vertical contacts VC.

In some example embodiments, as illustrated in FIG. 24, the wordline WL may be connected to the sub wordline driver SWD included in the wordline driver region RWD through the vertical contact VC that is disposed in a boundary region BNR between two sub peripheral circuits SPC11 and SPC12 that are adjacent to each other in the row direction X.

FIGS. 25 through 29 are diagrams illustrating example embodiments of a connection of bitlines included in a memory core circuit according to some example embodiments.

FIGS. 25 through 28 illustrate four sub peripheral circuits SPC11, SPC21, SPC31 and SPC41 disposed in a column direction Y in one array column AC1. While eight bitlines BL1 through BL8 are illustrated in one array column AC1, the number of bitlines corresponding to one array column AC1 may be varied.

Figure 25:
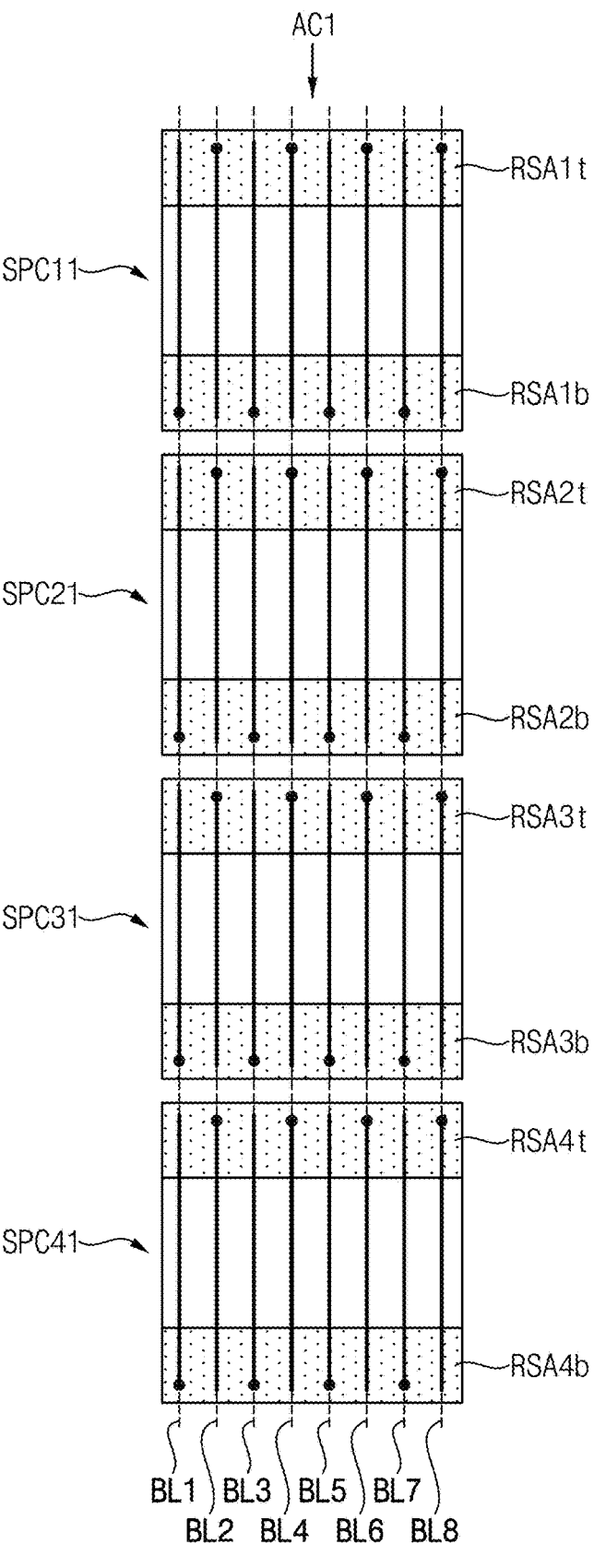
FIGS. 25 through 29 are diagrams illustrating example embodiments of a connection of bitlines included in a memory core circuit according to some example embodiments.
Figure 26:
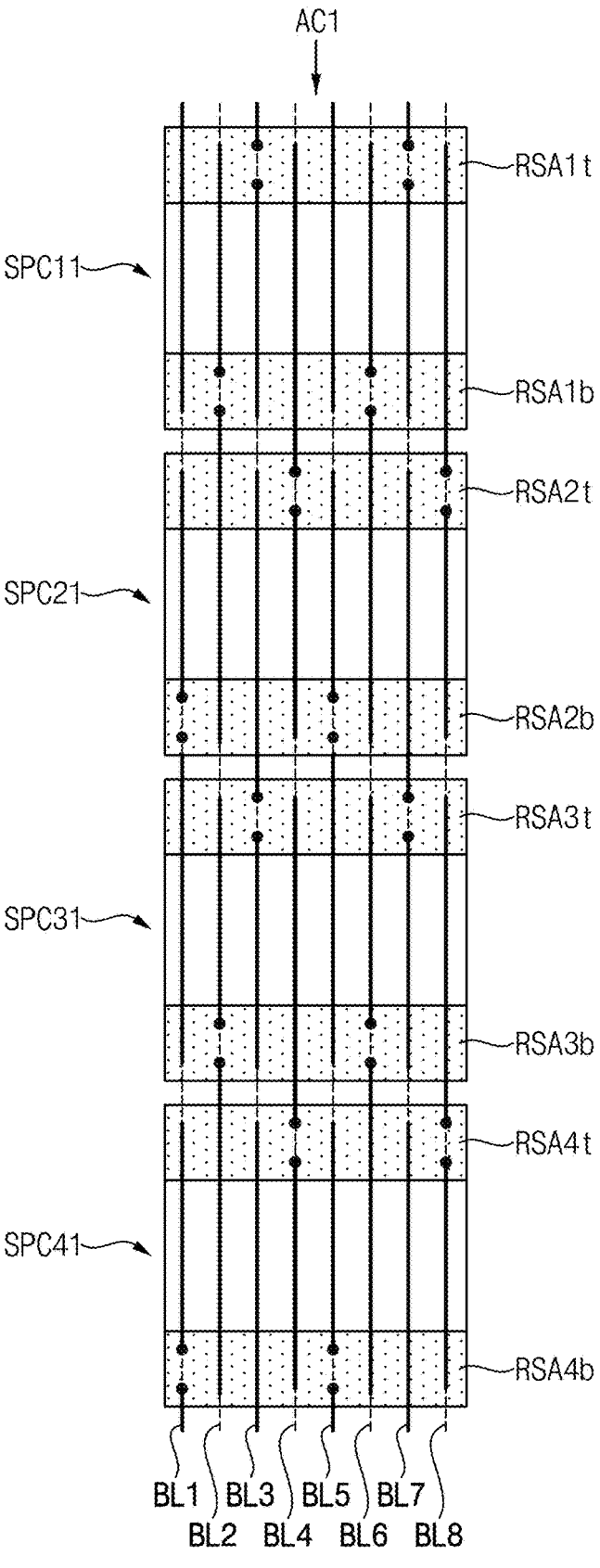
Figure 27A:
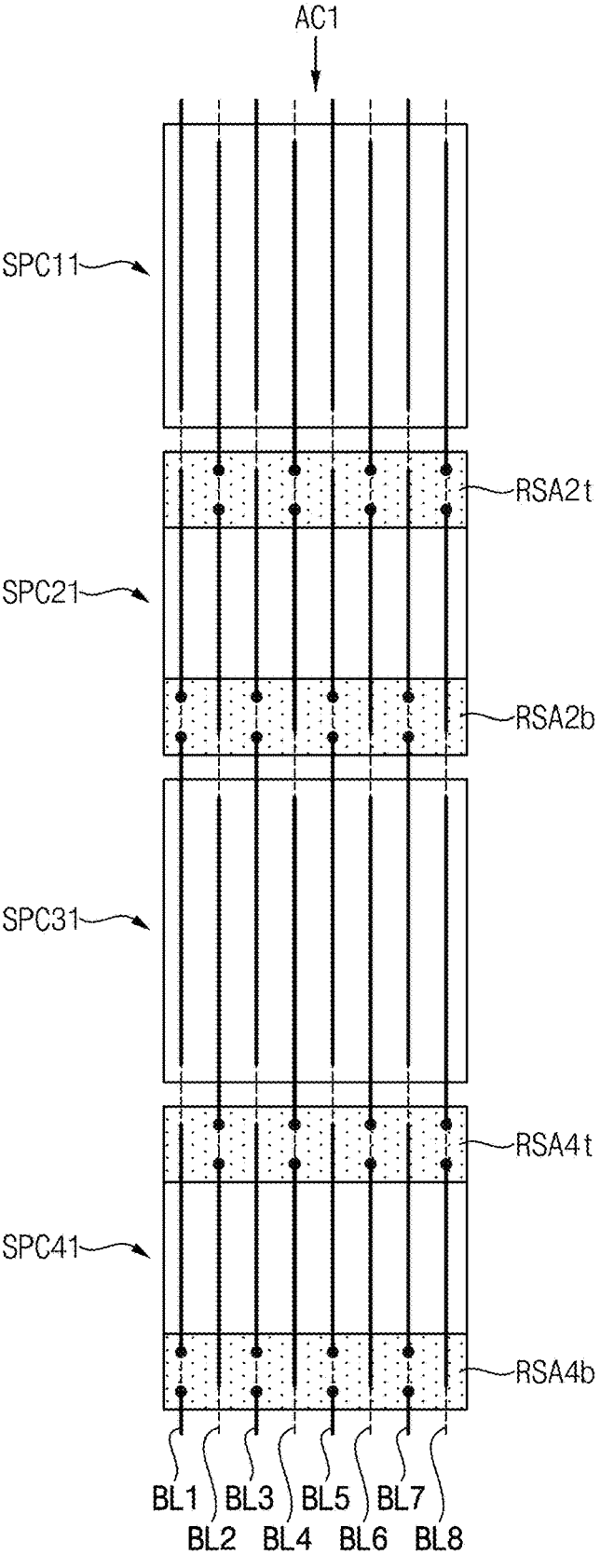
Figure 27B:
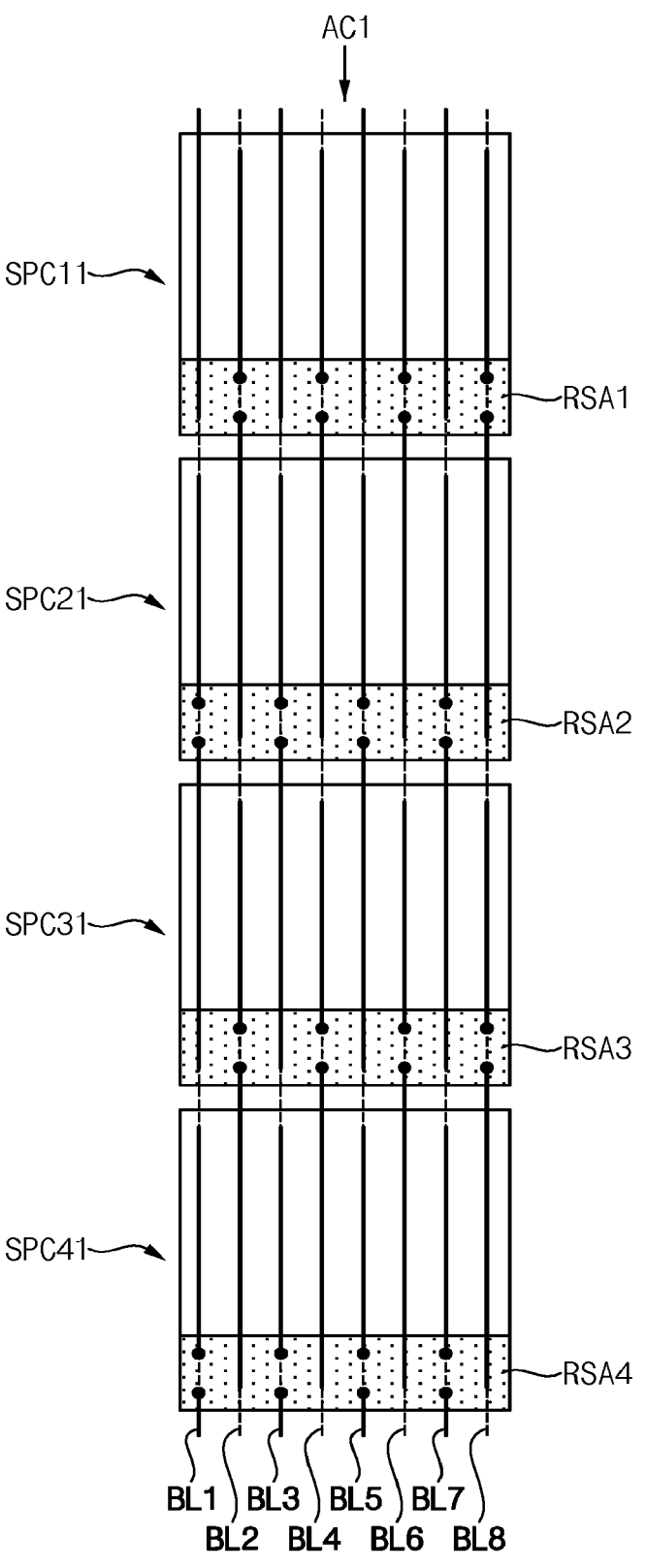
Figure 28:
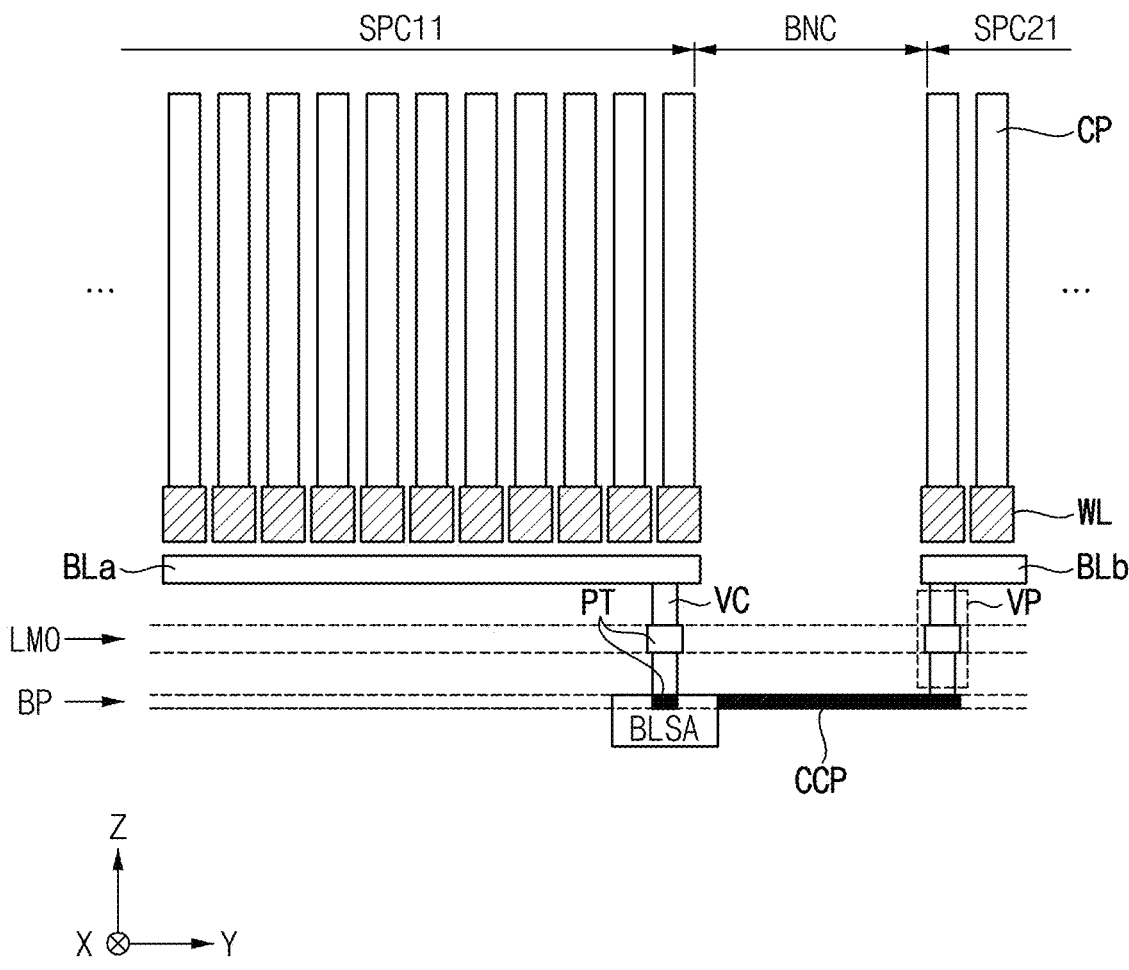

FIG. 25 shows a closed bitline structure is illustrated, and FIGS. 26 through 28 show an open bitline structure.

The closed bitline structure may be relatively simple to control the bitline sense amplifiers, but requires a relatively large number of bitline sense amplifiers to be included, which reduces the design margin of the memory core circuit. On the other hand, the open bitline structure may reduce the number of bitline sense amplifiers, which may improve the design margin of the memory core circuit.

For example, in the closed bitline structure of FIG. 25, each sub peripheral circuit includes bitline sense amplifiers corresponding to the number of bitlines, whereas in the open bitline structure of FIGS. 16 through 28, the average number of bitline sense amplifiers included in the sub peripheral circuits may be reduced to ½ as many as in the closed bitline structure. In FIG. 25, one point corresponds to one bitline sense amplifier connected to each bitline, and in FIGS. 26 through 28, two points that are adjacent in the column direction Y in the same sense amplifier region RSA correspond to one bitline sense amplifier connected to a bitline and a complementary bitline.

Referring to FIG. 25, each of the sub peripheral circuits SPC11, SPC21, SPC31 and SPC31 may respectively include even-numbered sense amplifier regions RSA1t, RSA2t, RSA3t and RSA4t connected to the even-numbered bitlines BL2, BL4, BL6 and BL8 and odd-numbered sense amplifier regions RSA1*b*, RSA2*b*, RSA3*b* and RSA4*b* connected to the odd-numbered bitlines BL1, BL3, BL5 and BL7.

Referring to FIG. 26, each of the sub peripheral circuit SPC11, SPC21, SPC31 and SPC41 may respectively include the first sense amplifier regions SA1*t*, RSA2*t*, RSA3*t* and RSA4*t* disposed in the first column edge region RTE and the second sense amplifier regions RSA1*b*, RSA2*b*, RSA3*b* and RSA4*b* disposed in the second column edge region RBE. If the number of bitlines corresponding to one array column AC1 is 4N where N is a natural number (e.g., a natural number greater than zero), each sense amplifier region RSA of the first sense amplifier regions RSA1*t*, RSA2*t*, RSA3*t* and RSA4*t* and the second sense amplifier regions RSA1*b*, RSA2*b*, RSA3*b* and RSA4*b* may include N bitline sense amplifiers. In other words, one sub peripheral circuit may include 2N bitline sense amplifiers.

For example, in the case of N=2, as shown in FIG. 26, one array column AC1 includes eight bitlines BL1 through BL8, and each sense amplifier region may include two bitline sense amplifiers. Each bitline sense amplifier may be connected to a bitline corresponding to its own sub peripheral circuit and a complementary bitline corresponding to another sub peripheral circuit.

For example, example embodiments are described with respect to a first sub peripheral circuit SPC11, a second sub peripheral circuit SPC21 and a third sub peripheral circuit SPC31 disposed adjacent and sequentially in the column direction Y.

The two odd-numbered bitlines BL1 and BL5 among the eight bitlines BL through BL8 corresponding to the second sub peripheral circuit SPC21 may be connected to a sense amplifier region RSA2*b* disposed in the second column edge region RBE of the second sub peripheral circuit SPC21. Here, being connected to the sense amplifier region indicates being connected to the bitline sense amplifiers included in the sense amplifier region. The other two odd-numbered bitlines BL3 and BL5 among the eight bitlines BL1 through BL8 may be connected as complementary bitlines to the sense amplifier region RSA3*t* disposed in the first column edge region RTE of the third sub peripheral circuit SPC41.

The two even-numbered bitlines BL4 and BL8 among the eight bitlines BL1 through BL8 may be connected as complementary bitlines to the sense amplifier region RSA2*t* disposed in the first column edge region RTE of the second sub peripheral circuit SPC21. The other two even-numbered bitlines BL2 and BL4 of the eight bitlines BL1 through BL8 may be connected to the sense amplifier region RSA1*b* disposed in the second column edge region RBE of the first sub peripheral circuit SPC11.

As such, each sub peripheral circuit (e.g., SPC21) may include 2N bitline sense amplifiers corresponding to 2N bitlines among the corresponding 4N bitlines.

In some cases, N bitline sense amplifiers among the 2N bitline sense amplifiers may be disposed in the first column edge region RTE of the sub peripheral circuit SPC21, and the other N bitline sense amplifiers among the 2N bitline sense amplifiers may be disposed in the second column edge region RBE of the sub peripheral circuit SPC21.

The other 2N bitlines of the 4N bitlines may be connected as complementary bitlines to the bitline sense amplifiers disposed in the two sub peripheral circuits SPC11 and SPC31 adjacent to each sub peripheral circuit SPC21 on both sides in the column direction Y.

Hereinafter, descriptions that are redundant with FIG. 26 may be omitted.

Referring to FIG. 27A, each of the odd-numbered sub peripheral circuit SPC11 and SPC31 among the sub peripheral circuits SPC11, SPC21, SPC31 and SPC41 sequentially arranged in the column direction Y does not include the bitline sense amplifiers, and each of the even-numbered sub peripheral circuits SPC21 and SPC41 among the sub peripheral circuits SPC11, SPC21, SPC31 and SPC41 may include 4N bitline sense amplifiers corresponding to 2N bitlines of the 4N bitlines corresponding to each of the even-numbered sub peripheral circuits SPC21 and SPC41.

For example, as shown in FIG. 27A, when N=2, one array column AC1 may include 8 bitlines BL1 through BL8, and each of the odd-numbered sub peripheral circuits SPC11 and SPC31 may include no bitline sense amplifiers, and each of the even-numbered sub peripheral circuits SPC21 and SPC41 may include 8 bitline sense amplifiers.

For example, example embodiments are describe for the case where the first sub peripheral circuit, the second sub peripheral circuit, and the third sub peripheral circuit are SP21, SPC31, and SPC41, respectively, disposed adjacent and sequentially in the column direction Y.

The four odd-numbered bitlines BL1, BL3, BL5 and BL7 among the eight bitlines BL1 through BL8 corresponding to the first sub peripheral circuit S21 may be connected to the sense amplifier region RSA2*b* disposed in the second column edge region RBE of the first sub peripheral circuit SPC21. The four even-numbered bitlines BL2, BL4, BL6 and BL8 of the eight bitlines BL1 through BL8 of the first sub peripheral circuit SPC21 may be connected to the sense amplifier region RSA2*t* of the first column edge region RTE of the first sub peripheral circuit SPC21.

The four odd-numbered bitlines BL1, BL3, BL5 and BL7 among the eight bitlines BL1 through BL8 corresponding to the second sub peripheral circuit SPC31 may be connected as complementary bitlines to the sense amplifier region RSA2*b* disposed in the second column edge region RBE of the first sub peripheral circuit SPC21. The four even-numbered bitlines BL2, BL4, BL6 and BL8 of the eight bitlines BL1 through BL8 corresponding to the second sub peripheral circuit SPC31 may be connected as complementary bitlines to the sense amplifier region RSA4*t* of the first column edge region RTE of the third sub peripheral circuit SPC41.

As such, each odd-numbered sub peripheral circuit SPC31 may not include any bitline sense amplifiers, and each even-numbered sub peripheral circuit SPC21 may include 4N bitline sense amplifiers corresponding to the 4N bitlines corresponding to each even-numbered sub peripheral circuit SPC21.

Among the 4N bitline sense amplifiers, 2N bitline sense amplifiers may be disposed in the first column edge region RTE of each even-numbered sub peripheral circuit SPC21. The other 2N bitline sense amplifiers among the 4N bitline sense amplifiers may be disposed in the second column edge region RBE of each even-numbered sub peripheral circuit SPC21.

The 4N bitlines corresponding to each odd-numbered sub peripheral circuit SPC31 may be connected as complementary bitlines to bitline sense amplifiers disposed in the two even-numbered sub peripheral circuits SPC21 and SPC41 adjacent to each odd-numbered sub peripheral circuit SPC31 in the column direction Y on both sides.

Referring to FIG. 27B, each of the sub peripheral circuits SPC11, SPC21, SPC31 and SPC41 may respectively include the sense amplifier regions RSA1, RSA2, RSA3 and RSA4 disposed in the first column edge region RTE or the second column edge region RBE. FIG. 27B illustrates an example where each of the sense amplifier regions RSA1, RSA2, RSA3 and RSA4 is disposed in the second column edge region RBE, but example embodiments are not limited thereto. Each of the sub peripheral circuits SPC11, SPC21, SPC31 and SPC41 may include 2N bitline sense amplifiers corresponding to 2N bitlines among the 4N bitlines corresponding to each of the sub peripheral circuits SPC11, SPC21, SPC31 and SPC41.

For example, in the case of N=2, as shown in FIG. 27B, one array column AC1 may include eight bitlines BL1 through BL8, and each sub peripheral circuit SPC11, SPC21, SPC31 and SPC41 may include eight bitline sense amplifiers.

For example, example embodiments are described for a case where a first sub peripheral circuit and a second sub peripheral circuit disposed adjacent and sequentially in the column direction Y are SP11 and SPC21, respectively.

Among the eight bitlines BL1 through BL8 corresponding to the second sub peripheral circuit SPC21, the four odd-numbered bitlines BL1, BL3, BL5 and BL7 may be connected to the sense amplifier region RSA2 disposed in the second column edge region RBE of the second sub peripheral circuit SPC21.

The four even-numbered bitlines BL2, BL4, BL6 and BL8 among the eight bitlines BL1 through BL8 of the second sub peripheral circuit SPC21 may be connected to the sense amplifier region RSA1 disposed in the second column edge region RBE of the first sub peripheral circuit SPC11.

As such, each sub peripheral circuit SPC21 may include 2N bitline sense amplifiers corresponding to 2N bitlines among the 4N bitlines corresponding to each sub peripheral circuit SPC21.

The 2N bitline sense amplifiers may be disposed all in the first column edge region RTE of each sub peripheral circuit SPC21 or all in the second column edge region RBE of each sub peripheral circuit SPC21.

The other 2N bitlines among the 4N bitlines may be connected as complementary bitlines to bitline sense amplifiers disposed in one sub peripheral circuit SPC11 adjacent to each sub peripheral circuit SPC21 in the column direction Y.

Figure 29:
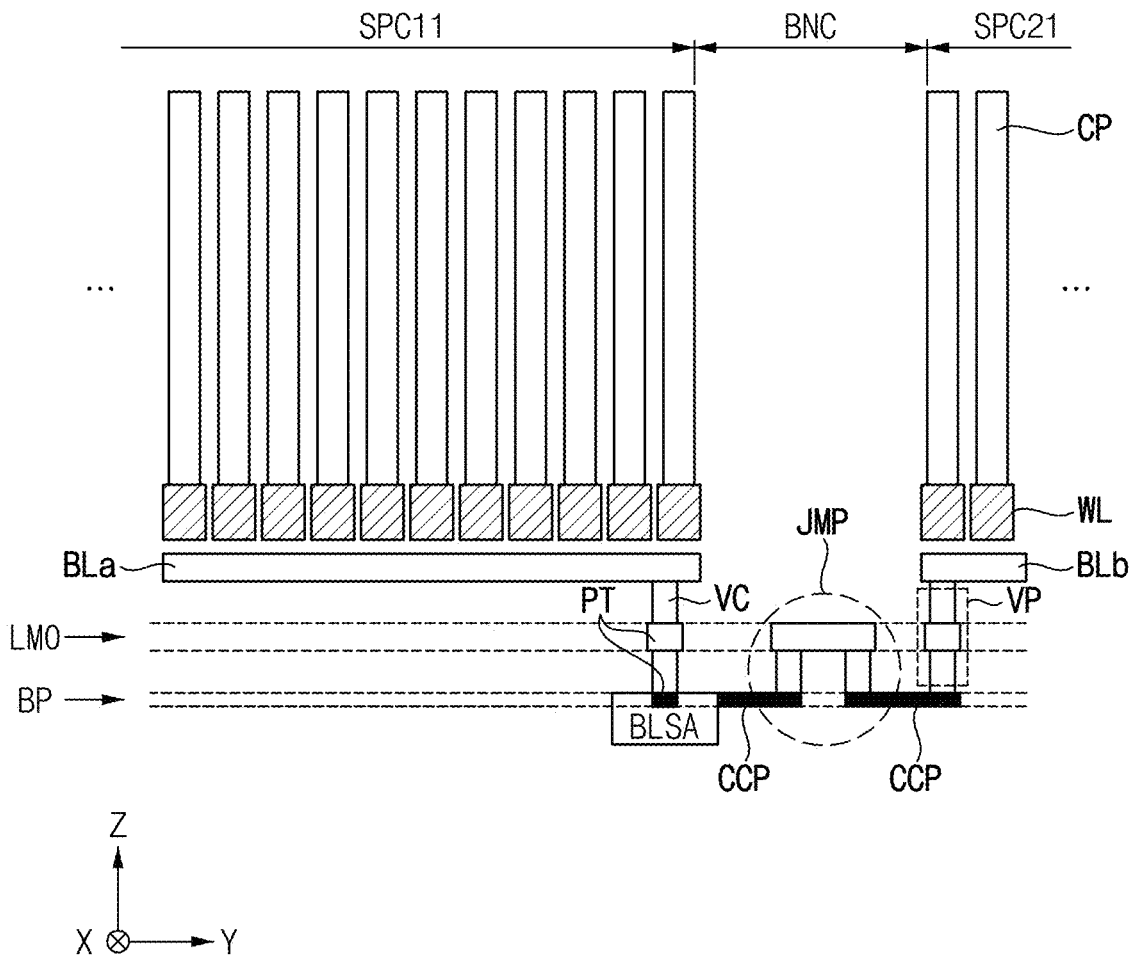

FIGS. 28 and 29 illustrate a CoP structure, which will be further described with reference to FIGS. 30, 31 and 32, in which cell capacitors CP, the wordlines WL and the bitlines BL are sequentially disposed in the vertical direction Z. The bitlines BLa and BLb may be connected to the bitline sense amplifier BLSA in the sense amplifier region RSA through conduction patterns PT in the conduction layers BP and LM0 and vertical contacts VC.

In some example embodiments, as illustrated in FIGS. 28 and 29, the bitline BLb of the sub peripheral circuit SPC21 may be connected to the bitline sense amplifier BLSA in the sense amplifier region RSA of the sub peripheral circuit SPC11 through the column conduction path CCP that is formed in the boundary region BNC between the sub peripheral circuit SPC21 and the neighboring sub peripheral circuit SPC11 adjacent in the column direction Y to the sub peripheral circuit SPC21. The bitline BLb may correspond to a complementary bit line of the bitline BLa of the sub peripheral circuit SPC11. The column conduction path CCP may be connected to the bit line BLb via a vertical path VP.

As such, the column conduction path CCP may extend in the column direction Y to cross the boundary region BNC in the column direction Y and may connect the bitline BLa and the complementary bitline BLb to the bitline sense amplifier BLSA.

In some example embodiments, as illustrated in FIG. 28, the column conduction path CCP may be implemented as one conduction pattern formed in the conduction layer BP. In some example embodiments, as illustrated in FIG. 29, the column conduction path CCP may be divided into the two segments for electrical isolation from other routing wires in the conduction layer BP, and the two segments may be connected to each other through a jumper structure JMP.

In some example embodiments, a memory core circuit according to some example embodiments may have an open bitline structure. According to the open bitline structure, each bitline sense amplifier may be connected to one bitline and one complementary bitline.

As illustrated in FIGS. 28 and 9, each bitline sense amplifier BLSA may be connected together to one bitline BLb and a complementary bitline BLa. For example, the one bitline BLb may correspond to the bitline of the sub peripheral circuit SPC21, and the complementary bitline BLa may correspond to the bitline of the neighboring sub peripheral circuit SPC11.

As such, the memory core circuit according to some example embodiments may have the open bitline structure such that each bitline sense amplifier BLSA is connected to one bitline BLb disposed above each sub peripheral circuit SPC21. The memory core circuit may also have one complementary bitline BLa disposed above the neighboring sub peripheral circuit SPC11. In this case, the one bitline BLb and the one complementary bitline BLa connected to each bitline sense amplifier BLSA may be disposed at the same position in the row direction X.

Figure 30:
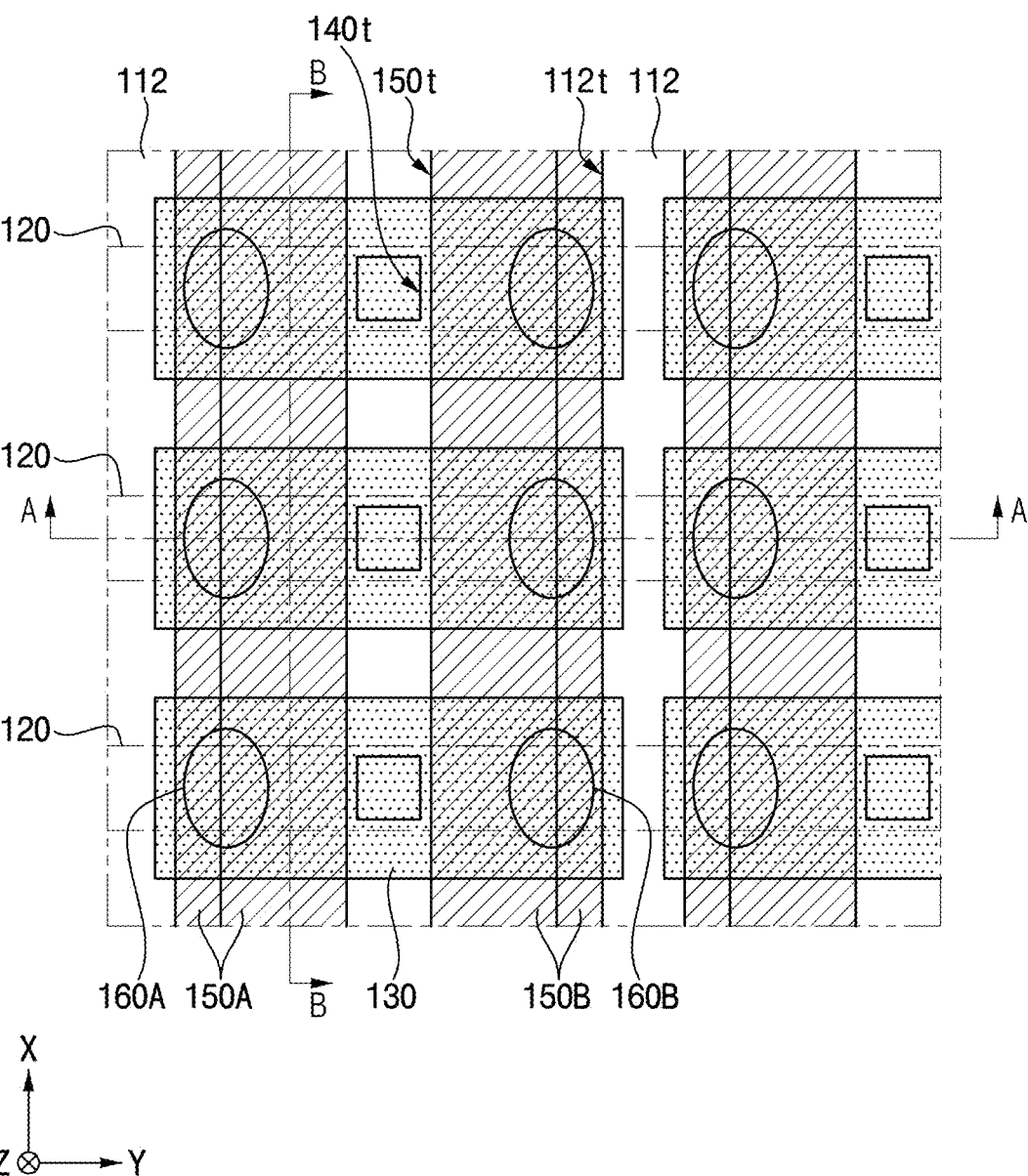
FIG. 30 is a diagram illustrating a schematic layout of a memory core circuit according to some example embodiments.

FIG. 30 is a diagram illustrating a schematic layout of a memory core circuit according to some example embodiments. FIG. 31 is a cross-sectional view taken along a line A-A in FIG. 30, and FIG. 32 is a cross-sectional view taken along a line B-B in FIG. 30.

Figure 31:
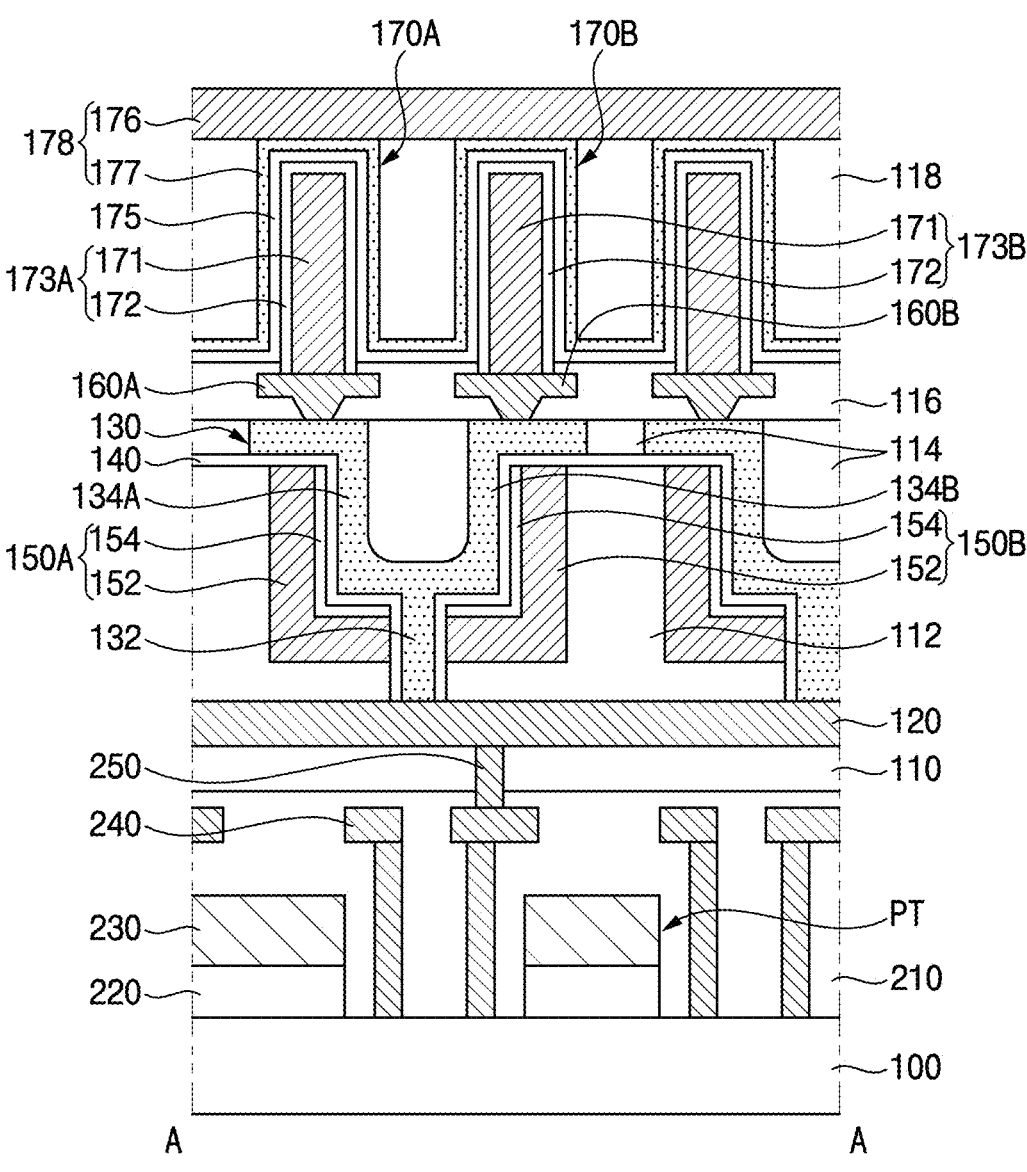
FIG. 31 is a cross-sectional view taken along a line A-A in FIG. 30.
Figure 31:
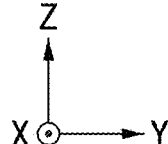
Figure 32:
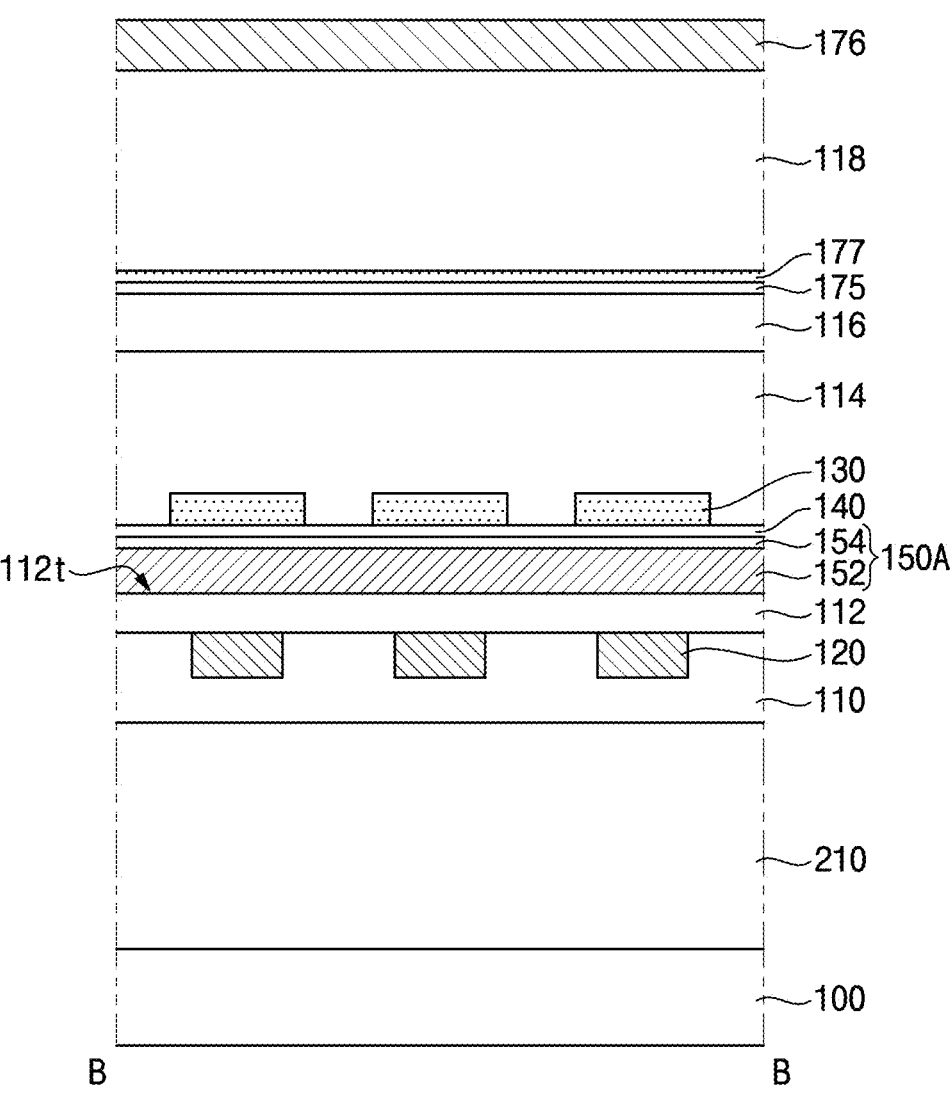
FIG. 32 is a cross-sectional view taken along a line B-B in FIG. 30.
Figure 32:
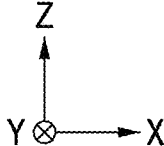

Referring to FIGS. 30, 31 and 32, the memory device according to some example embodiments includes a first substrate 100, a conductive line 120, a first interlayer insulation film 112, gate electrodes 150A and 150B, a gate insulation layer 140, a channel layer 130, a second interlayer insulation film 114, landing pads 160A and 160B, and capacitor structures 170A and 170B.

Although the first substrate 100 may have a structure in which a base substrate and an epitaxial layer are stacked, example embodiments are not limited thereto. The first substrate 100 may be or include, for example, a silicon substrate, a gallium arsenide substrate, a silicon germanium substrate, or an SOI (Semiconductor On Insulator) substrate. In some example embodiments, the first substrate 100 may be doped, e.g., may be lightly doped; example embodiments are not limited thereto.

The conductive line 120 may be formed on the first substrate 100. For example, a lower insulation film 110 may be formed on the first substrate 100, and the conductive line 120 may be placed on the lower insulation film 110. The conductive line 120 may extend long in the column direction Y. The plurality of conductive lines 120 each extend in the column direction Y and may be spaced apart from each other at equal intervals in the row direction X that intersects the column direction Y. The lower insulation film 110 may be formed in (e.g., to fill) a space between the conductive lines 120. In some example embodiments, an upper surface of the lower insulation film 110 may be placed at the same level as an upper surface of the conductive line 120. The conductive line 120 may function as a bitline of the semiconductor memory device according to some example embodiments.

The conductive line 120 may include doped polysilicon, metal, conductive metal nitride, conductive metal silicide, conductive metal oxide, or combinations thereof. For example, the conductive line 120 may include, but is not limited to, doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx) or combinations thereof. Alternatively or additionally, the conductive line 120 may include a two-dimensional semiconductor material. The two-dimensional semiconductor material may include, for example, graphene, carbon nanotube, boron-nitride, or a combination thereof. The conductive line 120 may include a single layer or multiple layers of the conductive materials described above.

The first interlayer insulation film 112 may be formed on the first substrate 100. The first interlayer insulation film 112 may include (e.g., define) a cell trench 112t that extends long in the row direction X and crosses the conductive line 120. The plurality of cell trenches 112t each extend in the row direction X and may be spaced apart from each other at equal intervals in the column direction Y. Therefore, each of the first interlayer insulation films 112 may form pin-shaped insulating patterns that extend in the row direction X and are spaced apart from each other by the cell trench 112t. For example, each of the interlayer insulation films 112 may have a first portion extending parallel to the column direction Y and a second portion extending the vertical direction Z.

In some example embodiments, the first interlayer insulation film 112 may be placed on the upper surface of the lower insulation film 110 to cover the conductive line 120. In some example embodiments, a lower portion/surface of the cell trench 112t may be spaced apart from the upper surface of the conductive line 120.

In some example embodiments, a width of the cell trench 112t may decrease toward the upper surface of the first substrate 100. Here, the width of the cell trench 112t means a width in the column direction Y. This may be due to the characteristics of an etching process for forming the cell trench 112t.

The first interlayer insulation film 112 may include, for example, but is not limited to, at least one of silicon oxide, silicon oxynitride, silicon nitride, and a low dielectric constant (low-k) material having a lower dielectric constant than silicon oxide.

The gate electrodes 150A and 150B may be formed in the cell trench 112t. For example, the gate electrodes 150A and 150B may extend along the lower surface and the side surfaces of the cell trench 112t. In addition, the gate electrodes 150A and 150B may each extend long in the row direction X and cross the conductive line 120.

In some example embodiments, the gate electrodes 150A and 150B may include a first gate electrode 150A and a second gate electrode 150B that are spaced apart from each other in the column direction Y. The first gate electrode 150A and the second gate electrode 150B may face each other in the cell trench 112t. For example, the first gate electrode 150A may extend along the lower surface and a first side surface of the cell trench 112t, and the second gate electrode 150B may extend along the lower surface of the cell trench 112t and a second side surface thereof facing the first side surface. As an example, in a cross section intersecting the row direction X (e.g., in FIG. 31), the gate electrodes 150A and 150B may each have an "L" shape. The first gate electrode 150A may function as a first wordline of the semiconductor memory device according to some example embodiments, and the second gate electrode 150B may function as a second wordline of the semiconductor memory device according to some example embodiments.

In some example embodiments, a separation trench 150t may be formed in the first interlayer insulation film 112 and the gate electrodes 150A and 150B. The separation trench 150t may extend in the row direction X to separate the first gate electrode 150A and the second gate electrode 150B from each other. Further, the separation trench 150t may overlap (e.g., expose) a part of the conductive line 120. For example, a lower portion/surface of the separation trench 150t may overlap/expose a part of the upper surface of the conductive line 120.

The gate electrodes 150A and 150B may each include, for example, doped polysilicon, metal, conductive metal nitride, conductive metal silicide, conductive metal oxide, or a combination thereof. For example, the gate electrodes 150A and 150B may include, but are not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSIN, RuTiN, NiSi, CoSi, IrOx, RuOx or combinations thereof.

In some example embodiments, the first gate electrode 150A and the second gate electrode 150B may each include a first conductive pattern 152 and a first barrier conductive film 154. The first conductive pattern 152 and the first barrier conductive film 154 may be sequentially stacked in the cell trench 112t. For example, the first conductive pattern 152 may conformally extend along the lower surface and the side surfaces of the cell trench 112t. The first barrier conductive film 154 may conformally extend along the profile of the first conductive pattern 152. The first barrier conductive film 154 may be interposed between the first conductive pattern 152 and a gate insulation layer 140 to be described below.

The first barrier conductive film 154 may reduce/prevent diffusion of the elements included in the first conductive pattern 152. As an example, the first conductive pattern 152 may include at least one of, for example, tungsten (W), aluminum (Al), and copper (Cu), and the first barrier conductive film 154 may include at least one of, for example, titanium (Ti), titanium nitride (TiN), tantalum (Ta), and tantalum nitride (TaN).

The gate insulation layer 140 may be stacked on the gate electrodes 150A and 150B. For example, the gate insulation layer 140 may conformally extend along the profile of the gate electrodes 150A and 150B. The gate insulation layer 140 may be interposed between the gate electrodes 150A and 150B and a channel layer 130 to be described below. In some example embodiments, the gate insulation layer 140 may further extend along the upper surface of the first interlayer insulation film 112. In some example embodiments, the gate insulation layer 140 may extend along the side surfaces of the separation trench 150t.

In some example embodiments, the gate insulation layer 140 may have a gap/opening therein that overlaps (e.g., exposes) a part of the conductive line 120. For example, the gate insulation layer 140 may include a contact trench 140t inside the separation trench 150t. The lower portion/surface of the contact trench 140t may overlap/expose a part of the upper surface of the conductive line 120. Although FIG. 30 shows that the contact trench 140t has a rectangular shape, this is only an example. As another example, the contact trench 140*t* may have a circular or other polygonal shape. In addition, although FIG. 30 shows that one contact trench 140*t* overlaps/exposes one conductive line 120, this is also only an example. As another example, one contact trench 140*t* may extend long in the row direction X to overlap/ expose the plurality of conductive lines 120.

The gate insulation layer 140 may include, for example, silicon oxide, silicon oxynitride, a high dielectric constant material having a higher dielectric constant than silicon oxide, or a combination thereof. The high dielectric constant material may include, but is not limited to, for example, hafnium oxide ($HfO2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO2$), aluminum oxide ($Al2O3$), or a combination thereof.

In some example embodiments, the gate insulation layer 140 may provide the semiconductor memory device according to some example embodiments as a ferroelectric memory element (ferroelectric RAM, FeRAM).

As an example, the gate insulation layer 140 may include ferroelectrics such as barium titanate ($BaTiO3$), lead zirconate titanate ($PbZrTiO3$, PZT), strontium bismuth tantalate (STB; $SrBi2Ta2O9$), bismuth iron oxide ($BiFeO3$, BFO), and hafnium oxide ($HfO2$).

The channel layer 130 may be stacked on (e.g., on an upper surface of) the gate insulation layer 140. The channel layer 130 may be inside (e.g., may fill at least a part of) the cell trench 112*t*. For example, the channel layer 130 may extend along the profiles of the gate electrodes 150A and 150B and the gate insulation layer 140. Therefore, each of the gate electrodes 150A and 150B and the gate insulation layer 140 may be interposed between the first interlayer insulation film 112 and the channel layer 130.

The channel layer 130 may be connected to the conductive line 120. In some example embodiments, the channel layer 130 may be electrically connected to the upper surface of the conductive line 120 by extending through the separation trench 150*t* and the contact trench 140*t*. As shown in FIG. 30, the plurality of channel layers 130 are spaced apart from each other in the column direction Y and the row direction X, and may be arranged in a matrix form.

In the semiconductor memory device according to some example embodiments, the channel layer 130 may include a first source/drain region and a second source/drain region that are arranged along the vertical direction Z that intersects the column direction Y and the row direction X. For example, the lower part of the channel layer 130 may function as a first source/drain region, and the upper part of the channel layer 130 may function as a second source/drain region. A part of the channel layer 130 between the first source/drain region and the second source/drain region may function as a channel region.

The channel layer 130 may include a semiconductor material. As an example, the channel layer 130 may include an oxide semiconductor material. The oxide semiconductor material may reduce a leakage current of the semiconductor memory device. The oxide semiconductor material may include, for example, IGZO (indium gallium zinc oxide, InxGayZnzO), IGSO (indium gallium silicon oxide, InxGaySizO), ITZO (indium tin zinc oxide, InxSnyZnzO), IZO (indium zinc oxide, InxZnyO), ZnO (zinc oxide, ZnxO), ZTO (zinc tin oxide, ZnxSnyO), ZnON (zinc oxynitride, ZnxOyN), ZZTO (zirconium zinc tin oxide, ZrxZnySnzO), SnO (tin oxide, SnxO), HIZO (hafnium indium zinc oxide, HfxlnyZnzO), GZTO (gallium zinc tin oxide, GaxZnySnzO), AZTO (aluminum zinc tin oxide, AlxZnySnzO), YGZO (ytterbium gallium zinc oxide, YbxGayZnzO), IGO (indium gallium oxide, InxGayO) or a combination thereof.

Alternatively or additionally, the channel layer 130 may include silicon (Si) and germanium (Ge) as elemental semiconductor materials, or materials doped to them. Alternatively, the channel layer 130 may also include a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element.

Alternatively or additionally, the channel layer 130 may include a two-dimensional semiconductor material. The two-dimensional semiconductor material may include, for example, graphene, carbon nanotube, transition metal dichalcogenide (TMD), or a combination thereof. The TMD may include, for example, one metal element among Mo, W, Nb, vanadium (V), Ta, Ti, Zr, Hf, technetium (Tc), rhenium (Re), Cu, Ga, In, Sn, Ge and Pb, and one chalcogen element among sulfur(S), selenium (Se), and tellurium (Te).

The channel layer 130 may include a single layer or multiple layers of the semiconductor materials described above. For example, the channel layer 130 may include IGZO.

In some example embodiments, the channel layer 130 may have a bandgap energy that is greater than a bandgap energy of silicon (Si). For example, the channel layer 130 may have a bandgap energy of about 1.5 electron volts (eV) to 5.6 eV. For example, the channel layer 130 may have a bandgap energy of about 2.0 eV to 4.0 eV. The channel layer 130 may be, but is not limited to, for example, polycrystalline or amorphous.

In some example embodiments, the channel layer 130 may be a continuous layer that includes a penetration portion 132, a first extension portion 134A, and a second extension portion 134B. The penetration portion 132 may be interposed between the first gate electrode 150A and the second gate electrode 150B. The penetration portion 132 may penetrate the first interlayer insulation film 112 and be connected (e.g., electrically connected) to the conductive line 120. For example, the penetration portion 132 may be inside (e.g., may fill) the contact trench 140*t*. The first extension portion 134A may extend from the penetration portion 132 along the side surfaces of the first gate electrode 150A. The second extension portion 134B may extend from the penetration portion 132 along the side surfaces of the second gate electrode 150B. The first extension portion 134A, the second extension portion 134B, and the penetration portion 132 may be connected to each other.

In the semiconductor memory device according to some example embodiments, the first extension portion 134A may function as a first channel region of a first transistor including the first gate electrode 150A, and the second extension portion 134B may function as a second channel region of a second transistor including the second gate electrode 150B. Accordingly, two transistor structures may be provided for each channel layer 130.

In some example embodiments, the first extension portion 134A and the second extension portion 134B may face (e.g., may be opposite, in parallel with) each other inside the cell trench 112*t*. As an example, in a cross section intersecting the row direction X (e.g., in FIG. 31), the first extension portion 134A and the second extension portion 134B may collectively have a "U" shape.

In some example embodiments, a part of the first extension portion 134A and a part of the second extension portion 134B may be placed on the upper surface of the first interlayer insulation film 112. For example, the first extension portion 134A may further extend along the upper surface of the first gate electrode 150A, and the second extension portion 134B may further extend along the upper surface of the second gate electrode 150B.

The second interlayer insulation film 114 may be formed on the channel layer 130. For example, the second interlayer insulation film 114 may be formed on the gate insulation layer 140. The second interlayer insulation film 114 may separate a plurality of channel layers 130 that are spaced apart from each other and arranged in a matrix form. In some example embodiments, the upper surface of the second interlayer insulation film 114 may be placed at substantially the same level as the upper surface of the channel layer 130. For example, the second interlayer insulation film 114 may be on (e.g., may cover) the side surfaces of the channel layer 130. In some example embodiments, the second interlayer insulation film 114 may be interposed between the first extension portion 134A and the second extension portion 134B. For example, the second interlayer insulation film 114 may be formed on the channel layer 130 to fill the cell trench 112*t*.

The second interlayer insulation film 114 may include, but is not limited to, for example, at least one of silicon oxide, silicon oxynitride, silicon nitride, and a low dielectric constant (low-k) material having a lower dielectric constant than silicon oxide.

Landing pads 160A and 160B may be formed on the first interlayer insulation film 112 and the second interlayer insulation film 114. Each of the landing pads 160A and 160B may be electrically connected to the channel layer 130. For example, a third interlayer insulation film 116 may be formed on the first interlayer insulation film 112 and the second interlayer insulation film 114. The landing pads 160A and 160B are each formed in the third interlayer insulation film 116 and may be electrically connected to the upper part of the channel layer 130.

In some example embodiments, each of the landing pads 160A and 160B may be placed to overlap at least a part of the channel layer 130 in the vertical direction Z. A plurality of landing pads 160A and 160B are spaced apart from each other in the column direction Y and the row direction X, and may be arranged in a matrix form. However, this is only an example, and the placement of the landing pads 160A and 160B is not limited thereto, as long as the landing pads 160A and 160B are electrically connected to the channel layer 130. As another example, the plurality of landing pads 160A and 160B may also be arranged in a honeycomb form.

In some example embodiments, the landing pads 160A and 160B may include a first landing pad 160A and a second landing pad 160B that are spaced from each other in the column direction Y. The first landing pad 160A may be disposed on one end (e.g., a first end) of the channel layer 130 adjacent to the first gate electrode 150A, and the second landing pad 160B may be disposed on the other end (e.g., a second end that is opposite the first end) of the channel layer 130 adjacent to the second gate electrode 150B. For example, the first landing pad 160A may be in contact with the first extension portion 134A, and the second landing pad 160B may be in contact with the second extension portion 134B.

In some example embodiments, the first landing pad 160A may be in contact with the upper surface of the first extension portion 134A that extends along the upper surface of the first gate electrode 150A, and the second landing pad 160B may be in contact with the upper surface of the second extension portion 134B that extends along the upper surface of the second gate electrode 150B.

Although the drawings show that the first landing pad 160A overlaps the first gate electrode 150A in the vertical direction Z, and the second landing pad 160B overlaps the second gate electrodes 150B in the vertical direction Z, this is only an example. As long as each of the first landing pad 160A and the second landing pad 160B is electrically connected to the channel layer 130, the placement of the first landing pad 160A and the second landing pad 160B may, of course, be various.

The landing pads 160A and 160B may each include, for example, doped polysilicon, metal, conductive metal nitride, conductive metal silicide, conductive metal oxide, or a combination thereof. For example, the landing pads 160A and 160B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor structures 170A and 170B may be formed on the landing pads 160A and 160B. The capacitor structures 170A and 170B may be arranged to correspond to the landing pads 160A and 160B. The landing pads 160A and 160B may electrically connect the channel layer 130 and the capacitor structures 170A and 170B. The capacitor structures 170A and 170B may each include lower electrodes 173A and 173B, a capacitor dielectric layer 175, and an upper electrode 178. In some example embodiments, the capacitor structures 170A and 170B may have a hysteresis effect; example embodiments are not limited thereto.

In some example embodiments, the capacitor structures 170A and 170B may provide the semiconductor memory device according to some example embodiments as a dynamic memory element (dynamic RAM, DRAM). For example, the capacitor structures 170A and 170B may store the data (e.g., charge) inside the capacitor dielectric layer 175, by utilizing a potential difference occurring between the lower electrodes 173A and 173B and the upper electrode 178.

The lower electrodes 173A and 173B may be electrically connected to the landing pads 160A and 160B. Each of the lower electrodes 173A and 173B may have, but are not limited to, a pillar shape or cylindrical shape extending in the vertical direction Z. In some example embodiments, the lower electrodes 173A and 173B may be placed to overlap the landing pads 160A and 160B in the vertical direction Z. For example, a plurality of lower electrodes 173A and 173B are spaced apart from each other in the column direction Y and the row direction X, and may be arranged in a matrix form.

In some example embodiments, the lower electrodes 173A and 173B may be spaced apart from each other in the column direction Y. The lower electrode 173A may be in contact with the upper surface of the first landing pad 160A, and the lower electrode 173B may be in contact with the upper surface of the second landing pad 160B. Therefore, the capacitor structures 170A and 170B may include a first capacitor structure 170A and a second capacitor structure 170B arranged along the column direction Y.

The capacitor dielectric layer 175 may be interposed between the lower electrodes 173A and 173B and the upper electrodes 178. As an example, the capacitor dielectric layer 175 may conformally extend along outer peripheral surfaces of the lower electrodes 173A and 173B and the upper surface of the third interlayer insulation film 116. The upper electrode 178 may be formed on the upper surface of the capacitor dielectric layer 175.

In some example embodiments, the upper electrode 178 may be a plate-shaped structure that extends along a plane that intersects the vertical direction Z. As an example, a fourth interlayer insulation film 118 that fills the space between the lower electrodes 173A and 173B may be formed on the capacitor dielectric layer 175. For example, the fourth interlayer insulation film 118 may be disposed between the capacitor structures 170A and 170B. The upper electrode 178 may extend along the upper surface of the fourth interlayer insulation film 118. However, this is only an example, and the fourth interlayer insulation film 118 may be omitted. As another example, the upper electrode 178 may be formed on the capacitor dielectric layer 175 to fill the space between the lower electrodes 173A and 173B.

The lower electrodes 173A and 173B and the upper electrode 178 may each include doped polysilicon, metal, conductive metal nitride, conductive metal silicide, conductive metal oxide, or a combination thereof. For example, the lower electrodes 173A and 173B and the upper electrode 178 may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor dielectric layer 175 may include, for example, silicon oxide, silicon oxynitride, a high dielectric constant material having a higher dielectric constant than silicon oxide, or a combination thereof. The high dielectric constant material may include, but is not limited to, for example, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrO2), aluminum oxide (Al2O3) or a combination thereof.

In some example embodiments, each of the lower electrode 173A and the lower electrode 173B may include a second conductive pattern 171 and a second barrier conductive film 172. The second conductive pattern 171 and the second barrier conductive film 172 may be sequentially stacked on the landing pads 160A and 160B. For example, the second conductive pattern 171 may have a pillar shape or cylindrical shape extending in the vertical direction Z on the landing pads 160A and 160B. The second barrier conductive film 172 may conformally extend along the side surfaces and the upper surface of the second conductive pattern 171. The second barrier conductive film 172 may be interposed between the second conductive pattern 171 and the capacitor dielectric layer 175.

The second barrier conductive film 172 may reduce/prevent diffusion of the elements included in the second conductive pattern 171. As an example, the second conductive pattern 171 may include at least one of tungsten (W), aluminum (Al), and copper (Cu), and the second barrier conductive film 172 may include at least one of titanium (Ti), titanium nitride (TiN), tantalum (Ta), and tantalum nitride (TaN).

In some example embodiments, the upper electrode 178 may include a third barrier conductive film 177 and a third conductive pattern 176. The third barrier conductive film 177 and the third conductive pattern 176 may be sequentially stacked on the capacitor dielectric layer 175. For example, the third barrier conductive film 177 may conformally extend along the capacitor dielectric layer 175. In some example embodiments, the third barrier conductive film 177 may be interposed between the capacitor dielectric layer 175 and the fourth interlayer insulation film 118. The third conductive pattern 176 may be a plate-like structure extending along a plane intersecting the vertical direction Z.

For example, the third conductive pattern 176 may extend in the row direction X and the column direction Y. The third conductive pattern 176 may extend along the uppermost surface of the third barrier conductive film 177. In some example embodiments, the third conductive pattern 176 may extend along the upper surface of the fourth interlayer insulation film 118. For example, the upper surface of the fourth interlayer insulation film 118 may be placed at substantially the same level as the uppermost surface of the third barrier conductive film 177. In some example embodiment, the fourth interlayer insulation film 118 may be disposed between the third barrier conductive film 177 and the third conductive pattern 176.

The third barrier conductive film 177 may reduce/prevent diffusion of the elements included in the third conductive pattern 176. As an example, the third conductive pattern 176 may include at least one of tungsten (W), aluminum (Al), and copper (Cu), and the third barrier conductive film 177 may include at least one of titanium (Ti), titanium nitride (TiN), tantalum (Ta), and tantalum nitride (TaN).

To improve the degree of integration of the semiconductor memory device, semiconductor memory devices including a vertical channel transistor with channels extending in the vertical direction are proposed. To implement such semiconductor memory devices, a gate insulation layer and a gate electrode may be stacked on the side surfaces of the channel layer extending in the vertical direction. However, in such a case, the channel layer may be damaged and/or its characteristics may be deteriorated in the process of forming the gate insulation layer and the gate electrode (for example, a thermal process and/or the like), which may cause decreases in performance and reliability of the semiconductor memory device.

In the semiconductor memory device according to some example embodiments, the channel layer 130 may be formed by being stacked on the gate electrodes 150A and 150B and the gate insulation layer 140. Therefore, a semiconductor memory device with increased performance and reliability may be provided.

Alternatively or additionally, the semiconductor memory device according to some example embodiments may have two transistor structures for each channel layer 130. For example, as described above, the gate electrodes 150A and 150B may include a first gate electrode 150A and a second gate electrode 150B that are spaced apart from each other in the cell trench 112t. Accordingly, it is possible to provide a semiconductor memory device having an increased degree of integration.

Alternatively or additionally, in the semiconductor memory device according to some example embodiments, a part of the channel layer 130 may be placed on the upper surface of the first interlayer insulation film 112. For example, as described above, the first extension portion 134A may further extend along the upper surface of the first gate electrode 150A, and the second extension portion 134B may further extend along the upper surface of be the second gate electrode 150B. In such a case, the distance between the landing pads 160A and 160B and the gate electrodes 150A and 150B may be adjusted by the thickness of the channel layer 130. Therefore, it may be possible to provide the semiconductor memory device according to some example embodiments in which the distance between the landing pads 160A and 160B and the gate electrodes 150A and 150B may be easily adjusted.

The peripheral circuit element PT and the inter-wiring insulation film 210 may be formed on the first substrate 100. The peripheral circuit element PT may control the functions of the semiconductor memory elements formed on the first substrate 100, including control elements and dummy elements. The inter-wiring insulation film 210 may cover the peripheral circuit element PT.

In some example embodiments, the peripheral circuit element PT may include a fourth conductive pattern 220 and a fifth conductive pattern 230 that are sequentially formed on the upper surface of the first substrate 100. The fourth conductive pattern 220 and the fifth conductive pattern 230 may form various circuit elements for controlling the functions of the semiconductor memory elements. The peripheral circuit element PT may include, for example, not only various active elements such as a transistor, but also various passive elements such as a capacitor, a resistor, and an inductor.

In some example embodiments, the peripheral circuit element PT and the inter-wiring insulation film 210 may be placed under the first interlayer insulation film 112. For example, the lower insulation film 110 may be stacked on the upper surface of the inter-wiring insulation film 210. The first interlayer insulation film 112 may be stacked on the upper surface of the lower insulation film 110. For example, the semiconductor memory device according to some example embodiments may have a CoP (cell on periphery) structure.

In some example embodiments, the peripheral circuit element PT may be electrically connected to the conductive line 120. For example, a wiring pattern 240 that is electrically connected to the peripheral circuit element PT may be formed in the inter-wiring insulation film 210. In addition, a connecting via 250 that penetrates the lower insulation film 110 and electrically connects the conductive line 120 and the wiring pattern 240 to each other may be formed. Therefore, the conductive line 120 may be electrically controlled by the peripheral circuit element PT.

Figure 33:
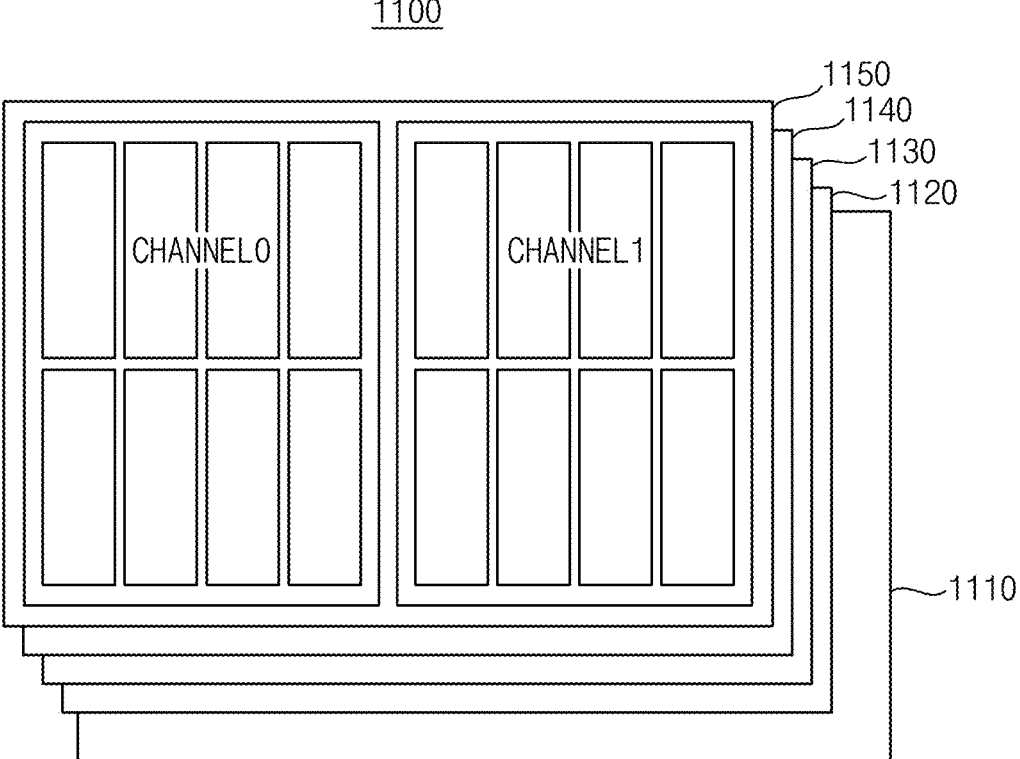
FIG. 33 is a diagram illustrating a memory device according to some example embodiments.

FIG. 33 is a diagram illustrating a memory device according to some example embodiments.

FIG. 33 illustrates an example high bandwidth memory (HBM) organization. Referring to FIG. 33, the HBM 1100 may have a stack of multiple DRAM semiconductor dies 1120, 1130, 1140, and 1150. The HBM of the stack structure may be optimized by a plurality of independent interfaces called channels.

Each DRAM stack may support up to 8 channels in accordance with the HBM standards. FIG. 33 shows an example stack including 4 DRAM semiconductor dies 1120, 1130, 1140, and 1150, and each DRAM semiconductor die supports two channels CHANNEL0 and CHANNEL1.

Each channel provides access to an independent set of DRAM banks. Requests from one channel might not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

Each of the DRAM semiconductor dies 1120, 1130, 1140, and 1150 may have the CoP structure as described with reference to FIGS. 1 through 32.

Figure 34:
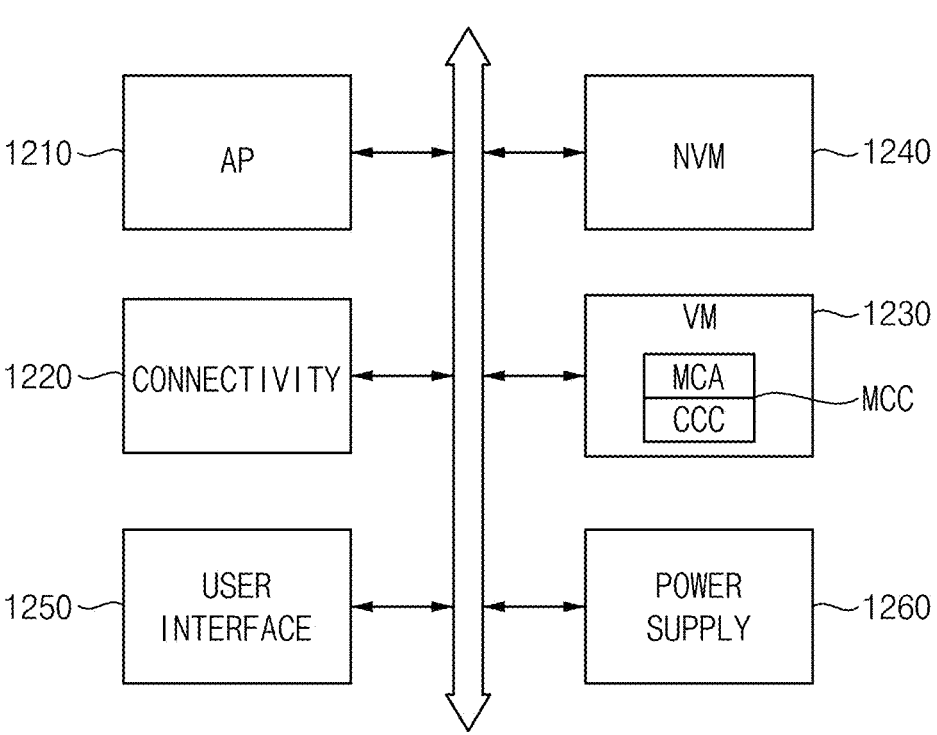
FIG. 34 is a block diagram illustrating a mobile system according to some example embodiments.

FIG. 34 is a block diagram illustrating a mobile system according to some example embodiments.

Referring to FIG. 34, a mobile system 1200 includes an application processor (AP) 1210, a connectivity unit 1220, a volatile memory device (VM) 1230, a nonvolatile memory device (NVM) 1240, a user interface 1250, and a power supply 1260. In some example embodiments, the mobile system 1200 may be or may include (or be included in), for example, one or more of a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

According to some example embodiments, the volatile memory device 1230 may include the core control circuit CCC as described above with reference to FIGS. 1 through 32. The memory core circuit MCC may have the CoP structure such that the core control circuit CCC is disposed under the memory cell array MCA.

As described above, the memory core circuit and the memory device according to some example embodiments may reduce the size of the memory core circuit through the CoP structure in which the core control circuit is disposed efficiently, and enhance the design margin of the memory core circuit by relieving the length limit of the bitline sense amplifiers. In addition, the operation characteristics and the performance of the memory core circuit and the memory device may be enhanced through the efficient arrangement of the bitline sense amplifier and the sub wordline drivers.

Example embodiments of inventive concepts herein may be applied to a memory device and/or to systems including a memory device. For example, example embodiments may be applied to or may include (or be included in) systems such as one or more of a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The foregoing is illustrative of example embodiments and is not to be construed as limiting thereof. Although a few example embodiments have been described, those of ordinary skill in the art will readily appreciate that many modifications are possible in the example embodiments without materially departing from inventive concepts. Furthermore, example embodiments are not necessarily mutually exclusive with one another. For example, some example embodiments may include one or more features described with reference to one or more figures, and may also include one or more other features described with reference to one or more other figures.

What is claimed is:

1. A memory core circuit comprising:
a memory cell array including a plurality of sub cell arrays arranged in a matrix, the matrix including a plurality of array rows and a plurality of array columns;
a core control circuit including a plurality of sub peripheral circuits arranged in the matrix including the plurality of array rows and the plurality of array columns, wherein each sub peripheral circuit is respectively under each sub cell array,
wherein each sub cell array includes:
a plurality of memory cells respectively connected to a plurality of wordlines and a plurality of bitlines, wherein the plurality of wordlines extend in a row direction and are arranged in a column direction, wherein the plurality of bitlines extend in the column direction and are arranged in the row direction, wherein
each sub peripheral circuit is divided into a first column edge region, a second column edge region and a central region, the first column edge region and the second column edge region corresponding to first and second end portions of each sub peripheral circuit in the column direction, and the central region is between the first column edge region and the second column edge region;
a sense amplifier region in both the first column edge region and the second column edge region of at least one sub peripheral circuit, wherein the sense amplifier region comprises a plurality of bitline sense amplifiers that are configured to sense voltages of a respective plurality of bitlines of the sub peripheral circuit in which the plurality of bitline sense amplifiers are located; and
a wordline driver region in the central region of at least one sub peripheral circuit, wherein the wordline driver region comprises a plurality of sub wordline drivers that are configured to respectively drive the plurality of wordlines of the sub peripheral circuit in which the plurality of wordlines are located.

2. The memory core circuit of claim 1, wherein, with respect to each sub peripheral circuit, the central region is divided into a first sub central region and a second sub central region in the row direction, one of the first sub central region and the second sub central region corresponds to the wordline driver region, and another of the first sub central region and the second sub central region corresponds to a rest circuit region including other than the plurality of bitline sense amplifiers and the plurality of sub wordline drivers.

3. The memory core circuit of claim 2, wherein the core control circuit has a shift structure such that, with respect to a first sub peripheral circuit and a second sub peripheral circuit that are adjacent to each other in the row direction, the rest circuit region of the first sub peripheral circuit is adjacent in the row direction to the wordline driver region of the second sub peripheral circuit.

4. The memory core circuit of claim 2, wherein the core control circuit has a mirror structure such that, with respect to a first sub peripheral circuit and a second sub peripheral circuit that are adjacent to each other in the row direction, either
the rest circuit region of the first sub peripheral circuit is adjacent in the row direction to the rest circuit region of the second sub peripheral circuit, or
the sense amplifier region of the first sub peripheral circuit is adjacent in the row direction to the sense amplifier region of the second sub peripheral circuit.

5. The memory core circuit of claim 1, wherein,
with respect to each sub peripheral circuit, two end portions in the row direction of the central region correspond to the wordline driver region in which the plurality of sub wordline drivers are distributed and disposed, and
a region between the two end portions of the central region corresponds to a rest region including remaining circuits excluding the plurality of bitline sense amplifiers and the plurality of sub wordline drivers.

6. The memory core circuit of claim 1, wherein, with respect to a first sub peripheral circuit and a second sub peripheral circuit adjacent to each other in the row direction, the wordline driver region of the first sub peripheral circuit is connected to odd-numbered wordlines, and the wordline driver region of the second sub peripheral circuit is connected to even-numbered wordlines.

7. The memory core circuit of claim 1, wherein the wordline driver region of each sub peripheral circuit includes:
a first wordline driver region connected to first wordlines above the central region in a vertical direction respectively perpendicular to the row direction and the column direction;
a second wordline driver region connected to second wordlines above the first column edge region in the vertical direction; and
a third wordline driver region connected to third wordlines above the second column edge region in the vertical direction.

8. The memory core circuit of claim 7, further comprising:
column conduction paths extending in the column direction to connect the second wordlines to the sub wordline drivers in the second wordline driver region and connect the third wordlines to the sub wordline drivers in the third wordline driver region.

9. The memory core circuit of claim 1, wherein each sub peripheral circuit includes 2N bitline sense amplifiers connected to 2N bitlines among 4N bitlines corresponding to each sub peripheral circuit where N is a natural number, such that N bitline sense amplifiers among the 2N bitline sense amplifiers are in the first column edge region of each sub peripheral circuit and N other bitline sense amplifiers among the 2N bitline sense amplifiers are in the second column edge region of each sub peripheral circuit.

10. The memory core circuit of claim 9, wherein 2N other bitlines among the 4N bitlines are connected, as complementary bitlines, to bitline sense amplifiers included in two sub peripheral circuits adjacent in the column direction to each sub peripheral circuit.

11. The memory core circuit of claim 1, wherein each odd-numbered sub peripheral circuit among sub peripheral circuits arranged in the column direction in one array column does not include bitline sense amplifiers and each even-numbered sub peripheral circuit among the sub peripheral circuits arranged in the column direction in the one array column include 4N bitline sense amplifiers connected to 4N bitlines corresponding to each even-numbered sub peripheral circuit where N is a natural number, such that 2N bitline sense amplifiers among the 4N bitline sense amplifiers are in the first column edge region of each even-numbered sub peripheral circuit and 2N other bitline sense amplifiers are in the second column edge region of each even-numbered sub peripheral circuit.

12. The memory core circuit of claim 11, wherein 4N bitlines corresponding to each odd-numbered sub peripheral circuit are connected, as complementary bitlines, to bitline sense amplifiers included in two even-numbered sub peripheral circuits adjacent in the column direction to each odd-numbered sub peripheral circuit.

13. The memory core circuit of claim 9, wherein 2N other bitlines among the 4N bitlines are connected, as complementary bitlines, to bitline sense amplifiers included in one sub peripheral circuit adjacent in the column direction to each sub peripheral circuit.

14. The memory core circuit of claim 1, wherein, with respect to a first sub peripheral circuit and a second sub peripheral circuit that are adjacent to each other in the row direction, the first sub peripheral circuit does not include the wordline driver region and the second sub peripheral circuit includes the wordline driver region corresponding to the central region.

15. The memory core circuit of claim 1, wherein, with respect to a first sub peripheral circuit and a second sub peripheral circuit that are adjacent to each other in the column direction, the first sub peripheral circuit does not include the sense amplifier region and the second sub peripheral circuit includes a first sense amplifier region corresponding to the first column edge region and a second sense amplifier region corresponding to the second column edge region.

16. The memory core circuit of claim 1, wherein, with respect to a first sub peripheral circuit and a second sub peripheral circuit that are adjacent to each other in the row direction or the column direction, the first sub peripheral circuit does not include the sense amplifier region and the wordline driver region and the second sub peripheral circuit includes a first sense amplifier region corresponding to the first column edge region, a second sense amplifier region corresponding to the second column edge region and the wordline driver region corresponding to the central region.

17. The memory core circuit of claim 1, wherein each memory cell includes:
a vertical channel transistor; and
a memory unit on the vertical channel transistor.

18. A memory core circuit comprising:
a memory cell array including a plurality of sub cell arrays arranged in a matrix including a plurality of array rows and a plurality of array columns; and
a core control circuit including a plurality of sub peripheral circuits arranged in a matrix including the plurality of array rows and the plurality of array columns, wherein each sub peripheral circuit is respectively under each sub cell array,
wherein each sub cell array includes:
a plurality of dynamic random access memory (DRAM) cells respectively connected to a plurality of wordlines and a plurality of bitlines, wherein the plurality of wordlines extend in a row direction and are arranged in a column direction, wherein the plurality of bitlines extend in the column direction and are arranged in the row direction,
wherein each sub peripheral circuit is divided into a first column edge region, a second column edge region and a central region, the first column edge region and the second column edge region correspond to first and second end portions of each sub peripheral circuit in the column direction, the central region is between the first column edge region and the second column edge region, and the central region is divided into a first sub central region and a second sub central region in the row direction,
wherein a sense amplifier region is in both the first column edge region and the second column edge region of at least one sub peripheral circuit, wherein the sense amplifier region comprises a plurality of bitline sense amplifiers configured to respectively sense voltages of the plurality of bitlines of the sub peripheral circuit in which the plurality of bitlines are located; and
wherein a wordline driver region is in one of the first sub central region and the second sub central region, wherein the wordline driver region comprises a plurality of sub wordline drivers configured to respectively drive the plurality of wordlines of the sub peripheral circuit in which the wordline driver region is located.

19. A memory device comprising:
a memory core circuit; and
device peripheral circuits configured to control the memory core circuit,
the memory core circuit including:
a memory cell array including a plurality of sub cell arrays arranged in a matrix including a plurality of array rows and a plurality of array columns; and
a core control circuit including a plurality of sub peripheral circuits arranged in a matrix including the plurality of array rows and the plurality of array columns, wherein each sub peripheral circuit is respectively under each sub cell array,
wherein each sub cell array includes:
a plurality of memory cells respectively connected to a plurality of wordlines and a plurality of bitlines, wherein the plurality of wordlines extend in a row direction and are arranged in a column direction, wherein the plurality of bitlines extend in the column direction and are arranged in the row direction,
wherein each sub peripheral circuit is divided into a first column edge region, a second column edge region and a central region, the first column edge region and the second column edge region correspond to first and second end portions of each sub peripheral circuit in the column direction, and the central region is between the first column edge region and the second column edge region,
wherein a sense amplifier region is in both of the first column edge region and the second column edge region, wherein the sense amplifier region comprises a plurality of bitline sense amplifiers configured to respectively sense voltages of the plurality of bitlines of the sub peripheral circuit in which the plurality of bitline sense amplifiers are located and
wherein a wordline driver region is in the central region, wherein the wordline driver region comprises a plurality of sub wordline drivers configured to respectively drive the plurality of wordlines of the sub peripheral circuit in which the wordline driver region is located.

* * * * *